United States Patent
Manipatruni et al.

(10) Patent No.: US 11,863,183 B1
(45) Date of Patent: Jan. 2, 2024

(54) LOW POWER NON-LINEAR POLAR MATERIAL BASED THRESHOLD LOGIC GATE MULTIPLIER

(71) Applicant: Kepler Computing Inc., San Francisco, CA (US)

(72) Inventors: Sasikanth Manipatruni, Portland, OR (US); Yuan-Sheng Fang, San Francisco, CA (US); Robert Menezes, Portland, OR (US); Rajeev Kumar Dokania, Beaverton, OR (US); Gaurav Thareja, Santa Clara, CA (US); Ramamoorthy Ramesh, Moraga, CA (US); Amrita Mathuriya, Portland, OR (US)

(73) Assignee: KEPLER COMPUTING INC., San Francisco, CA (US)

( * ) Notice: Subject to any disclaimer, the term of this patent is extended or adjusted under 35 U.S.C. 154(b) by 96 days.

(21) Appl. No.: 17/503,124

(22) Filed: Oct. 15, 2021

Related U.S. Application Data

(63) Continuation of application No. 17/129,824, filed on Dec. 21, 2020, now Pat. No. 11,381,244.

(51) Int. Cl.
  *H03K 19/0948* (2006.01)
  *H03K 19/23* (2006.01)
  (Continued)

(52) U.S. Cl.
  CPC .......... *H03K 19/23* (2013.01); *G06F 7/501* (2013.01); *H01L 27/11807* (2013.01); *H01L 2027/11838* (2013.01)

(58) Field of Classification Search
  CPC .............. G06F 7/501; H01L 27/11807; H01L 2027/11838
  See application file for complete search history.

(56) References Cited

U.S. PATENT DOCUMENTS

| 3,260,863 A | 7/1966 | Burns et al. |
| 3,524,977 A * | 8/1970 | Wang .............. G06F 7/5318 |
| | | 708/626 |

(Continued)

FOREIGN PATENT DOCUMENTS

| JP | 2000156472 A | 6/2000 |
| KR | 20160089141 A | 7/2016 |
| WO | 2019005175 A1 | 1/2019 |

OTHER PUBLICATIONS

Final Office Action dated Apr. 4, 2022 for U.S. Appl. No. 17/129,849.
(Continued)

*Primary Examiner* — Kurtis R Bahr
(74) *Attorney, Agent, or Firm* — MUGHAL GAUDRY & FRANKLIN PC

(57) ABSTRACT

A new class of multiplier cells (analog or digital) is derived from a 1-bit full adder and an AND gate. The 1-bit full adder is derived from first and second majority gates. The multiplier cell can also be implemented with a combination of two majority gates with majority and AND functions integrated in each of them. The two majority gates are coupled. Each of the first and second majority logic gates comprise a capacitor with non-linear polar material. The first and second majority gates receive the two inputs A and B that are to be multiplied. Other inputs received by the first and second majority gates are carry-in input, a sum-in input, and a bias voltage. The bias voltage is a negative voltage, which produces an integrated AND function in conjunction with a majority function. The second majority gate receives additional inputs, which are inverted output of the first majority gate.

19 Claims, 33 Drawing Sheets

(51) Int. Cl.
*G06F 7/501* (2006.01)
*H01L 27/118* (2006.01)

(56) References Cited

U.S. PATENT DOCUMENTS

| | | | |
|---|---|---|---|
| 4,761,760 A | 8/1988 | Tomoji | |
| 5,381,352 A | 1/1995 | Shou et al. | |
| 5,818,380 A | 10/1998 | Ito et al. | |
| 5,835,045 A | 11/1998 | Ogawa et al. | |
| 5,926,057 A | 7/1999 | Ogawa et al. | |
| 5,978,827 A | 11/1999 | Ichikawa | |
| 6,043,675 A * | 3/2000 | Miyamoto | H03M 1/145 326/11 |
| 6,198,652 B1 | 3/2001 | Kawakubo et al. | |
| 6,208,282 B1 | 3/2001 | Miyamoto | |
| 6,505,226 B1 | 1/2003 | Ahn | |
| 7,837,110 B1 | 11/2010 | Hess et al. | |
| 7,897,454 B2 | 3/2011 | Wang et al. | |
| 8,247,855 B2 | 8/2012 | Summerfelt | |
| 9,276,040 B1 | 3/2016 | Marshall et al. | |
| 9,324,405 B2 | 4/2016 | Evans, Jr. et al. | |
| 9,697,882 B1 | 7/2017 | Evans, Jr. et al. | |
| 9,858,979 B1 | 1/2018 | Derner et al. | |
| 9,912,323 B1 | 3/2018 | Ardalan | |
| 9,973,329 B2 | 5/2018 | Hood et al. | |
| 10,217,522 B2 | 2/2019 | Wang et al. | |
| 10,622,050 B2 | 4/2020 | El-Mansouri et al. | |
| 10,679,782 B2 | 6/2020 | Manipatruni et al. | |
| 10,944,404 B1 * | 3/2021 | Manipatruni | G06F 7/501 |
| 11,165,430 B1 | 11/2021 | Manipatruni et al. | |
| 11,283,453 B2 | 3/2022 | Manipatruni et al. | |
| 2001/0052619 A1 * | 12/2001 | Inoue | H01L 27/1211 257/347 |
| 2002/0185690 A1 | 12/2002 | Ueda et al. | |
| 2004/0183508 A1 | 9/2004 | Toyoda et al. | |
| 2015/0269478 A1 | 9/2015 | Datta et al. | |
| 2015/0337983 A1 | 11/2015 | Dolenti et al. | |
| 2017/0243917 A1 | 8/2017 | Manipatruni et al. | |
| 2017/0337983 A1 * | 11/2017 | Wang | G11C 11/221 |
| 2018/0076815 A1 | 3/2018 | Vigeant et al. | |
| 2018/0240583 A1 | 8/2018 | Manipatruni et al. | |
| 2019/0074295 A1 | 3/2019 | Schröder | |
| 2019/0318775 A1 | 10/2019 | Rakshit et al. | |
| 2019/0348098 A1 | 11/2019 | El-Mansouri et al. | |
| 2020/0091407 A1 | 3/2020 | Liu et al. | |
| 2020/0091414 A1 * | 3/2020 | Liu | G11C 11/1675 |
| 2020/0210233 A1 | 7/2020 | Chen et al. | |
| 2020/0258894 A1 | 8/2020 | Lilak et al. | |
| 2021/0226636 A1 | 7/2021 | Manipatruni et al. | |
| 2022/0271756 A1 | 8/2022 | Fan et al. | |

OTHER PUBLICATIONS

Non-Final Office Action dated Feb. 22, 2022 for U.S. Appl. No. 17/129,849.
Notice of Allowance dated Apr. 14, 2022 for U.S. Appl. No. 17/129,849.
Notice of Allowance dated Mar. 2, 2022 for U.S. Appl. No. 17/129,821.
Final Office Action dated Dec. 15, 2021 for U.S. Appl. No. 17/129,824.
Final Office Action dated Nov. 26, 2021 for U.S. Appl. No. 17/129,800.
Non-Final Office Action dated Nov. 3, 2021 for U.S. Appl. No. 17/129,800.
Notice of Allowance dated Dec. 3, 2021 for U.S. Appl. No. 17/129,830.
International Preliminary Report on Patentability dated Jul. 7, 2022 for PCT Patent Application No. PCT/US2020/066961.
International Preliminary Report on Patentability dated Jul. 7, 2022 for PCT Patent Application No. PCT/US2020/066963.
Notice of Allowance dated Jul. 15, 2022 for U.S. Appl. No. 17/183,181.
Notice of Allowance dated Sep. 29, 2021 for TW Patent Application No. 109146061.
Notice of Allowance dated Dec. 21, 2021 for U.S. Appl. No. 17/129,800.
Fichtner, S. et al., "AlScN: A III-V semiconductor based ferroelectric", Journal of Applied Physics 125, 114103 (2019); https://doi.org/10.1063/1.5084945, 2019, 28 pages.
Final Office Action dated Jul. 6, 2020 for U.S. Appl. No. 16/729,269.
Final Office Action dated Nov. 24, 2020 for U.S. Appl. No. 16/797,299.
Final Office Action dated Nov. 27, 2020 for U.S. Appl. No. 16/729,275.
First Office Action & Search Report dated Jun. 25, 2021 for Taiwan Patent Application No. 109146064.
First Office Action dated Jul. 7, 2021 for Taiwan Patent Application No. 109146061.
International Search Report & Written Opinion dated Apr. 15, 2021 for U.S. Patent Application No. PCT/US2020/066961.
International Search Report & Written Opinion dated Apr. 22, 2021 for PCT Patent Application No. PCT/US2020/066963.
Kepler Logic. Named for Amalie Emmy Noether @ https://en.wikipedia.org/wiki/Emmy_Noether.
Muller, J. et al., "Ferroelectric Hafnium Oxide Based Materials and Devices: Assessment of Current Status and Future Prospects", ECS Journal of Solid State Science and Technology, 4 (5) N30-N35 (215). 6 pages.
Muroga, S., "Threshold Logic and its Applications", New York, Wiley-Interscience. published 1971.
Non-Final Office Action dated Apr. 22, 2020 for U.S. Appl. No. 16/729,275.
Non-Final Office Action dated Aug. 7, 2020 for U.S. Appl. No. 16/729,275.
Non-Final Office Action dated Aug. 11, 2020 for U.S. Appl. No. 16/796,824.
Non-Final Office Action dated Aug. 13, 2020 for U.S. Appl. No. 16/797,299.
Non-Final Office Action dated Mar. 27, 2020 for U.S. Appl. No. 16/729,269.
Non-Final Office Action dated Nov. 24, 2020 for U.S. Appl. No. 16/796,824.
Non-Final Office Action dated Sep. 16, 2021 for U.S. Appl. No. 17/129,824.
Notice of Allowance dated Feb. 3, 2021 for U.S. Appl. No. 16/729,275.
Notice of Allowance dated Feb. 5, 2020 for U.S. Appl. No. 16/796,824.
Notice of Allowance dated Jan. 29, 2020 for U.S. Appl. No. 16/797,299.
Notice of Allowance dated Nov. 3, 2020 for U.S. Appl. No. 16/797,296.
Notice of Allowance dated Oct. 1, 2021 for Taiwan Patent Application No. 109146061.
Notice of Allowance dated Oct. 28, 2021 for Taiwan Patent Application No. 109146064.
Notice of Allowance dated Sep. 21, 2020 for U.S. Appl. No. 16/729,269.
Subbarao, E., "Ferroelectric and antiferroelectric materials", Department of Metallurgical Engineering, Indian Institute of Technology, Kanpur, IN. First published Mar. 15, 2011. Ferroelectrics, 5:1, 267-280.
Hou et al., "Ultrahigh Energy Density in SrTiO3 Film Capacitors," ACS Appl. Mater. Interfaces 2017, 9, 24, 20484-20490 Publication Date: May 30, 2017, https://doi.org/10.1021/acsami. 7b02225, (7 pages).
Navi et al., "Two novel ultra-high speed carbon nanotube Full-Adder cells," IEICE Electronics Express, vol. 6, No. 19, 1395-1401, doi :10.1587/elex.6.1395. Publication date Oct. 10, 2009, (7 pages).
Non-Final Office Action dated Apr. 17, 2023 for U.S. Appl. No. 17/467,061.
Non-Final Office Action dated Dec. 27, 2022 for U.S. Appl. No. 17/654,055.
Non-Final Office Action dated Sep. 9, 2022 for U.S. Appl. No. 17/317,482.

(56) References Cited

OTHER PUBLICATIONS

Notice of Allowance dated Mar. 31, 2023 for U.S. Appl. No. 17/654,055.
Notice of Allowance dated Sep. 23, 2022 for U.S. Appl. No. 17/317,482.
Final Office Action dated Sep. 7, 2023 for U.S. Appl. No. 17/467,061.

* cited by examiner

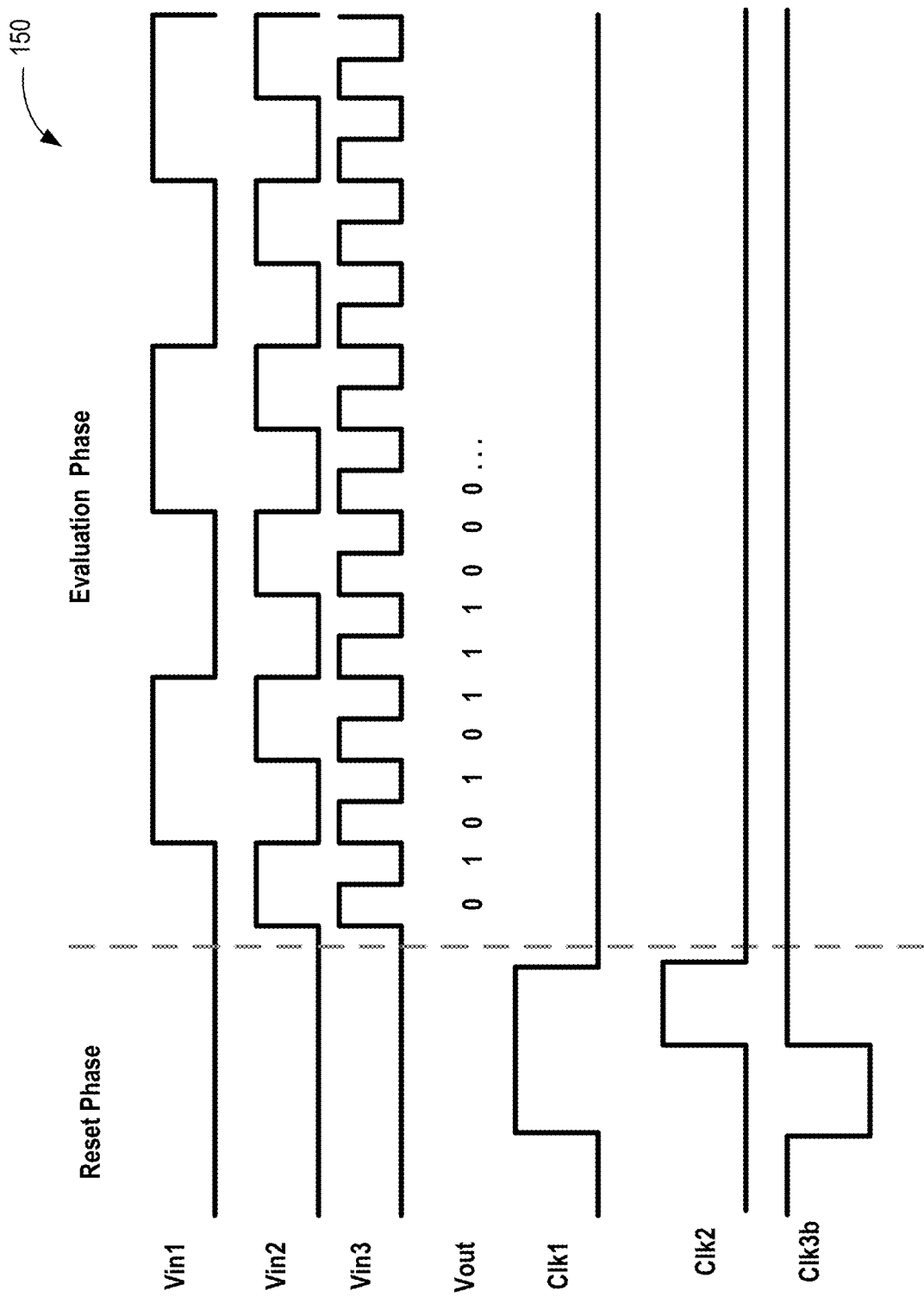

US 11,863,183 B1

LOW POWER NON-LINEAR POLAR MATERIAL BASED THRESHOLD LOGIC GATE MULTIPLIER

CLAIM OF PRIORITY

This Application is a Continuation of, and claims the benefit of priority to, U.S. patent application Ser. No. 17/129,824, filed on Dec. 21, 2020, titled "Low Power Ferroelectric Based Majority Logic Gate Multiplier," and now issued as U.S. Pat. No. 11,381,244 on Jul. 5, 2022, which is incorporated by reference in its entirety for all purposes.

BACKGROUND

Typical multiplier cell includes a 1-bit full adder and an AND gate. The 1-bit full adder receives three or more inputs, and may consist of several logic gates such as AND gate, OR, gate, XOR gates, inverters, and buffers. In complementary metal oxide semiconductor (CMOS) logic, a 2-input AND gate derived from a 2-input NAND gate and an inverter consists of six transistors. A 2-input OR gate derived from a 2-input NOR gate and an inverter consists of six transistors. A 2-input XOR gate may consist of at least six transistors. As the number of transistors increases, power consumption and area also increase. As devices are pushing down the power envelope to save battery power, existing circuit architecture for a multiplier cell presents challenges to the goal of lower power consumption.

The background description provided here is for the purpose of generally presenting the context of the disclosure. Unless otherwise indicated here, the material described in this section is not prior art to the claims in this application and are not admitted to be prior art by inclusion in this section.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 1E illustrates a timing diagram for resetting the ferroelectric capacitor for majority gates of FIGS. 1A-B, in accordance with some embodiments.

DETAILED DESCRIPTION

Figure 1A:
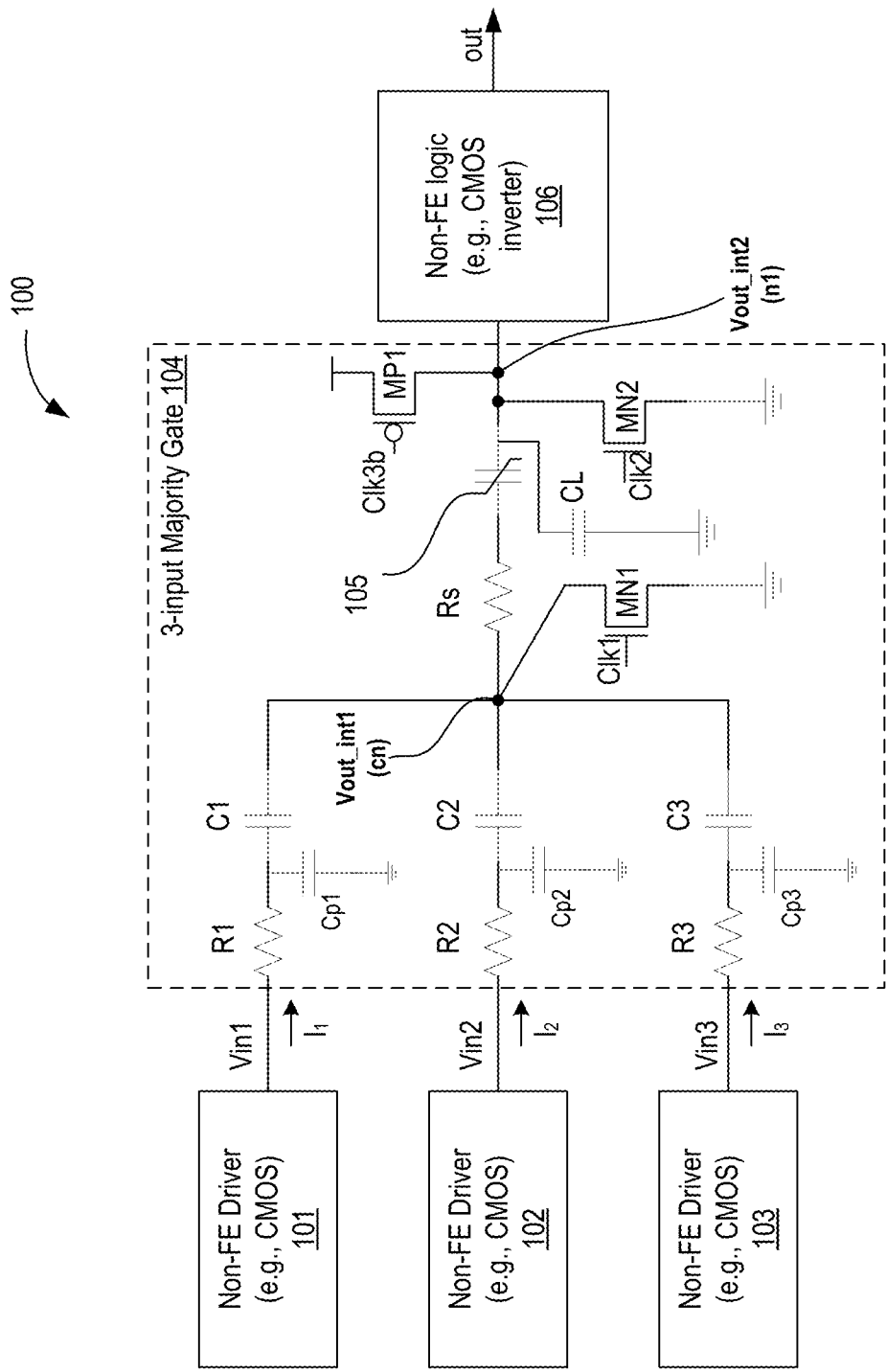
FIG. 1A illustrates a logic gate with a 3-input majority gate, in accordance with some embodiments.

In some embodiments, a multiplier cell is derived from a 1-bit full adder and an AND gate. In various embodiments, the 1-bit full adder is derived from first and second majority gates.

A full adder adds binary numbers. A one-bit full-adder adds three one-bit numbers, A, B, and $C_{in}$, where A and B are the operands, and $C_{in}$ is a carry-in bit which is carried in from a previous less-significant stage. A full adder is usually a derived as a cascade of adders. These adders add, for example, 8, 16, 32, etc. bit binary numbers. The output of a 1-bit full adder circuit produces a 2-bit output. One of the output bits is a carry output and other output bit is a sum. The carry is typically represented by signal $C_{in}$ while the sum is typically represented by signal S, where the sum equals $2C_{out}+S$. Implementing a 1-bit adder requires many logic gates such as AND logic gate, OR logic gate, inverters, and sometimes state elements such as flip-flops.

Some embodiments describe a new class of logic gates that use non-linear polar material. These new class of logic gates become the basis of a 1-bit full adder. The logic gates include multi-input majority gates and threshold gates. Input signals in the form of digital signals, analog, digitals, or combination of them are driven to first terminals of non-ferroelectric capacitors. The second terminals of the non-ferroelectric capacitors are coupled to form a majority node. Majority function of the input signals occurs on this node. The majority node is then coupled to a first terminal of a capacitor comprising non-linear polar material. The second terminal of the capacitor provides the output of the logic gate, which can be driven by any suitable logic gate such as a buffer, inverter, NAND gate, NOR gate, etc. Any suitable logic or analog circuit can drive the output and inputs of the majority logic gate. As such, the majority gate of various embodiments can be combined with existing transistor technologies such as complementary metal oxide semiconductor (CMOS), tunneling field effect transistor (TFET), GaAs based transistors, bipolar junction transistors (BJTs), Bi-CMOS transistors, etc.

In some embodiments, a 1-bit adder is implemented using a 3-input majority gate and a 5-input majority gate. An output from the 3-input majority gate is inverted and input two times to the 5-input majority gate. Other inputs to the 5-input majority gate are the same as those of the 3-input majority gate. The output of the 5-input majority gate is a sum while the output of the 3-input majority gate is the carry.

In some embodiments, an additional fixed or programmable input is coupled to the majority node via a capacitor. This additional fixed or programmable input can be a positive or negative bias. The bias behaves as a threshold or offset added or subtracted to or from the voltage (or current) on the majority node and determines the final logic value of the logic gate. Depending on the polarity or voltage value of the bias, AND gate or OR logic gate functions are realized, in accordance with various embodiments.

In some embodiments, the multiplier cell is implemented with a combination of two majority gates with majority and AND functions integrated in each of them. These two majority gates are a first majority logic gate with integration majority and AND logic functions, and a second majority logic gate with integration majority and AND logic functions. The two majority gates are coupled. Each of the first and second majority logic gates comprise a capacitor with non-linear polar material. In some embodiments, the first and second majority gates receive the two inputs A and B that are to be multiplied. Other inputs received by the first and second majority gates are carry-in input, a sum-in input, and a bias voltage. In various embodiments, the bias voltage is a negative voltage which produces an integrated AND function in conjunction with a majority function. As such, the majority gates are threshold gates. The second majority gate receives additional inputs, which are inverted output of the first majority gate.

The multiplier cell of various embodiments can be an analog multiplier or digital multiplier. In an analog multiplier, the inputs that are multiplied as analog signals, and the output is a product of those analog signals. In a digital multiplier, the inputs are digital signals, and the output is a product of those digital signals. In some embodiments, the multiplier cell can receive both analog and digital signals that are multiplied with one another.

There are many technical effects of the various embodiments. For example, extremely compact basic logic gates are formed using the non-ferroelectric capacitors and a capacitor with non-linear polar material. The non-linear polar material can be ferroelectric material, para-electric material, or non-linear dielectric. The logic gates become the basis of adders, multipliers, sequential circuits, and other complex circuits etc. The majority gate and threshold gate of various embodiments lower the power consumption because they do not use switching transistors and the interconnect routings are much fewer than the interconnect routings used in transitional CMOS logic gates. For example, 10× fewer interconnect length is used by the majority gate and threshold gate of various embodiments than traditional CMOS circuits for the same function and performance. The capacitor with non-linear polar material provides non-volatility that allows for intermittent operation.

For example, a processor having such logic gates can enter and exit various types of low power states without having to worry about losing data. Since the capacitor with non-linear polar material can store charge from low energy devices, the entire processor can operate at much lower voltage level from the power supply, which reduces overall power of the processor. Further, very low voltage switching (e.g., 100 mV) of the non-linear polar material state allows for low swing signal switching, which in turn results in low power.

The capacitor with non-linear polar material are used with any type of transistor. For example, the capacitor with non-linear polar material of various embodiments are used with planar or non-planar transistors. The transistors are formed in the frontend or backend of a die. The capacitors with non-linear polar material are formed in the frontend or backend of the die. As such, the logic gates are packed with high density compared to traditional logic gates. Adders and multipliers are basic building blocks in processors. The majority gate based multipliers of various embodiments are orders of magnitude smaller than a typical CMOS multiplier. This allows for implementing N×N multipliers to multiply very large numbers at very low power and with small area. The non-volatility of the outputs also makes the multipliers of various embodiments ideal for low power applications. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus, which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

Here, the term "analog signal" generally refers to any continuous signal for which the time varying feature (variable) of the signal is a representation of some other time varying quantity, i.e., analogous to another time varying signal.

Here, the term "digital signal" generally refers to a physical signal that is a representation of a sequence of discrete values (a quantified discrete-time signal), for example of an arbitrary bit stream, or of a digitized (sampled and analog-to-digital converted) analog signal.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, source, or drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single FET (field effect transistor).

Here, the term "backend" generally refers to a section of a die which is opposite of a "frontend" and where an IC (integrated circuit) package couples to IC die bumps. For example, high-level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example).

It is pointed out that those elements of the figures having the same reference numbers (or names) as the elements of any other figure can operate or function in any manner similar to that described, but are not limited to such.

FIG. 1A illustrates logic gate 100 with a 3-input majority gate, in accordance with some embodiments. Logic Gate 100 comprises first, second, and third drivers 101, 102, and 103, respectively. These drivers can be analog drivers generating analog signals or digital drivers generating signals that toggle between ground and the power supply rail, or a combination of analog or digital drivers. For example, driver 101 is a CMOS driver such as a buffer, inverter, a NAND gate, NOR gate, etc., while driver 102 is an amplifier generating a bias signal. The drivers provide input signals Vin1 (and current $I_1$), Vin2 (and current $I_2$), and Vin3 (and current $I_3$) to the three inputs of 3-input majority gate 104.

In various embodiments, 3-input majority gate 104 comprises three input nodes Vin1, Vin2, and Vin3. Here, signal names and node names are interchangeably used. For example, Vin1 refers to node Vin1 or signal Vin1 depending on the context of the sentence. 3-input majority gate 104 further comprises capacitors C1, C2, and C3. Here, resistors R1, R2, and R3 are interconnect parasitic resistances coupled to capacitors C1, C2, and C3 respectively. In various embodiments, capacitors C1, C2, and C3 are non-ferroelectric capacitors. In some embodiments, the non-ferroelectric capacitor includes one of: dielectric capacitor, para-electric capacitor, or non-linear dielectric capacitor.

A dielectric capacitor comprises first and second metal plates with a dielectric between them. Examples of such dielectrics are: HfO, ABO3 perovskites, nitrides, oxy-fluorides, oxides, etc.

A para-electric capacitor comprises first and second metal plates with a para-electric material between them. In some embodiments, f-orbital materials (e.g., lanthanides) are doped to the ferroelectric materials to make paraelectric material. Examples of room temperature paraelectric material include: SrTiO3, Ba(x)Sr(y)TiO3 (where x is −0.5, and y is 0.95)), HfZrO2, Hf—Si—O, La-substituted PbTiO3, PMN-PT based relaxor ferroelectrics.

A dielectric capacitor comprises first and second metal plates with non-linear dielectric capacitor between them. The range for dielectric constant is 1.2 to 10000. The capacitors C1, C2, and C3 can be implemented as MIM (metal-insulator-metal) capacitor technology, transistor gate capacitor, hybrid of metal capacitors or transistor capacitor. The capacitors C1, C2, and C3 can be implemented as MIM (metal-insulator-metal) capacitor technology, transistor gate capacitor, or hybrid of metal capacitors or transistor capacitor.

One terminal of the capacitors C1, C2, and C3 is coupled to a common node cn. This common node is coupled to node n1, which is coupled to a first terminal of a non-linear polar capacitor 105. The majority function is performed at the common node cn, and the resulting voltage is projected on to capacitor 105. For example, the majority function of the currents ($I_1$, $I_2$, and $I_3$) on node cn results in a resultant current that charges capacitor 105. Table 1 illustrates the majority function f(Majority Vin1, Vin2, Vin3).

TABLE 1

| Vin1 | Vin2 | Vin3 | cn (f(Majority Vin1, Vin2, Vin3)) |
|---|---|---|---|
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |

A capacitor with FE material (also referred to as a FEC) is a non-linear capacitor with its potential $V_F(Q_F)$ as a cubic function of its charge. FIG. 1C illustrates plot 130 showing characteristics of a FEC. Plot 130 is a charge-voltage (Q-V) plot for a block f $Pb(Zr_{0.5}Ti_{0.5})O_3$ of area $(100\ nm)^2$ and thickness 20 nm (nanometer). Plot shows local extrema at $+/-V_o$ indicated by the dashed lines. Here, the term $V_c$ is the coercive voltage. In applying a potential V across the FEC, its charge can be unambiguously determined only for $|V| > V_o$. Otherwise, the charge of the FEC is subject to hysteresis effects.

Referring back to FIG. 1A, in some embodiments, N odd number of capacitors are coupled to a single FEC to form a majority gate. In this case, N=3. The measured charge on the FEC ($Q_F$) is the output of the majority gate. Solving for a steady-state solution, the parasitic resistors are ignored and the input potentials $V_i$ (or Vin) are assumed to be constant. In this case, the charge across each linear capacitor (C1, C2, C3) is:

$$Q_i = C_i(V_i - V_F) \tag{1}$$

The charge summed at node Cn and across FEC 105 is express as:

$$Q_F = \sum_i Q_i \tag{2}$$

$$Q_F = \sum_i C_i V_i - \sum_i C_i V_F \tag{3}$$

$$Q_F = \sum_i C_i V_i - C V_F(Q_F) \tag{4}$$

$$V_F(Q_F) = \sum_i \frac{C_i}{C} V_i - \frac{Q_F}{C} \tag{5}$$

Here, $C = \Sigma_i C_i$ is the sum of the capacitances. In the limit, $C \to \infty$, the following is achieved:

$$V_F(Q_F) = \sum_i \frac{C_i}{C} V_i = \bar{V} \tag{6}$$

The potential across FEC 105 is the average of all the input potentials weighted by the capacitances (e.g., C1, C2, and C3).

When $C_i = C/N$ are all equal, $V_F$ is just a simple mean. To ensure that $$Q_F = V^{-1}{}_F(\bar{V}) \tag{7}$$

is well defined, all possible values of $\bar{V}$ have magnitudes greater than $V_c$, the coercive potential. Assuming binary input of $+/-V_s$, the potential with the smallest magnitude is:

$$\bar{V} = V_s/N \tag{8}$$

This occurs when (N+1)/2 of the inputs are $+V_s$ and (N−1)/2 are $-V_s$. Then, $$V_s > NV_C \qquad (9)$$

Figure 1B:
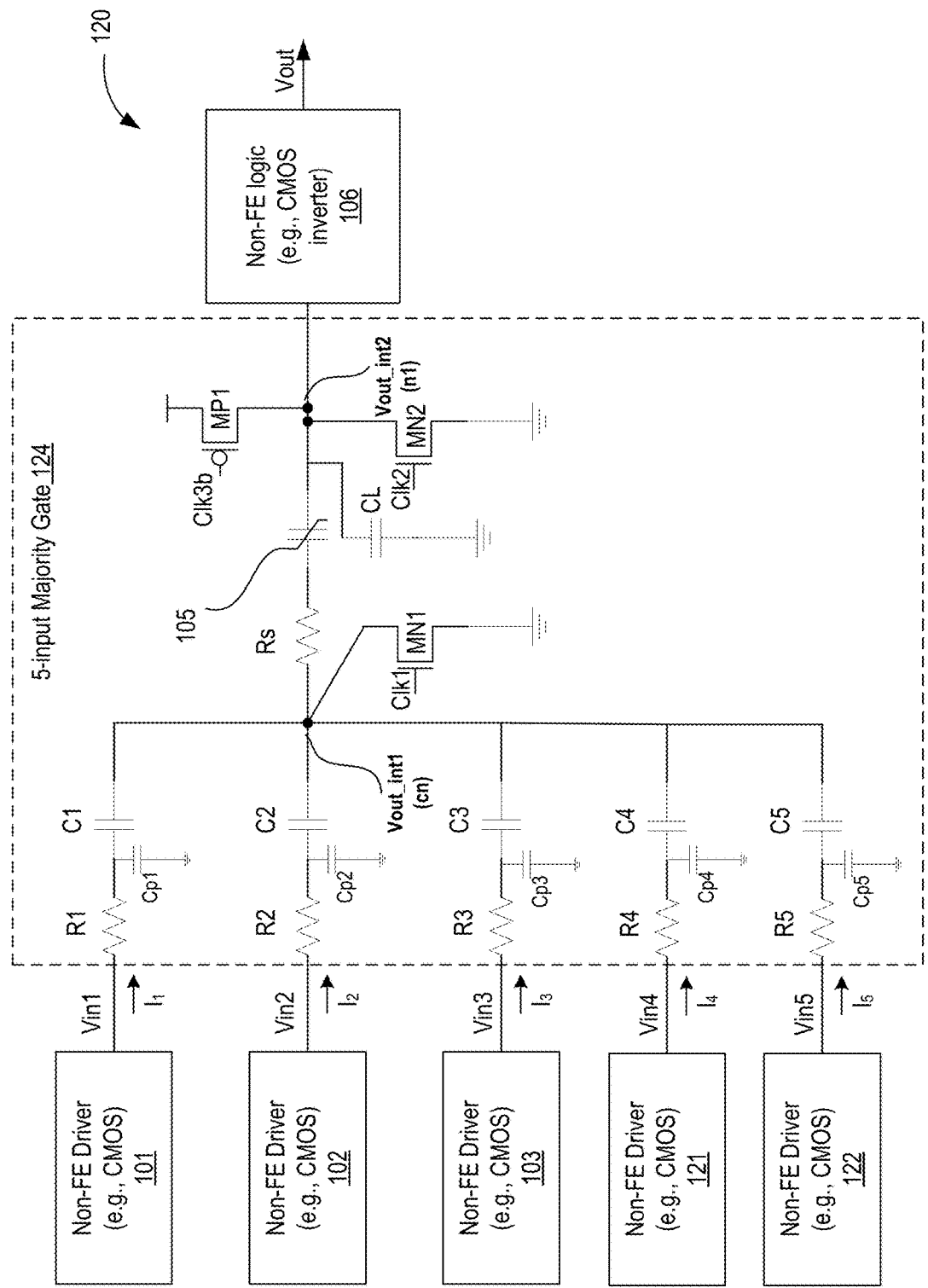
FIG. 1B illustrates a logic gate with a 5-input majority gate, in accordance with some embodiments.
Figure 1C:
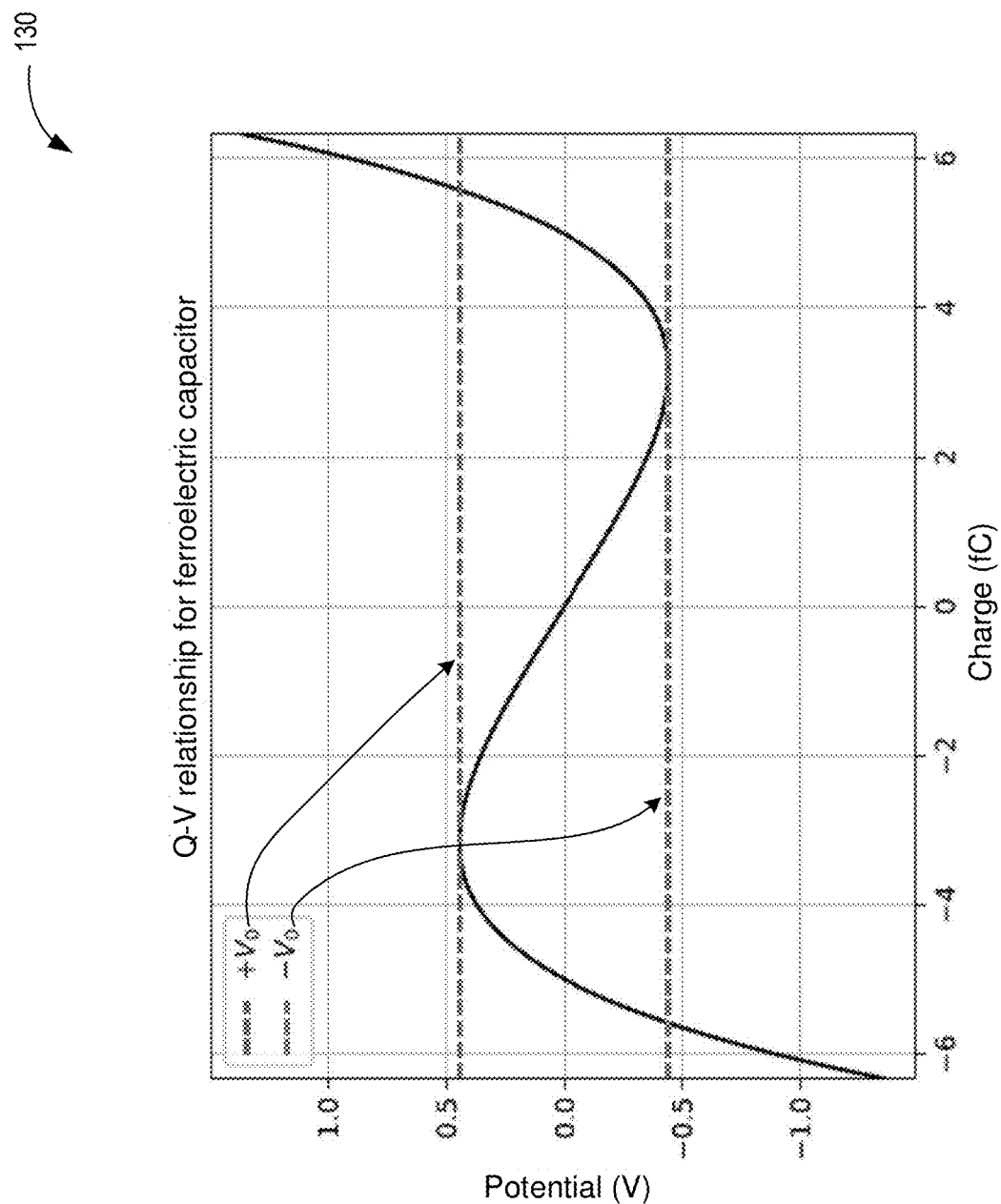
FIG. 1C illustrates a plot showing characteristics of a ferroelectric capacitor.
Figure 1D:
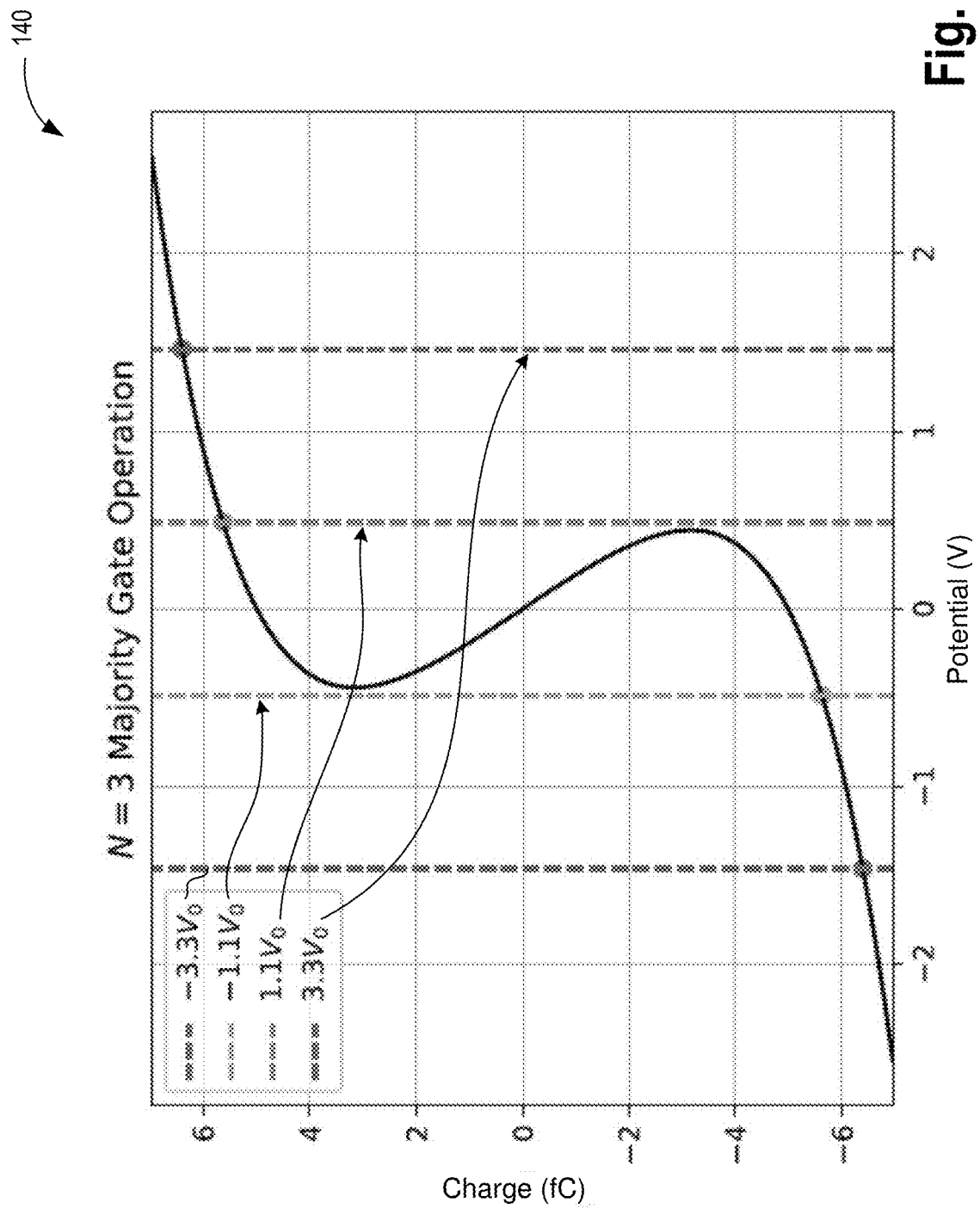
FIG. 1D illustrates plot showing the output of a 3-input majority gate, in accordance with some embodiments.

The output of the majority gate at node n1 is expressed by FIG. 1D. FIG. 1D illustrates plot 140 showing the output of a 3-input majority gate, in accordance with some embodiments.

As an example, for N=3, the possible inputs are:

$$\overline{V} \in \left\{ -\frac{3}{3}V_s, -\frac{1}{3}V_s, +\frac{1}{3}V_s, +\frac{3}{3}V_s \right\} \qquad (10)$$

Referring back to FIG. 1A, since capacitor 105 is a non-linear polar capacitor, both of its terminals of the capacitor are pre-discharged to ground or to a known predetermined voltage via n-type transistors pull-down transistors MN1 and MN2, and p-type pull-up transistors. The predetermined voltage can be programmable. The pre-determined voltage can be positive or negative. In some embodiments, n-type transistor MN1 is coupled to node Vout_int1 (internal Vout node) and is controllable by clock or reset signal Clk1. In some embodiments, n-type transistor MN2 is coupled to node Vout_int2 (internal Vout node) and is controllable by clock or reset signal Clk2. In some embodiments, p-type transistor MP1 is coupled to node Vout_int2, and is controllable by Clk3*b*.

In some embodiments, the n-type transistors MN1 and MN2 are replaced with p-type transistors to pre-charge both terminals (Vout_int1 and Vout_int2) of capacitor 105 to a supply voltage or another predetermined voltage, while the p-type transistor MP1 is replaced with an n-type transistor coupled to ground or a negative supply rail. The predetermined voltage can be programmable. The pre-determined voltage can be positive or negative.

In some embodiments, the pre-charge or pre-discharge of the terminals of capacitor 105 (or nodes cn and n1) is done periodically by a clock signals Clk1, Clk2, and Clk3*b*. The controls can be a non-clock signal that is generated by a control logic (not shown). For example, the control can be issued every predetermined or programmable time. In some embodiments, clock signals Clk1, Clk2, and Clk3*b* are issued in a reset phase, which is followed by an evaluation phase where inputs Vin1, Vin2, and Vin3 are received and majority function is performed on them. FIG. 1E illustrates timing diagram 150 for resetting the ferroelectric capacitor for majority gates of FIGS. 1A-B, in accordance with some embodiments.

Clk1 has a pulse with larger than the pulse widths of Clk2 and Clk3*b*. Clk3*b* is an inverse of Clk3 (not shown). In some embodiments, Clk1 is first asserted which begins to discharge node Vout_int1. While node Vout_int1 is being discharged, Clk2 is asserted. Clk2 may have a pulse width which is substantially half of the pulse width of Clk1. When Clk2 is asserted, node Vout_int2 is discharged. This sequence assures that both terminals of the non-linear polar material of capacitor 105 are discharged sequentially. In various embodiments, before discharging node Vout_int2, Clk3*b* is de-asserted which turns on transistor MP1, causing Vout_int2 to be charged to a predetermined value (e.g., supply level). The pulse width of Clk3*b* is smaller than the pulse width of clk1 to ensure the Clk3*b* pulsing happens within the Clk1 pulse window. This is useful to ensure non-linear polar capacitor 105 is initialized to a known programmed state along with the other capacitors (e.g., C1, C2, C3) which are initialized to 0 V across them. The pulsing on Vout_int2 creates the correct field across the non-linear polar capacitor 105 in conjunction with Vout_int1 to put it in the correct state, such that during operating mode, if Vout_int1 goes higher than Vc value (coercive voltage value), it triggers the switching for non-linear polar capacitor 105, thereby resulting into a voltage build up on Vout_int2.

In some embodiments, load capacitor CL is added to node Vout_int2. In some embodiments, load capacitor CL is a regular capacitor (e.g., a non-ferroelectric capacitor). The capacitance value of CL on Vout_int2 is useful to ensure that the FE switching charge (of FE capacitor 105) provides the right voltage level. For a given FE size (area A), with polarization switching density (dP) and desired voltage swing of Vdd (supply voltage), the capacitance of CL should be approximately CL=dP*A/Vdd. There is slight deviation from the above CL value as there is charge sharing on Vout_int2 due to dielectric component of FE capacitor 105. The charge sharing responds relative to voltage on Vout_int1, and capacitor divider ratio between the dielectric component of the FE capacitor 105, and load capacitor (CL). Note, the capacitance of CL can be aggregate of all the capacitances (e.g., parasitic routing capacitance on the node, gate capacitance of the output stage 106, and drain or source capacitance of the reset devices (e.g., MN2, MP1) on the Vout_int2 node. In some embodiments, for a given size of non-linear polar capacitor 105, CL requirement can be met by just the load capacitance of Non-FE logic 106, and parasitic component itself, and may not need to have it as a separate linear capacitor.

Referring back to FIG. 1A, in some embodiments, the non-linear polar material of capacitor 105 includes one of: ferroelectric (FE) material, para-electric material, relaxor ferroelectric, or non-linear dielectric. In various embodiments, para-electric material is same as FE material but with chemical doping of the active ferroelectric ion by an ion with no polar distortion. In some cases, the non-polar ions are non-s orbital ions formed with p, d, f external orbitals. In some embodiments, non-linear dielectric materials are same as para-electric materials, relaxors, and dipolar glasses.

In some embodiments, f-orbital materials (e.g., lanthanides) are doped to the ferroelectric material to make para-electric material. Examples of room temperature paraelectric material include: SrTiO3, Ba(x)Sr(y)TiO3 (where x is −0.5, and y is 0.95), HfZrO2, Hf—Si—O, La-substituted PbTiO3, PMN-PT based relaxor ferroelectrics.

In various embodiments, the FE material can be any suitable low voltage FE material that allows the FE material to switch its state by a low voltage (e.g., 100 mV). In some embodiments, the FE material comprises a perovskite of the type $ABO_3$, where 'A' and 'B' are two cations of different sizes, and 'O' is oxygen which is an anion that bonds to both the cations. Generally, the size of atoms of A is larger than the size of B atoms. In some embodiments, the perovskite can be doped (e.g., by La or Lanthanides). Perovskites can be suitably doped to achieve a spontaneous distortion in a range of 0.3 to 2%. For example, for chemically substituted lead titanate such as Zr in Ti site; La, Nb in Ti site, the concentration of these substitutes is such that it achieves the spontaneous distortion in the range of 0.3 to 2%. For chemically substituted BiFeO3, BiCrO3, BiCoO3 class of materials, La or rare earth substitution into the Bi site can tune the spontaneous distortion.

Threshold in the FE material has a highly non-linear transfer function in the polarization vs. voltage response.

The threshold is related a) non-linearity of switching transfer function, and b) to the squareness of the FE switching. The non-linearity of switching transfer function is the width of the derivative of the polarization vs. voltage plot. The squareness is defined by the ratio of the remnant polarization to the saturation polarization; perfect squareness will show a value of 1.

The squareness of the FE switching can be suitably manipulated with chemical substitution. For example, in PbTiO3 a P-E (polarization-electric field) square loop can be modified by La or Nb substitution to create a S-shaped loop. The shape can be systematically tuned to ultimately yield a non-linear dielectric. The squareness of the FE switching can also be changed by the granularity of the FE layer. A perfectly epitaxial, single crystalline FE layer will show higher squareness (e.g., ratio is closer to 1) compared to a poly crystalline FE. This perfectly epitaxial can be accomplished by the use of lattice matched bottom and top electrodes. In one example, BiFeO (BFO) can be epitaxially synthesized using a lattice matched SrRuO3 bottom electrode yielding P-E loops that are square. Progressive doping with La will reduce the squareness.

In some embodiments, the FE material is contacted with a conductive metal oxide that includes one of the conducting perovskite metallic oxides exemplified by: La—Sr—CoO3, SrRuO3, La—Sr—MnO3, YBa2Cu3O7, Bi2Sr2CaCu2O8, LaNiO3, and ReO3.

In some embodiments, the FE material comprises a stack of layers including low voltage FE material between (or sandwiched between) conductive oxides. In various embodiments, when FE material is a perovskite, the conductive oxides are of the type AA'BB'O$_3$. A' is a dopant for atomic site A, it can be an element from the Lanthanides series. B' is a dopant for atomic site B, it can be an element from the transition metal elements especially Sc, Ti, V, Cr, Mn, Fe, Co, Ni, Cu, Zn. A' may have the same valency of site A, with a different ferroelectric polarizability.

In some embodiments, the FE material comprises hexagonal ferroelectrics of the type h-RMnO3, where R is a rare earth element such as cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered MnO5 polyhedra, accompanied by displacements of the Y ions, which lead to a net electric polarization. In some embodiments, hexagonal FE includes one of: YMnO3 or LuFeO3. In various embodiments, when the FE material comprises hexagonal ferroelectrics, the conductive oxides adjacent to the FE material are of A2O3 (e.g., In2O3, Fe2O3) and ABO3 type, where 'A' is a rare earth element and B is Mn.

In some embodiments, the FE material comprises improper FE material. An improper ferroelectric is a ferroelectric where the primary order parameter is an order mechanism such as strain or buckling of the atomic order. Examples of improper FE material are LuFeO3 class of materials or super lattice of ferroelectric and paraelectric materials PbTiO3 (PTO) and SnTiO3 (STO), respectively, and LaAlO3 (LAO) and STO, respectively. For example, a super lattice of [PTO/STO]n or [LAO/STO]n, where 'n' is between 1 to 100. While various embodiments here are described with reference to ferroelectric material for storing the charge state, the embodiments are also applicable for paraelectric material. For example, the capacitor of various embodiments can be formed using paraelectric material instead of ferroelectric material.

In some embodiments, the FE material includes one of: Hafnium (Hf), Zirconium (Zr), Aluminum (Al), Silicon (Si), their oxides or their alloyed oxides. In some embodiments, FE material includes one of: Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction. In some embodiments, the FE material includes Bismuth ferrite (BFO), lead zirconate titanate (PZT), BFO with doping material, or PZT with doping material, wherein the doping material is one of Nb or; and relaxor ferroelectrics such as PMN-PT.

In some embodiments, the FE material includes Bismuth ferrite (BFO), BFO with a doping material where in the doping material is one of Lanthanum, or any element from the lanthanide series of the periodic table. In some embodiments, the FE material 105 includes lead zirconium titanate (PZT), or PZT with a doping material, wherein the doping material is one of La, Nb. In some embodiments, the FE material includes a relaxor ferroelectric includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST).

In some embodiments, the FE material includes Hafnium oxides of the form, Hf1-x Ex Oy where E can be Al, Ca, Ce, Dy, er, Gd, Ge, La, Sc, Si, Sr, Sn, or Y. In some embodiments, FE material 105 includes Niobate type compounds LiNbO3, LiTaO3, Lithium iron Tantalum Oxy Fluoride, Barium Strontium Niobate, Sodium Barium Niobate, or Potassium strontium niobate.

In some embodiments, the FE material comprises multiple layers. For example, alternating layers of [Bi2O2]2+, and pseudo-perovskite blocks (Bi4Ti3O12 and related Aurivillius phases), with perovskite layers that are n octahedral layers in thickness can be used.

In some embodiments, the FE material comprises organic material. For example, Polyvinylidene fluoride or polyvinylidene difluoride (PVDF).

The FE material is between two electrodes. These electrodes are conducting electrodes. In some embodiments, the electrodes are perovskite templated conductors. In such a templated structure, a thin layer (e.g., approximately 10 nm) of a perovskite conductor (such as SrRuO3) is coated on top of IrO2, RuO2, PdO2, or PtO2 (which have a non-perovskite structure but higher conductivity) to provide a seed or template for the growth of pure perovskite ferroelectric at low temperatures. In some embodiments, when the ferroelectric comprises hexagonal ferroelectric material, the electrodes can have hexagonal metals, spinels, or cubic metals. Examples of hexagonal metals include: PtCoO2, PdCoO2, and other delafossite structured hexagonal metallic oxides such as Al-doped ZnO. Examples of spinels include $Fe_3O_4$ and LiV2O4. Examples of cubic metals include Indium Tin Oxide (ITO) such as Sn-doped In2O3.

The charge developed on node n1 produces a voltage and current that is the output of the majority gate 104. Any suitable driver 106 can drive this output. For example, a non-FE logic, FE logic, CMOS logic, BJT logic, etc. can be used to drive the output to a downstream logic. Examples of the drivers include inverters, buffers, NAND gates, NOR gates, XOR gates, amplifiers, comparators, digital-to-analog converters, analog-to-digital converters, etc. In some embodiments, output "out" is reset by driver 106 via Clk1 signal. For example, NAND gate with one input coupled to Vout_int2 and the other input coupled to Clk1 can be used to reset "out" during a reset phase.

While FIG. 1A illustrates a 3-input majority gate, the same concept can be extended to more than 3 inputs to make an N-input majority gate, where N is greater than 2.

FIG. 1B illustrates logic gate 120 with 5-input majority gate 124, in accordance with some embodiments. 5-input majority gate 124 is similar to 3-input majority gate 104 but for additional inputs Vin3 and Vin5. These inputs can come from the same drivers (e.g., any one of drivers 101, 102, 103) or from different drivers such as driver 121 and 122. Input Vin3 and Vin5 can be analog, digital, or a combination of them. For example, Vin 3 is a digital signal while Vin5 is an analog signal. The additional inputs Vin3 and Vin5 are coupled to additional non-ferroelectric capacitors C4 and C5, respectively. The composition and size of the capacitors C4 and C5 is similar to that of C1, C2, and C3. Here, resistors R4 and R5 are parasitic resistors.

The majority function is performed at the common node cn, and the resulting voltage is projected on to capacitor 105. For example, the majority function of the currents ($I_1$, $I_2$, $I_3$, $I_4$, and $I_5$) on node cn results in a resultant current that charges capacitor 105. Table 2 illustrates the majority function f(Majority Vin1, Vin2, Vin3, Vin4, Vin5) of 5-input majority gate 124

TABLE 2

| Vin1 | Vin2 | Vin3 | Vin4 | Vin5 | cn (f(Majority Vin1, Vin2, Vin3, Vin4, Vin5)) |
|---|---|---|---|---|---|
| 0 | 0 | 0 | 0 | 0 | 0 |
| 0 | 0 | 0 | 0 | 1 | 0 |
| 0 | 0 | 0 | 1 | 0 | 0 |
| 0 | 0 | 0 | 1 | 1 | 0 |
| 0 | 0 | 1 | 0 | 0 | 0 |
| 0 | 0 | 1 | 0 | 1 | 0 |
| 0 | 0 | 1 | 1 | 0 | 0 |
| 0 | 0 | 1 | 1 | 1 | 1 |
| 0 | 1 | 0 | 0 | 0 | 0 |
| 0 | 1 | 0 | 0 | 1 | 0 |
| 0 | 1 | 0 | 1 | 0 | 0 |
| 0 | 1 | 0 | 1 | 1 | 0 |
| 0 | 1 | 1 | 0 | 0 | 0 |
| 0 | 1 | 1 | 0 | 1 | 1 |
| 0 | 1 | 1 | 1 | 0 | 1 |
| 0 | 1 | 1 | 1 | 1 | 1 |
| 1 | 0 | 0 | 0 | 0 | 0 |
| 1 | 0 | 0 | 0 | 1 | 0 |
| 1 | 0 | 0 | 1 | 0 | 0 |
| 1 | 0 | 0 | 1 | 1 | 1 |
| 1 | 0 | 1 | 0 | 0 | 0 |
| 1 | 0 | 1 | 0 | 1 | 1 |
| 1 | 0 | 1 | 1 | 0 | 1 |
| 1 | 0 | 1 | 1 | 1 | 1 |
| 1 | 1 | 0 | 0 | 0 | 0 |
| 1 | 1 | 0 | 0 | 1 | 1 |
| 1 | 1 | 0 | 1 | 0 | 1 |
| 1 | 1 | 0 | 1 | 1 | 1 |
| 1 | 1 | 1 | 0 | 0 | 1 |
| 1 | 1 | 1 | 0 | 1 | 1 |
| 1 | 1 | 1 | 1 | 0 | 1 |
| 1 | 1 | 1 | 1 | 0 | 1 |

Figure 1F:
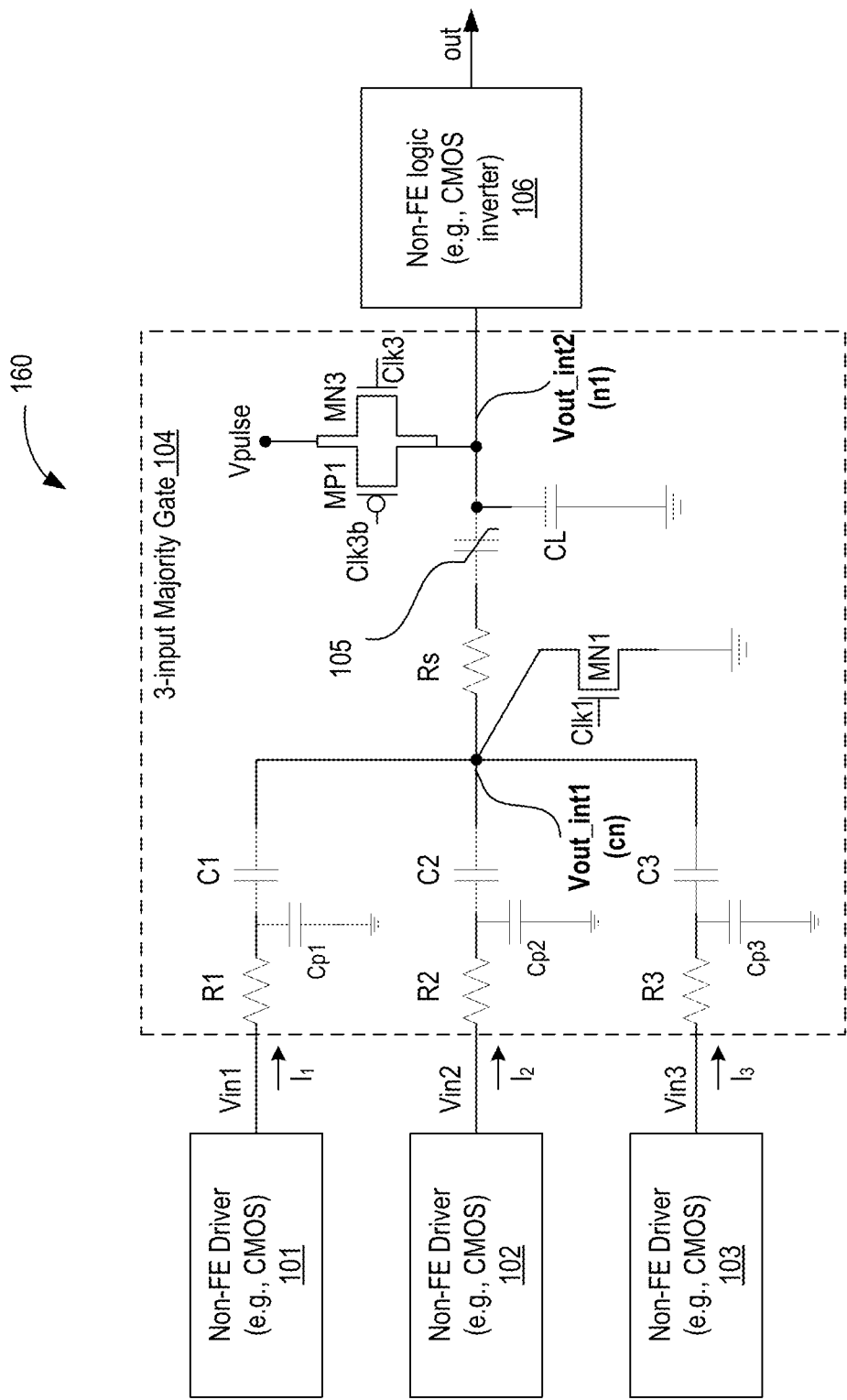
FIG. 1F illustrates a logic gate with a 3-input majority gate with pass-gate based resetting mechanism, in accordance with some embodiments.
Figure 1G:
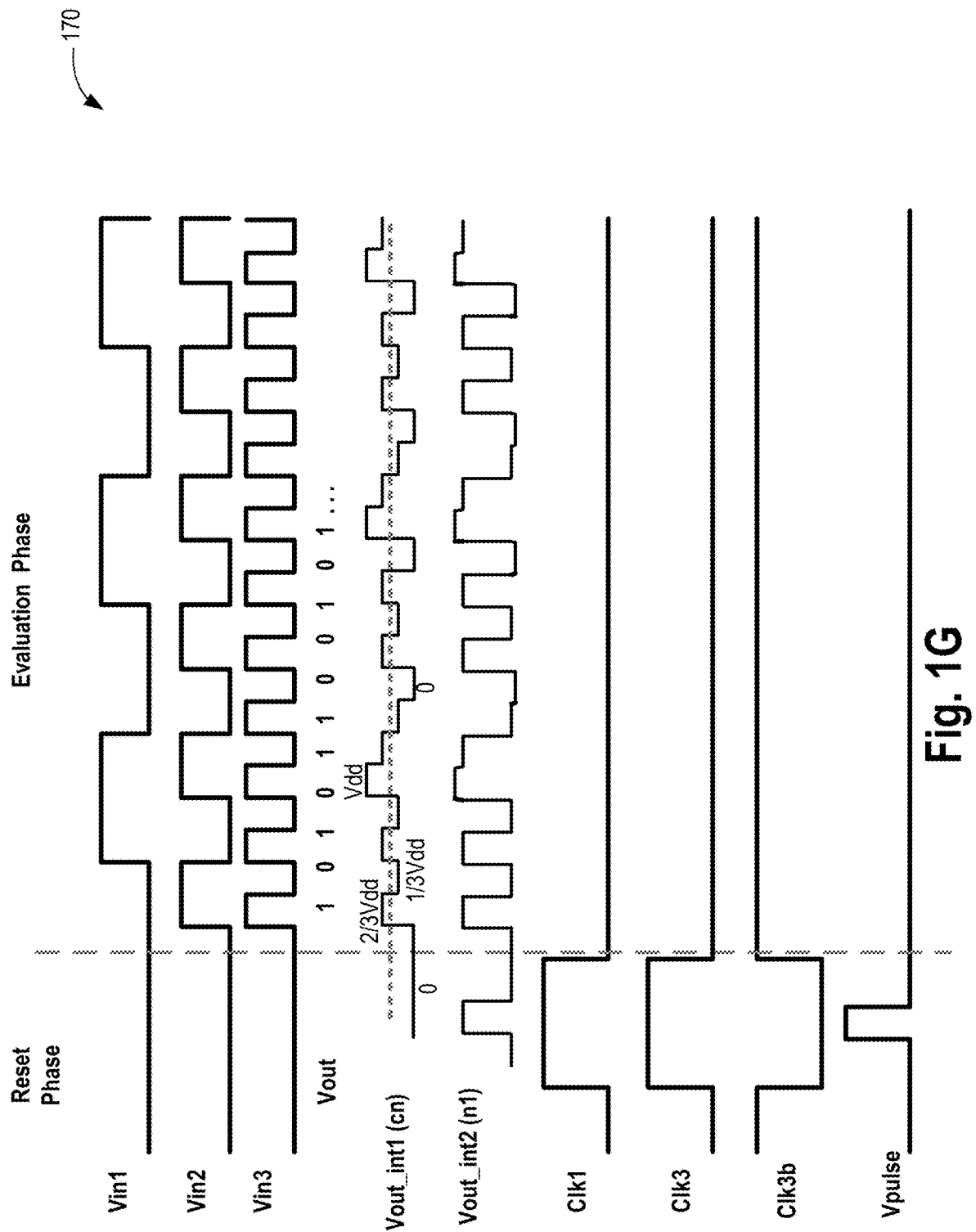
FIG. 1G illustrates a timing diagram for resetting the ferroelectric capacitor for majority gate of FIG. 1F, in accordance with some embodiments.

FIG. 1F illustrates logic gate 180 with a 3-input majority gate with pass-gate based resetting mechanism, in accordance with some embodiments. Logic gate 160 is similar to logic gate 100 but for the reset mechanism to reset the terminals of non-linear polar capacitor 105. Here, pull-down transistor MN2 is removed and a pass-gate comprising p-type transistor MP1 and n-type transistor MN3 are coupled to Vout_int2 node. In some embodiments, transistor MN3 is controlled by Clk3 while transistor MP1 is controlled by Clk3*b*, where Clk3*b* is an inverse of Clk3. In some embodiments, Vpulse passes through the pass-gate to Vout_int2 when Clk1 and Clk3 are asserted and before Clk1 and Clk3 are de-asserted. Vpulse is generated during a reset phase, and is de-asserted during the evaluation phase as illustrated by FIG. 1G. FIG. 1G illustrates timing diagram 170 for resetting the ferroelectric capacitor for majority gate of FIG. 1F, in accordance with some embodiments.

During reset phase, node Vout_Int1 is first reset or discharged to ground by asserting a Clk1 pulse. In the same phase, transistors MP3 and MP1 are turned on, and Vpulse is applied to node Vout_Int2.

Here Vpulse eases out the relative timing control from the perspective of signal generation. Vpulse also minimizes charge injection on Vout_int2 node due to differential nature of switching that happens on the pass gate. Note, the pass-gate reduces the charge injection due to charge sharing as transistors MP1 and MN3 of the pass-gate approximately cancel the charge injection at Vout_int2 node due to switching event on the pass-gate. The gray dotted horizontal line shown for Vout_int1 (*cn*) node indicates where the Vc of FE capacitor 105 will create switching action. For majority gate design, in some embodiments, this gray dotted horizontal line is positioned close to Vdd/2 (e.g., Vc=Vdd/2), where Vdd is logic high value.

In some cases, when all inputs are zeros (e.g., Vin1=Vin2=Vin3=0 or Vss), which is referred to 3L, then the voltage on Vout_int1 and/or Vout_int1 may fall below Vss (or ground) level. The same may occur when all inputs are ones (e.g., Vin1=Vin2=Vin3=1 or Vss), which is referred to 3H, where the voltage on Vout_int1 and/or Vout_int1 may rise above Vdd (or supply) level. This, however, may depend on the exact amount of charge injection on the node cn at time 0 after assertion of the input signals. So, all three inputs being logic low (3L) translates into a slightly different levels compared to two inputs being logic low (2L). Here, 3H refers to all three inputs being high, 2H refers to two inputs being high and one input being low, and 1H refers to one input being high and two inputs being low. The same explanation is used for nomenclature 3L, 2L, and 1L. In the 1H case, the voltage on node cn and n1 may be slightly higher than ground. The same is the case with 3H which translates into slightly higher voltage level on nodes cn and/or n1 than in 2H and 1L cases.

Figure 1H:
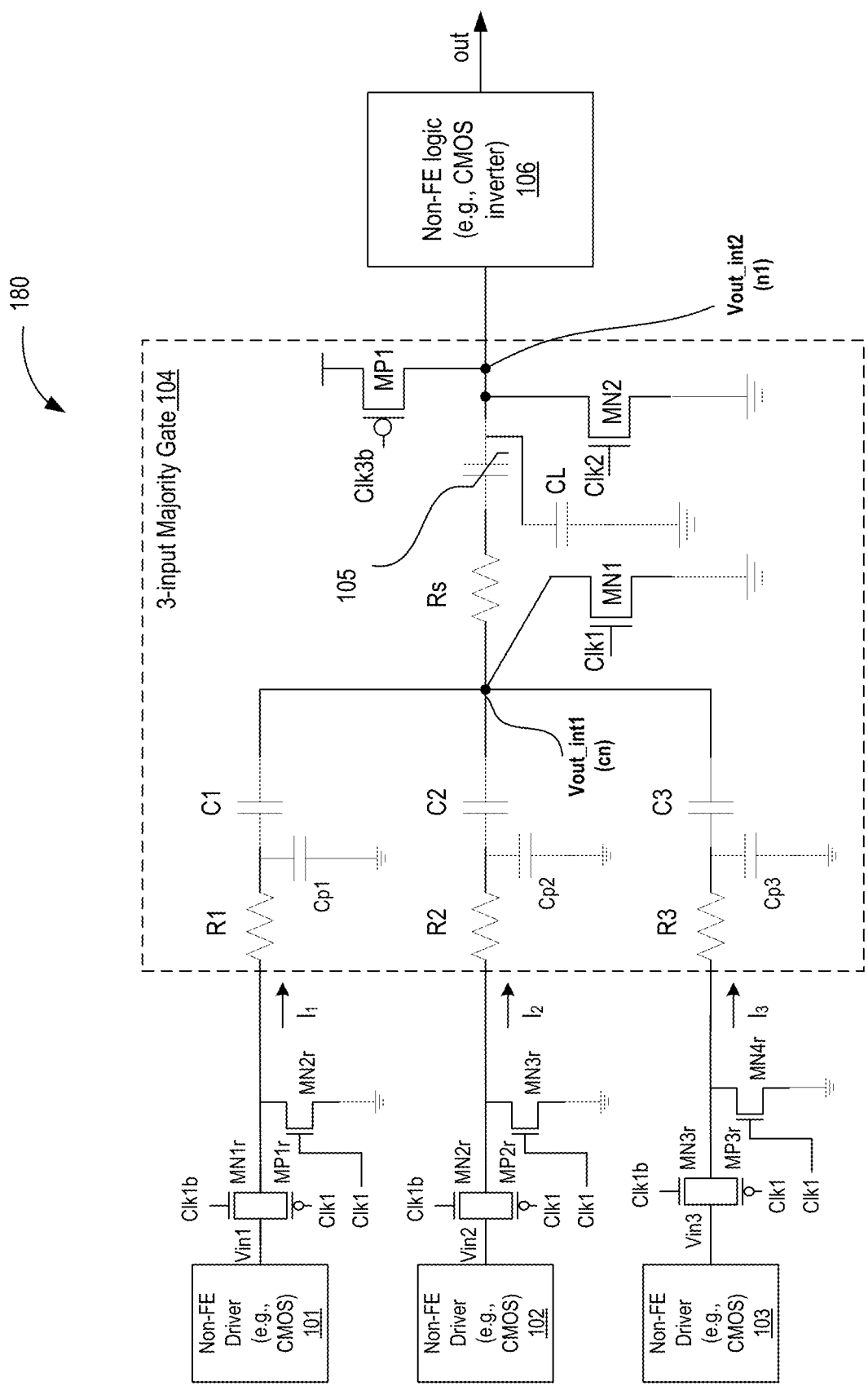
FIG. 1H illustrates a logic gate with a 3-input majority gate with input resetting mechanism, in accordance with some embodiments.

FIG. 1H illustrates logic gate 180 with a 3-input majority gate with input resetting mechanism, in accordance with some embodiments. Compared to the reset mechanisms described with reference to FIGS. 1A-B, and FIGS. E-G, here the inputs (e.g., Vin1, Vin2, Vin3) are blocked from propagating during reset phase. Logic gate 180 is similar to logic gate 100 but for the determinism of input voltages during reset of capacitor 105.

In some embodiments, for reset mechanisms of FIGS. 1A-B, and FIGS. E-G logic that generates input signals (e.g., Vin1 through Vin5) is aware of the reset timing, and as such ensures to send the right input signals (0 V in this illustration) for processing when capacitor 105 is being reset. Generating the input signals at predetermined voltage levels (e.g., 0 V) ensures predetermined voltage (e.g., 0V) across the linear capacitors (e.g., C1, C2, C3). When such predetermined input signals are generated, pass-gates on the input signal nodes can be removed to save area and cost.

In some other embodiments for multiple stages of these majority gates between a logic cluster, the reset sequencing can be controlled from input vectors to correctly create the correct voltage levels during the reset phase at each one of the stages. In some embodiment, a logic gate is provided at the input (e.g., Vin) such that correct voltage level at all stages are driving the right logic. For example, a NAND gate, with one of the inputs being reset signal, and other the logic level (e.g., Vin1), that ensure during reset phase the correct voltage level is applied at input of each one of the stages. In another example, the output of each logic is conditioned during reset to cause the subsequent logic (e.g., majority gate logic) to receive the correct input voltage level during reset. In one such example, non-FE logic 106 comprises a NAND gate with one of its input being a reset signal, and other the logic level (e.g., coupled to Vout_int2), that ensures during reset phase the correct voltage level is propagated to the input of the next or subsequent majority gate stage.

In some embodiments, a first pass-gate is coupled to first capacitor C1 and driver that generates first input Vin1. The first pass-gate comprises p-type transistor MP1r controllable by Clk1 and n-type transistor MN1r controllable by Clk1b. The first pass-gate blocks the propagation of Vin1 while pull-down transistor MN2r can set the input to capacitor C1 to ground via Clk1. In some embodiments, a second pass-gate is coupled to second capacitor C2 and driver that generates the second input Vin2. The second pass-gate comprises p-type transistor MP2r controllable by Clk1 and n-type transistor MN2r controllable by Clk1b. The second pass-gate blocks the propagation of Vin2 while pull-down transistor MN3r can set the input to capacitor C2 to ground via Clk1. In some embodiments, a third pass-gate is coupled to third capacitor C3 and driver that generates the third input Vin3. The third pass-gate comprises p-type transistor MP3r controllable by Clk1 and n-type transistor MN3r controllable by Clk1b. The third pass-gate blocks the propagation of Vin3 while pull-down transistor MN4r can set the input to capacitor C3 to ground via Clk1. The same technique is applied to other inputs.

Figure 1I:
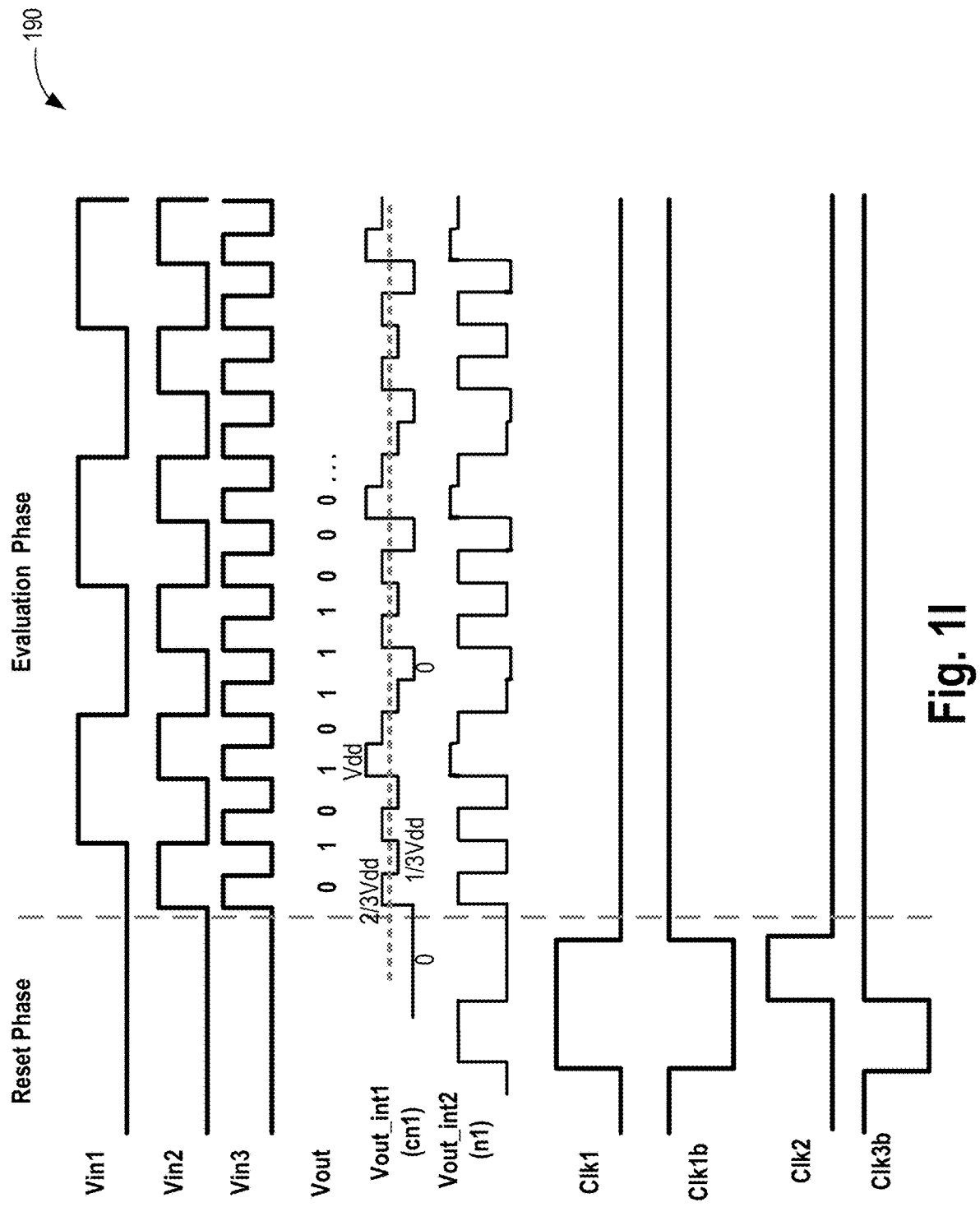
FIG. 1I illustrates a timing diagram for resetting the ferroelectric capacitor for majority gate of FIG. 1H, in accordance with some embodiments.

FIG. 1I illustrates timing diagram 190 for resetting the ferroelectric capacitor for majority gate of FIG. 1H, in accordance with some embodiments. During reset phase, Clk1 is asserted (and Clkb is de-asserted) to block the input voltages and to set the input to capacitor C1, C2, and C3 to ground. Assertion of Clk1 also discharges Vout_int1. As such, voltages on both terminals of input capacitors C1, C2, and C3 are discharged. Clk3b is initially (during reset phase) de-asserted to turn on MP1 to pre-charge Vout_int2. Thereafter, Clk2 is asserted to discharge Vout_int2.

The reset mechanism can be described in terms of two sequence of pulses. The first sequence of pulses is to create the right field across the FE capacitor 105 to initialize it in correct state for operation, while the second sequence of pulses ensures that all the nodes are initialized to 0 state, with all the linear caps (e.g., C1, C2, C3) having 0 V across them. The exact sequence also factors in glitch-less transition to minimize charge injection on high impedance nodes, and ensures that the ferroelectric device 105 does not see a transient due to reset pulsing that will compromise the initial programmed state for FE device 105.

The reset mechanism of various embodiments can also be described in terms of four phases. In the first phase (phase 1), linear capacitors (C1, C2, C3) are initialized to zero state using Clk1 (e.g., by asserting Clk1) and input conditioning (e.g., setting the inputs Vin1, Vin2, Vin3 to zero). In the second phase (phase 2), FE capacitor 105 continued to be initialized using Clk3b (e.g., de-asserting Clkb3) while keeping Clk1 high (e.g., Clk1 remains asserted). In the third phase (phase 3), Vout_int2 node and the dielectric component of FE capacitor 105 is initialized to zero state by de-asserting Clk2, asserting Clk3b, and while keeping Clk1 high (e.g., Clk1 remains asserted). In the fourth phase (phase 4), the reset switches are deactivated. For example, transistors MN1r, MP1r (and other pass-gate switches at the inputs) are turned on, MN2r (and other pull-down transistors) on the input nodes (e.g., Vin1, Vin2) are turned off, pull-down transistors MN1 and MN2 are disabled or turned off, pull-up transistors MP1 is disabled or turned off, Vpulse pass-gate having transistors MP1 and MN3 are disabled.

While the embodiments here are described with reference to resetting the FE device 105 to ground and/or resetting the two terminals of non-ferroelectric linear capacitors (C1, C2, C3) to ground, the resetting voltage can be different voltage other than ground. For example, when input signals (e.g., Vin1, Vin2, Vin3) toggle between a positive supply level and a negative supply level, then the two terminals of FE device 105 and/or the two terminals of non-ferroelectric linear capacitors (C1, C2, C3) are reset to the negative supply rail. For example, the definition of logic low and logic high to control the various reset devices changes to be positive and negative, respectively. So, if earlier rails were 0 V and Vdd and now they are negative to positive rails, the 0 V maps to negative and Vdd maps to positive.

Figure 1J:
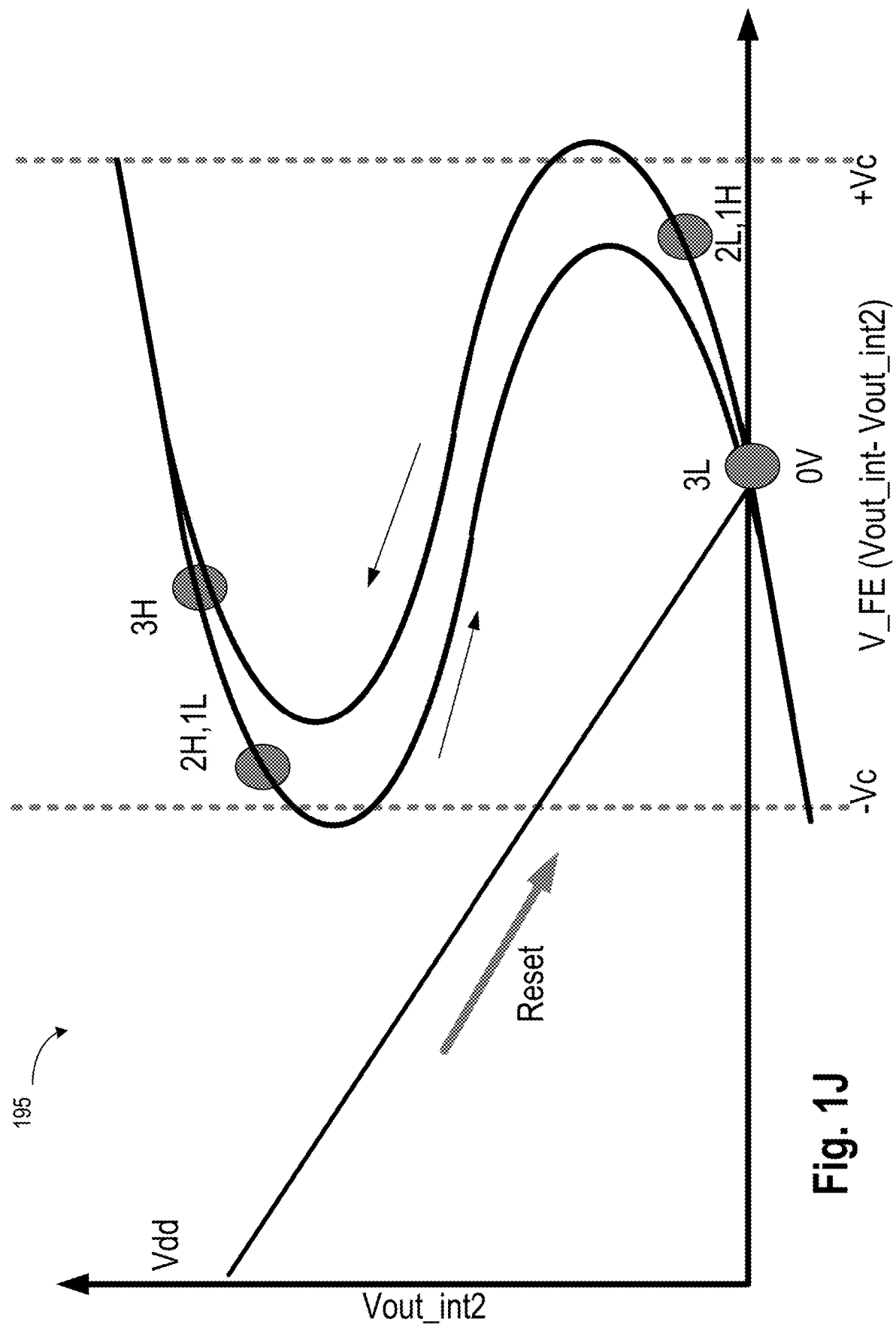
FIG. 1J illustrates plot showing the voltage on node Vout_int2 relating to the behavior of ferroelectric capacitor, in accordance with some embodiments.

FIG. 1J illustrates plot 195 showing the voltage on node Vout_int2 relating to the behavior of FE capacitor 105, in accordance with some embodiments. In this case, FE capacitor 105 stays within the window of Vc voltage drop across FE capacitor 105, but switching helps to generate different voltages on Vout_int2. For example, at time 0 during reset (when Clk1 is asserted and other signals such as Clk1b, Clk2, Clk3b, and Vpulse behave according to FIG. 1G and FIG. 1I), large reset field puts FE capacitor 105 in low state, and then FE capacitor 105 bounces between +Vc, and −Vc.

Figure 2A:
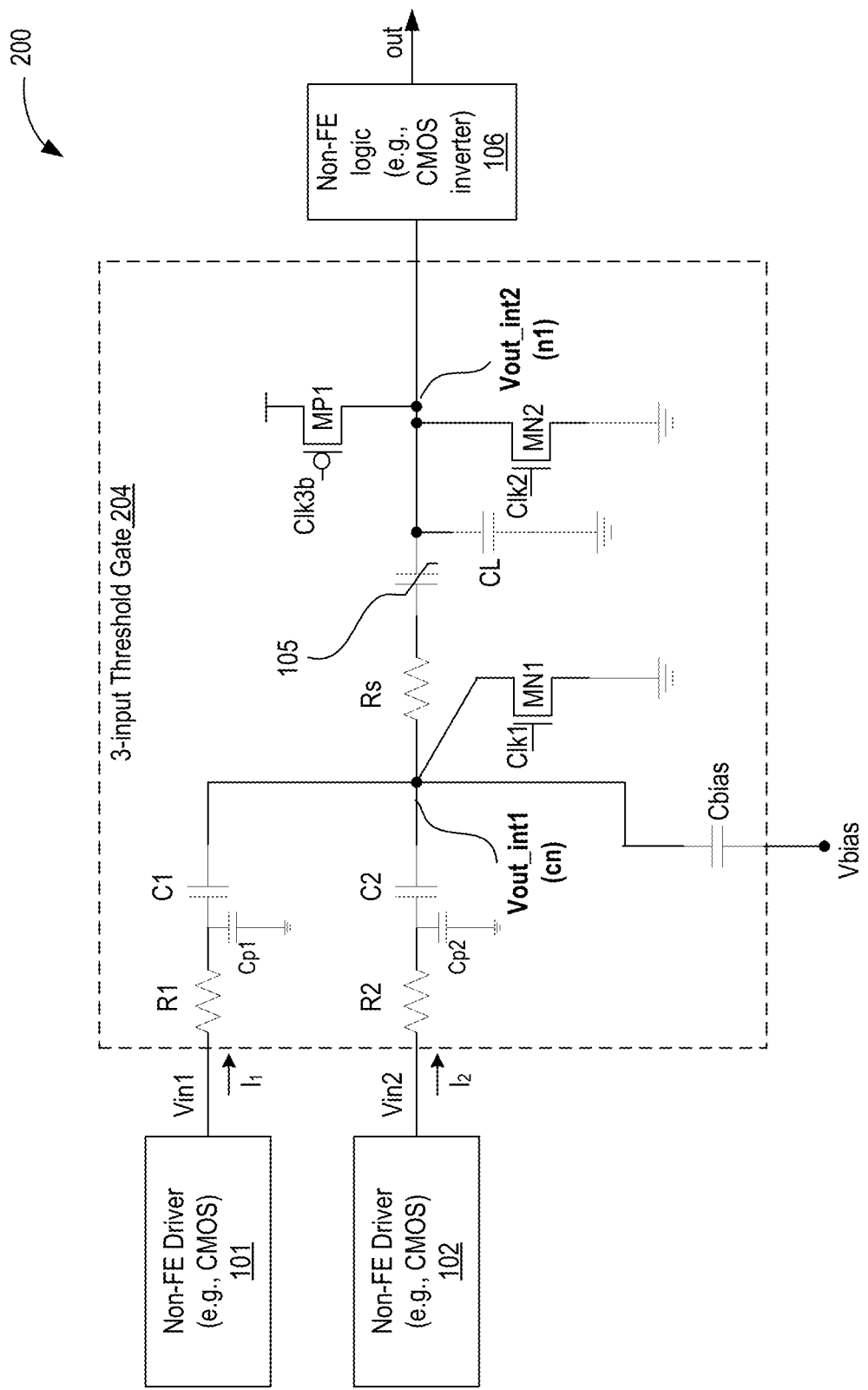
FIG. 2A illustrates a logic gate with a 3-input threshold gate which can operate as an AND or OR gate, in accordance with some embodiments.

FIG. 2A illustrates logic gate 200 with 3-input threshold gate 204 which can operate as a AND or OR gate, in accordance with some embodiments. Logic gate 200 is similar to logic gate 100 but for removing the third input Vin and adding an input Vbias. This additional input bias makes the logic gate a threshold gate 204. Threshold gate 204 is referred to as a 3-input threshold gate because of the three inputs Vin1, Vin2, and Vbias. It can also be referred to as 2-input threshold gate if the Vbias input is not counted as a separate input. In various embodiments, threshold gate 204 comprises an additional capacitor Cbias that has one terminal coupled to node cn and another terminal coupled to Vbias. The material for capacitor Cbias can be same as the material for capacitors C1, C2, and C3. For example, capacitor Cbias comprises non-ferroelectric material.

Vbias can be positive or negative voltage depending on the desired logic function of threshold gate 204. Any suitable source can generate Vbias. For example, a bandgap reference generator, a voltage divider such as a resistor divider, a digital to analog converter (DAC), etc. can generate Vbias. Vbias can be fixed or programmable (or adjustable). For example, Vbias can be adjusted by hardware (e.g., fuses, register), or software (e.g., operating system). In some embodiments, when Vbias is positive, the majority function on node cn is an OR function. For example, the function at node cn is OR(Vin1, Vin2, 0). In some embodiments, when Vbias is negative, the majority function on node cn is an AND function. For example, the function at node cn is AND(Vin1, Vin2, 1). Table 2 and Table 3 summarizes the function of threshold gate 206.

TABLE 3

| Vin1 | Vin2 | Vbias | cn OR(Vin1, Vin2, Vbias) |
|---|---|---|---|
| 0 | 0 | Positive or logic 1 | 0 |
| 0 | 1 | Positive or logic 1 | 1 |
| 1 | 0 | Positive or logic 1 | 1 |
| 1 | 1 | Positive or logic 1 | 1 |

TABLE 4

| Vin1 | Vin2 | Vbias | cn AND(Vin1, Vin2, Vbias) |
|---|---|---|---|
| 0 | 0 | Negative or logic 0 | 0 |
| 0 | 1 | Negative or logic 0 | 0 |
| 1 | 0 | Negative or logic 0 | 0 |
| 1 | 1 | Negative or logic 0 | 1 |

Compared to transitional CMOS AND logic gate and OR logic gate, here the AND function and OR function are performed by a network of capacitors. The output of the majority or threshold function on node cn is then stored in the non-linear polar capacitor 105. This capacitor provides the final state of the logic in a non-volatile form. As such, the logic gate of various embodiments describes a non-volatile multi-input AND or OR gate with one or two transistors for pre-discharging or pre-charging nodes cn and n1. The silicon area of the AND or OR gates of various embodiments is orders of magnitude smaller than traditional AND or OR gates. While FIG. 2A illustrates a 3-input threshold gate, the same concept can be extended to more than 3 inputs to make an N-input threshold gate, where N is greater than 2 and an odd number. The reset mechanism of FIG. 2A is similar to the one described with reference to FIG. 1A.

Figure 2B:
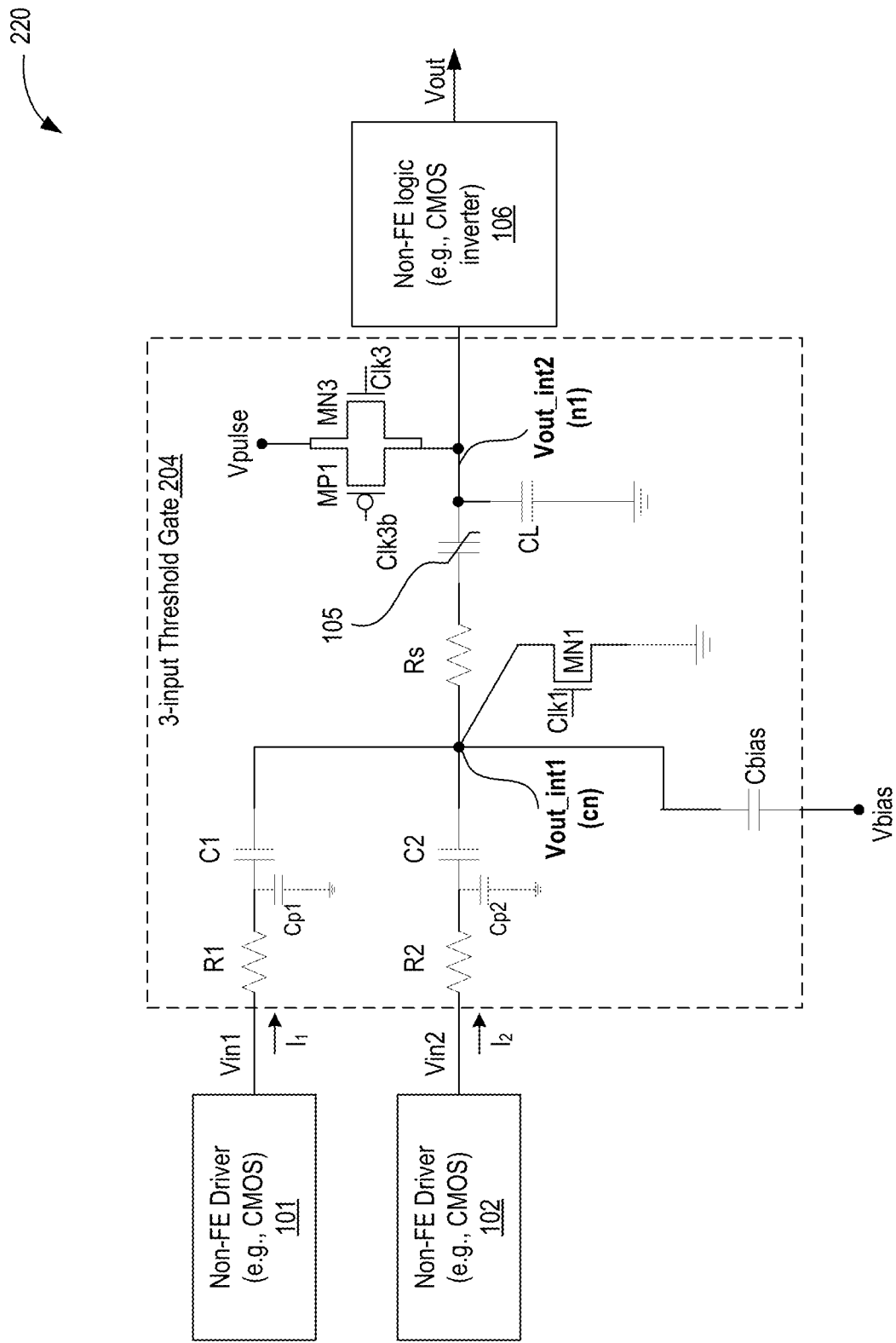
FIG. 2B illustrates a logic gate with a 3-input threshold gate, with pass-gate based reset mechanism, where the 3-input threshold gate can operate as a AND or OR gate, in accordance with some embodiments.

FIG. 2B illustrates logic gate 220 with a 3-input threshold gate, with pass-gate based reset mechanism, where the 3-input threshold gate can operate as a AND or OR gate, in accordance with some embodiments. Logic 220 is similar to logic 200 but for the reset mechanism. The reset mechanism of FIG. 2B is similar to the one described with reference to FIG. 1F.

Figure 2C:
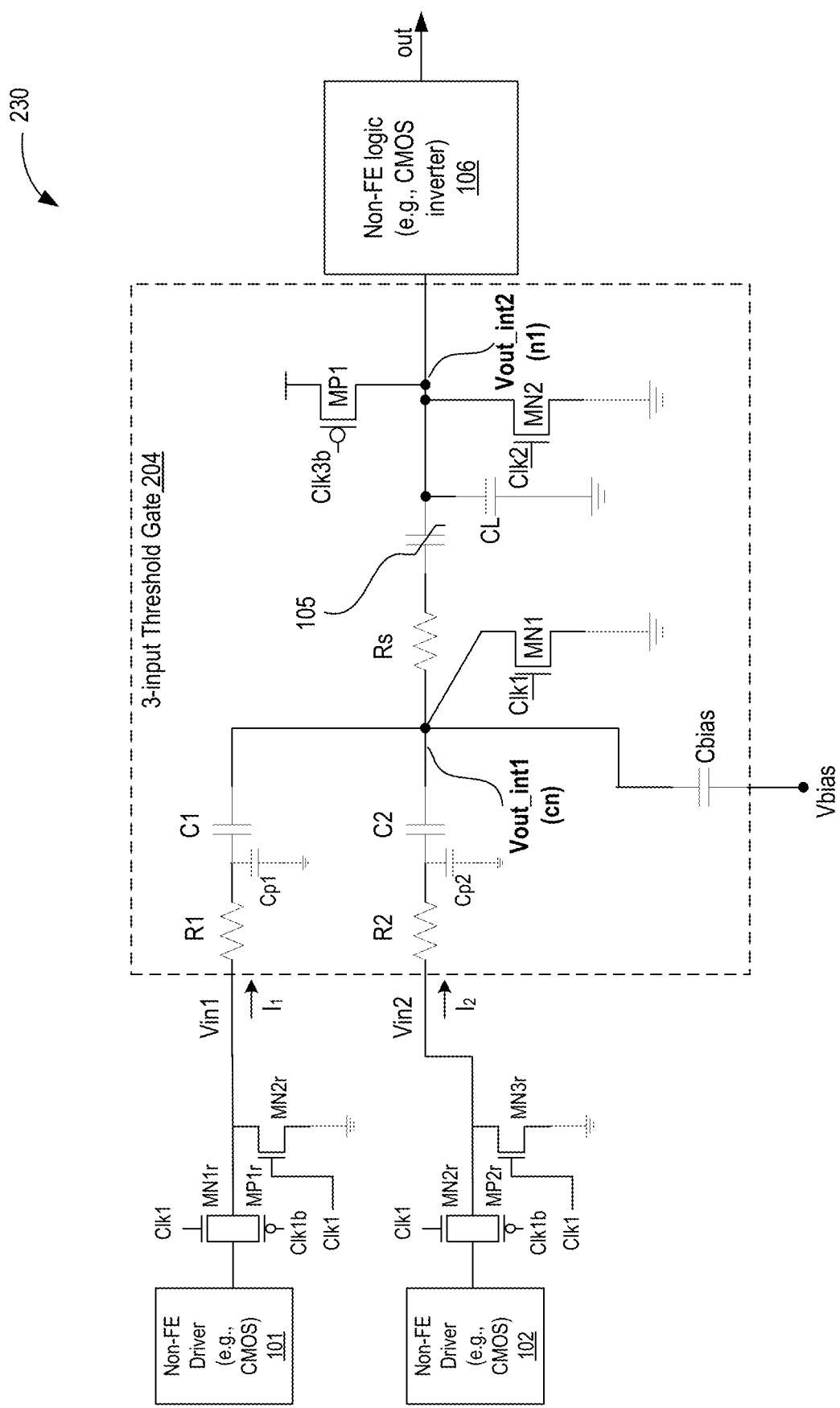
FIG. 2C illustrates a logic gate with a 3-input threshold gate, with input resetting mechanism, where the 3-input threshold gate can operate as a AND or OR gate, in accordance with some embodiments.

FIG. 2C illustrates logic gate 230 with a 3-input threshold gate, with input resetting mechanism, where the 3-input threshold gate can operate as a AND or OR gate, in accordance with some embodiments. Logic 230 is similar to logic 200 but for the reset mechanism. The reset mechanism of FIG. 2C is similar to the one described with reference to FIG. 1H.

Figure 2D:
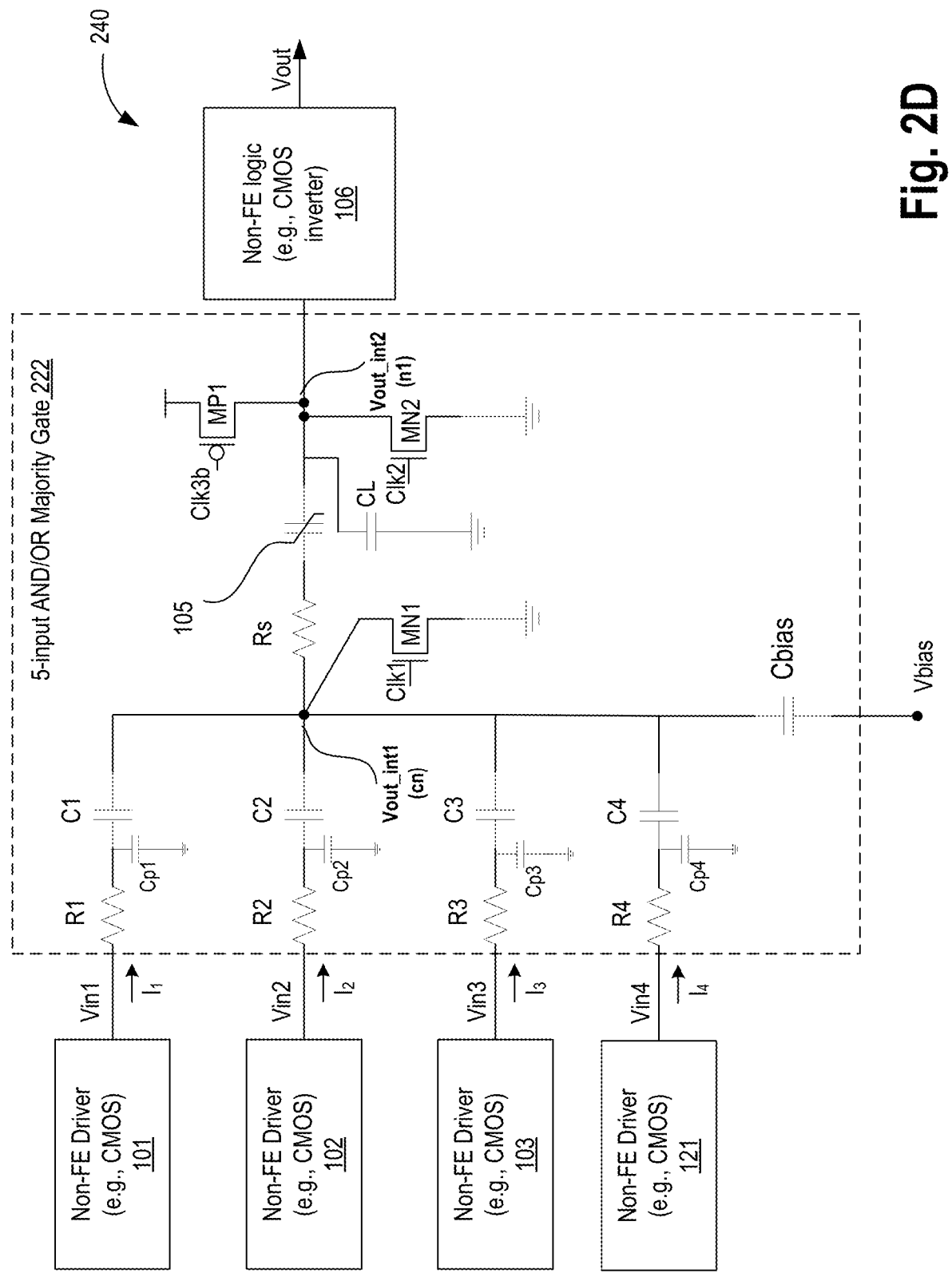
FIG. 2D illustrates a logic gate with a 5-input threshold gate which can operate as an AND or OR gate, in accordance with some embodiments.

FIG. 2D illustrates logic gate 240 with a 5-input AND/OR majority gate 222 which can operate as an AND or OR gate with majority function, in accordance with some embodiments. For purposes of explaining the 5-input AND/OR majority gate 222, consider the capacitances to be Cbias=C3=C4=C/2, C1=C, and C2=C with corresponding input potentials: Vbias=$V_B$, Vin3=$V_A$, Vin4=$V_B$, Vin1=$V_C$, and Vin2=$V_s$, where $V_B=-V_o$ is a constant bias voltage and the rest are binary input voltages of $+/-V_o$ for some yet to be determined $V_o$. Gate 222 has a function of (A AND B, C, S). Here, the AND gate function is absorbed into the majority gate at the cost of a bias voltage.

If both $V_S=V_C=+V_o$, then regardless of $V_A$, $V_B$, it is desired that the output is greater than $V_c$ in magnitude, the coercive voltage. For $V_A=V_B=-V_o$, the average potential is expressed as:

$$V_F = \frac{C \cdot 2V_o - C/2 \cdot 2V_o - V_o \cdot C/2}{3.5C} \quad (11)$$

$$V_F = \frac{1}{7}V_o > V_c \cdot 4 \quad (12)$$

If $V_A=V_B=+V_o$ and $V_c=V_d=-V_o$, the following is achieved:

$$V_F = \frac{-C \cdot 2V_o + C/2 \cdot 2V_o - V_o \cdot C/2}{3.5C} \quad (13)$$

$$V_F = -\frac{1}{7}V_o < -V_c \cdot 4 \quad (14)$$

To check the equivalence to an AND operation, consider $V_A=-V_B=V_o$, then $$V_F = \frac{V_A + V_B - V_o}{3.5C} \quad (15)$$

$$V_F \in \left\{-\frac{3}{7}V_o, -\frac{1}{7}V_o, \frac{1}{7}V_o\right\} \quad (16)$$

As designed, merely when $V_A=V_B=+V_o$, gate 222 produces a positive output. It is further observed that all outputs are greater than $V_C$ by setting $V_o>7V_c$, in accordance with some embodiments.

Here, AND function is performed between Vin3 and Vin4, and the resulting output is used to perform majority function with Vin1 and Vin2, which is describe as: Majority (Vin3 AND Vin4, Vin1, Vin2). Table 4 illustrates the truth table of AND majority gate 222. Applying a negative voltage on Vbias can be akin to applying an input signal logic low as well.

TABLE 5

| Vin1 | Vin2 | Vin3 | Vin4 | Vbias AND Function | cn Majority of AND (Vin1, Vin2) Vin3, Vin4, Vbias |
|---|---|---|---|---|---|
| 0 | 0 | 0 | 0 | negative | 0 |
| 0 | 0 | 0 | 1 | negative | 0 |
| 0 | 0 | 1 | 0 | negative | 0 |
| 0 | 0 | 1 | 1 | negative | 0 |
| 0 | 1 | 0 | 0 | negative | 0 |
| 0 | 1 | 0 | 1 | negative | 0 |
| 0 | 1 | 1 | 0 | negative | 0 |
| 0 | 1 | 1 | 1 | negative | 1 |
| 1 | 0 | 0 | 0 | negative | 0 |
| 1 | 0 | 0 | 1 | negative | 0 |
| 1 | 0 | 1 | 0 | negative | 0 |
| 1 | 0 | 1 | 1 | negative | 1 |
| 1 | 1 | 0 | 0 | negative | 1 |
| 1 | 1 | 0 | 1 | negative | 1 |
| 1 | 1 | 1 | 0 | negative | 1 |
| 1 | 1 | 1 | 1 | negative | 1 |

In the OR majority function case, OR function is performed between Vin3 and Vin4, and the resulting output is used to perform majority function with Vin1 and Vin2, which is describe as: Majority (Vin3 OR Vin4, Vin1, Vin2). Table 5 illustrates the truth table of OR majority gate 222.

Applying a positive voltage on Vbias can be akin to applying an input signal logic high as well.

TABLE 6

| Vin1 | Vin2 | Vin3 | Vin4 | Vbias OR Function | cn Majority of OR(Vin3, Vin4) Vin3, Vin4, Vbias |
|---|---|---|---|---|---|
| 0 | 0 | 0 | 0 | positive | 0 |
| 0 | 0 | 0 | 1 | positive | 0 |
| 0 | 0 | 1 | 0 | positive | 0 |
| 0 | 0 | 1 | 1 | positive | 0 |
| 0 | 1 | 0 | 0 | positive | 0 |
| 0 | 1 | 0 | 1 | positive | 1 |
| 0 | 1 | 1 | 0 | positive | 1 |
| 0 | 1 | 1 | 1 | positive | 1 |
| 1 | 0 | 0 | 0 | positive | 0 |
| 1 | 0 | 0 | 1 | positive | 1 |
| 1 | 0 | 1 | 0 | positive | 1 |
| 1 | 0 | 1 | 1 | positive | 1 |
| 1 | 1 | 0 | 0 | positive | 1 |
| 1 | 1 | 0 | 1 | positive | 1 |
| 1 | 1 | 1 | 0 | positive | 1 |
| 1 | 1 | 1 | 1 | positive | 1 |

Logic gate 222 can perform AND majority and OR majority functions depending on the bias value for Vbias. Here, merely two transistors (MN1 and MN2) that can be condensed to a single transistor for pre-charging or pre-discharging nodes cn and n1, are used while a complex function of AND majority and OR majority are realized.

In various embodiments, majority gate 222 coupled to inverter 106 forms a minority threshold gate (majority-invert threshold), resulting in a universal logic gate.

Figure 3A:
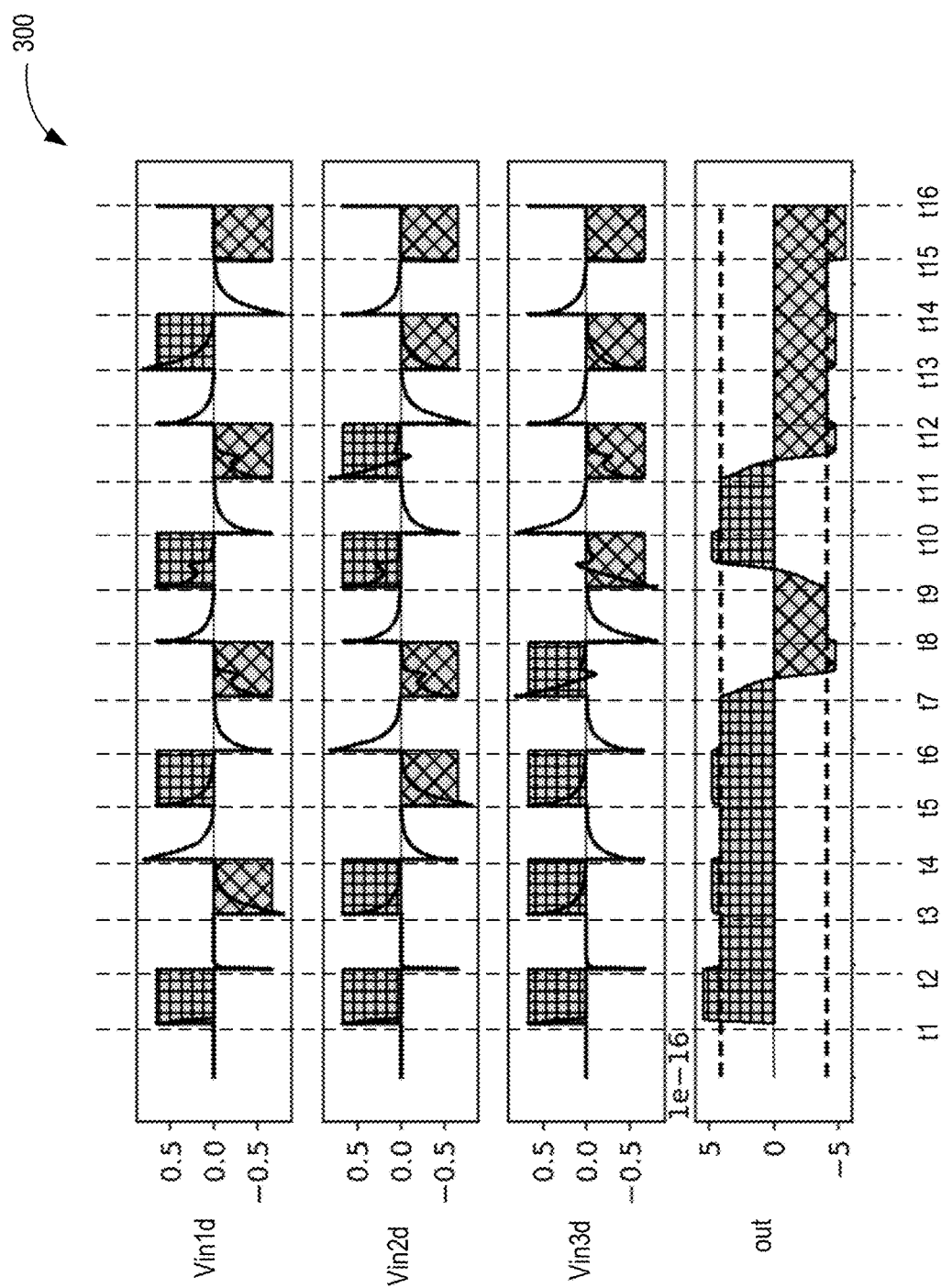
FIG. 3A illustrates waveforms showing operation of 3-input majority gate of FIG. 1B, in accordance with some embodiments.
Figure 3B:
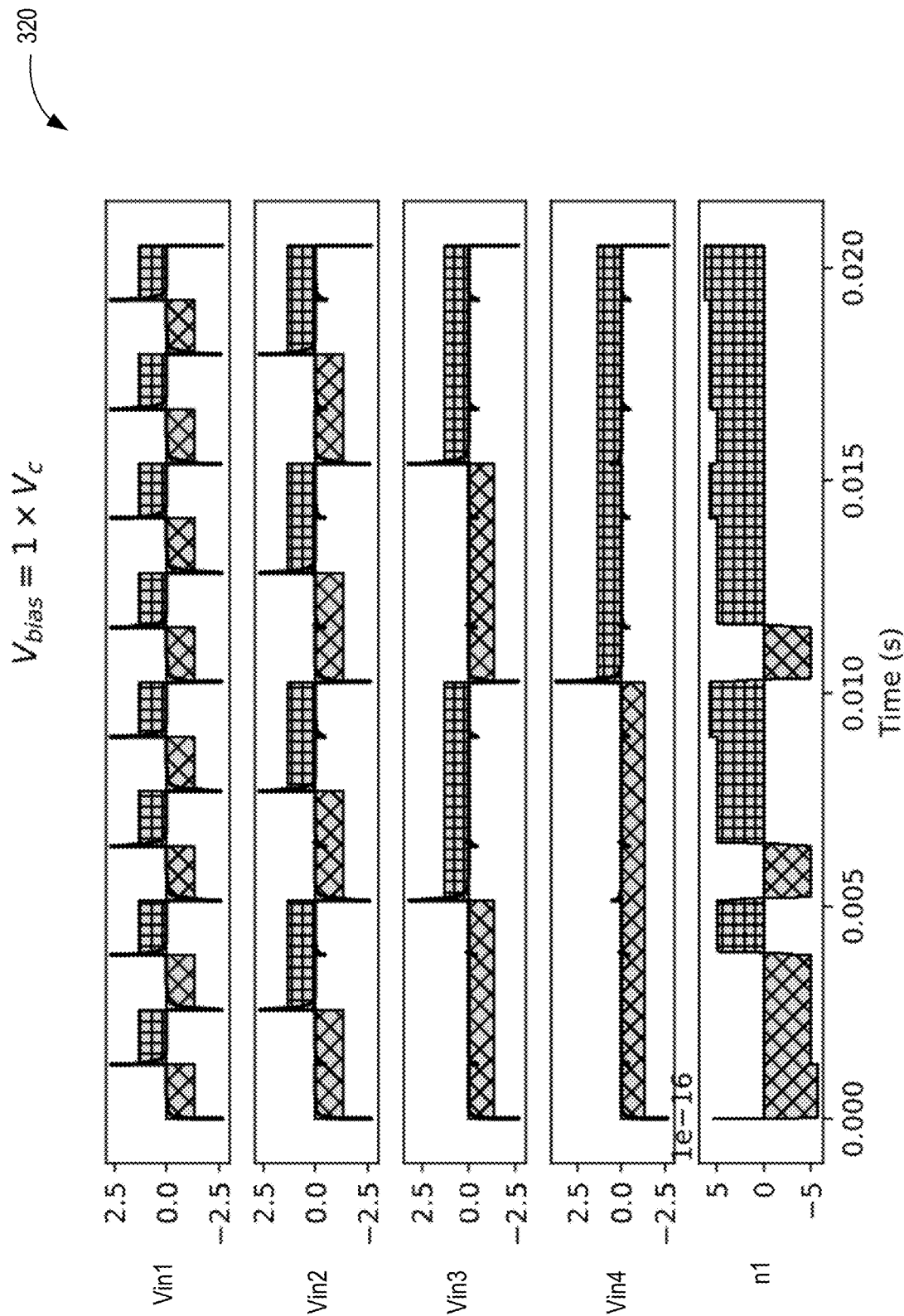
FIGS. 3B-E illustrate waveforms showing operation of 5-input threshold gate with different Vbias values, respectively, in accordance with some embodiments.
Figure 3C:
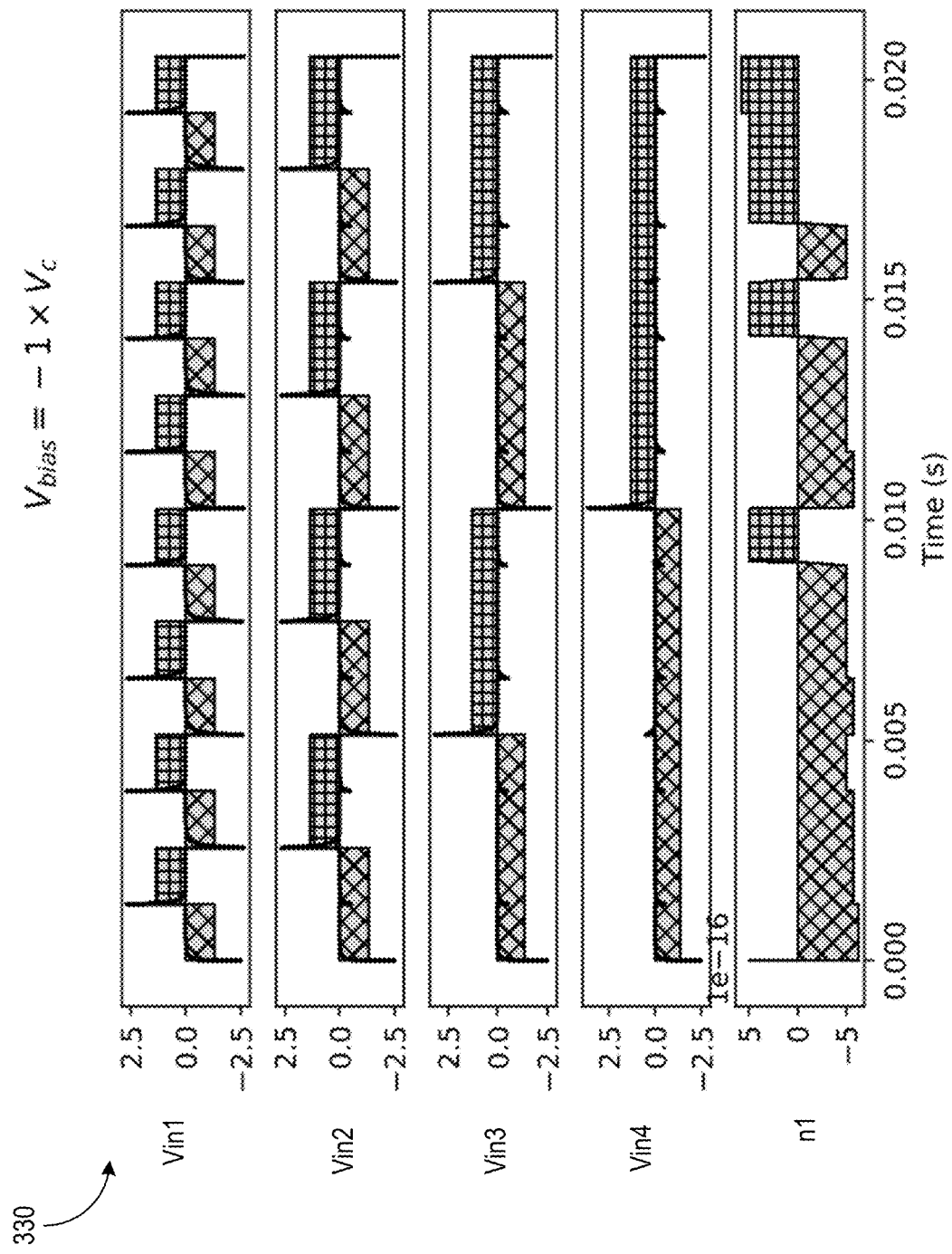
Figure 3D:
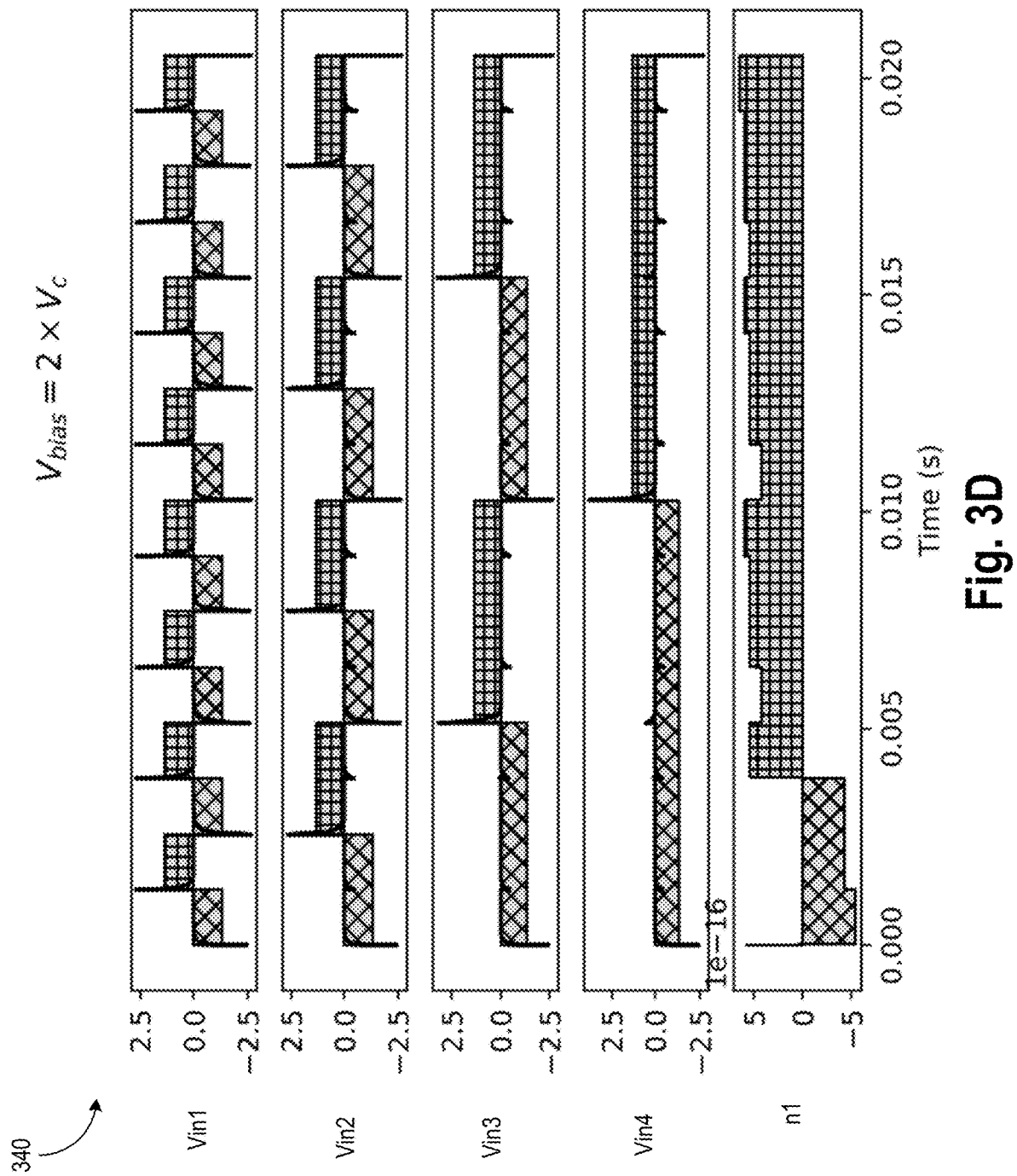
Figure 3E:
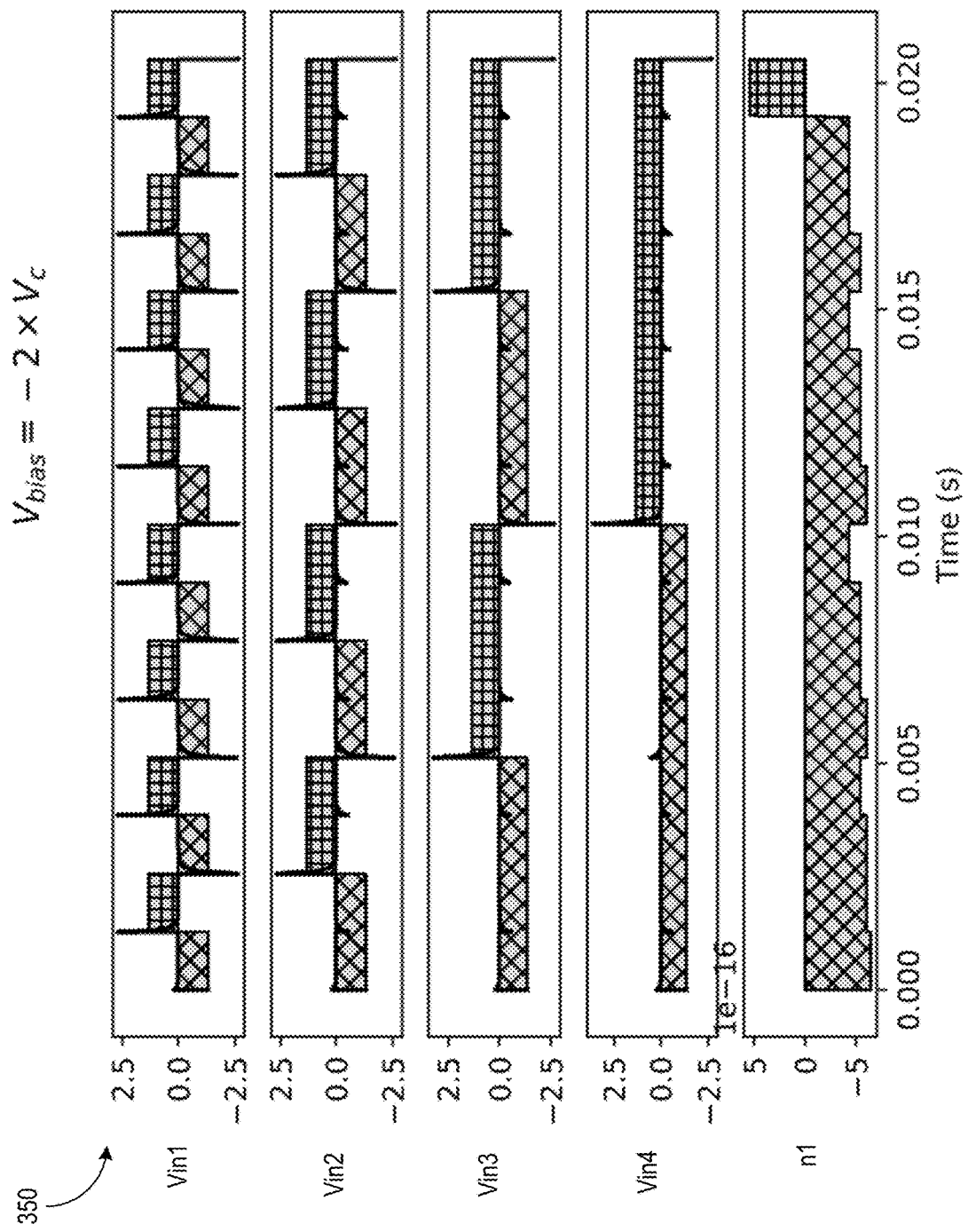

FIG. 3A illustrates waveform 300 showing operation of 3-input majority gate of FIG. 1B in accordance with some embodiments. FIG. 3A illustrates a majority function of inputs Vin1, Vin2, and Vin3.

FIGS. 3B-E illustrate waveforms 320, 330, 340, and 350 showing operation of 5-input threshold gate with different Vbias values, respectively, in accordance with some embodiments.

Figure 4:
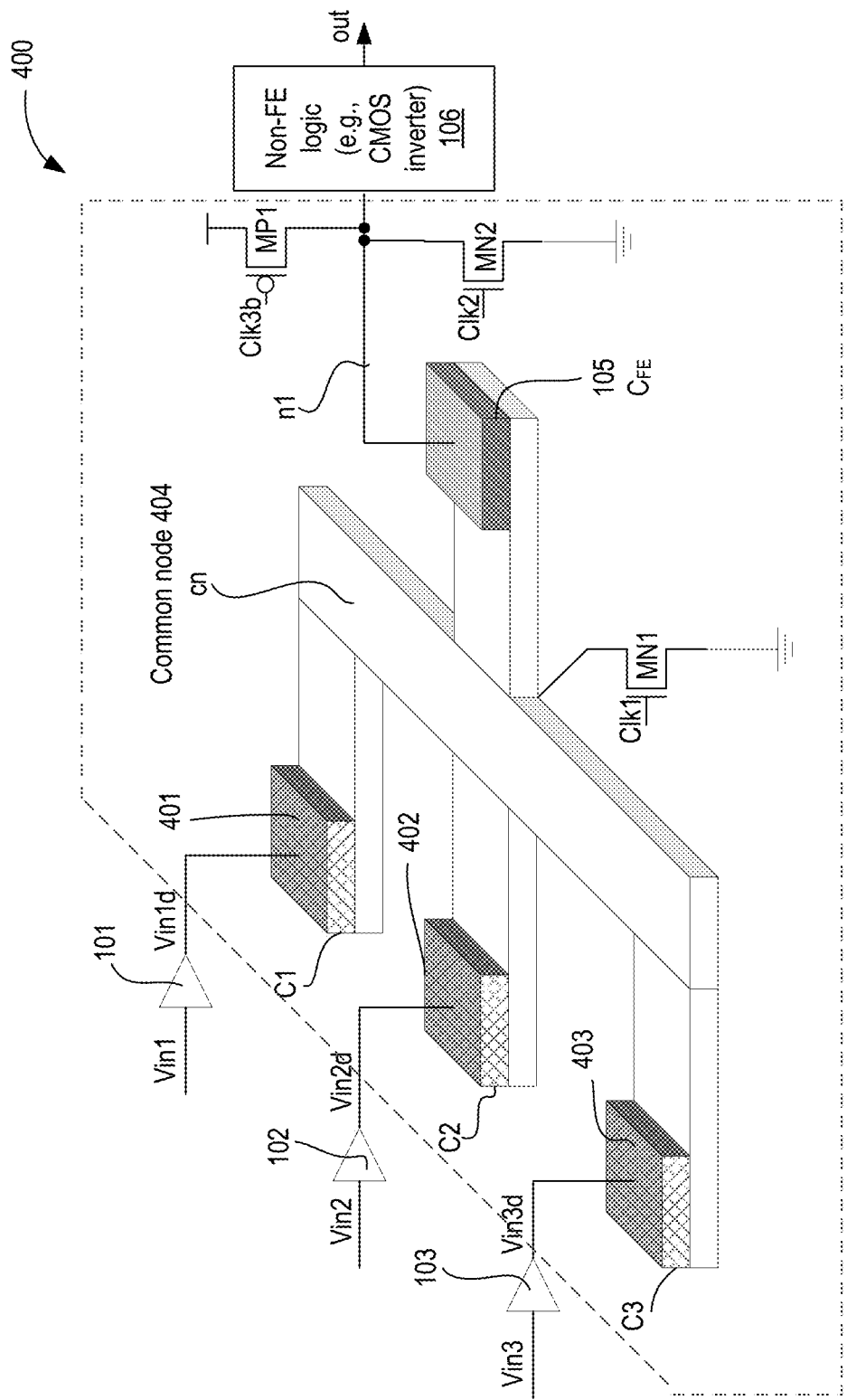
FIG. 4 illustrates combinational logic including the logic gate of FIG. 1A with a 3D (three-dimensional) view of the 3-input majority gate that couples to an inverter or buffer, in accordance with some embodiments.

FIG. 4 illustrates combinational logic 400 including the logic gate of FIG. 1A with a 3D (three-dimensional) view of the 3-input majority gate that couples to an inverter or buffer, in accordance with some embodiments. Any of the reset mechanisms described herein (e.g., with reference to FIGS. 1A-I) are applicable to logic 400.

In this example, capacitors C1 (401), C2 (402), and C3 (403) are MIM capacitors that receive inputs Vin1, Vin2, and Vin3, respectively, on their first terminals from buffers or drivers 101, 102, and 103, respectively. However, other types of capacitors can be used. For example, hybrid of metal and transistor can be used to implement the capacitor. The second terminals of capacitors C1 (401), C2 (402), and C3 (403) are coupled to common node interconnect 404 (Vout_int1). The output of drivers 101, 102, and 103 are Vin1d, Vin2d, and Vin3d, respectively. Interconnect 404 can be on any suitable metal layer. In some embodiments, interconnect 404 comprises a material which includes one or more of: Cu, Al, Ag, Au, Co, or W. In some embodiments, capacitors C1 (401), C2 (402), and C3 (403) are formed in the backend of the die. In some embodiments, capacitors C1 (401), C2 (402), and C3 (403) are formed in the frontend of the die. Interconnect 404 is coupled to a first terminal of non-linear polar capacitor 105. In this example, capacitor 105 comprises ferroelectric material and hence labeled as $C_{FE}$. However, other non-linear polar material described herein can be used to fabricate capacitor 105. The second terminal of capacitor 105 is coupled to node n1 (Vout_int2).

In some embodiments, capacitor 105 is a pillar capacitor. A pillar capacitor is taller than its width and allows for compact layout in the z-direction. In one embodiment, capacitors C1 (401), C2 (402), and C3 (403) are fabricated below or under pillar capacitor forming a vertical majority gate.

Figure 5:
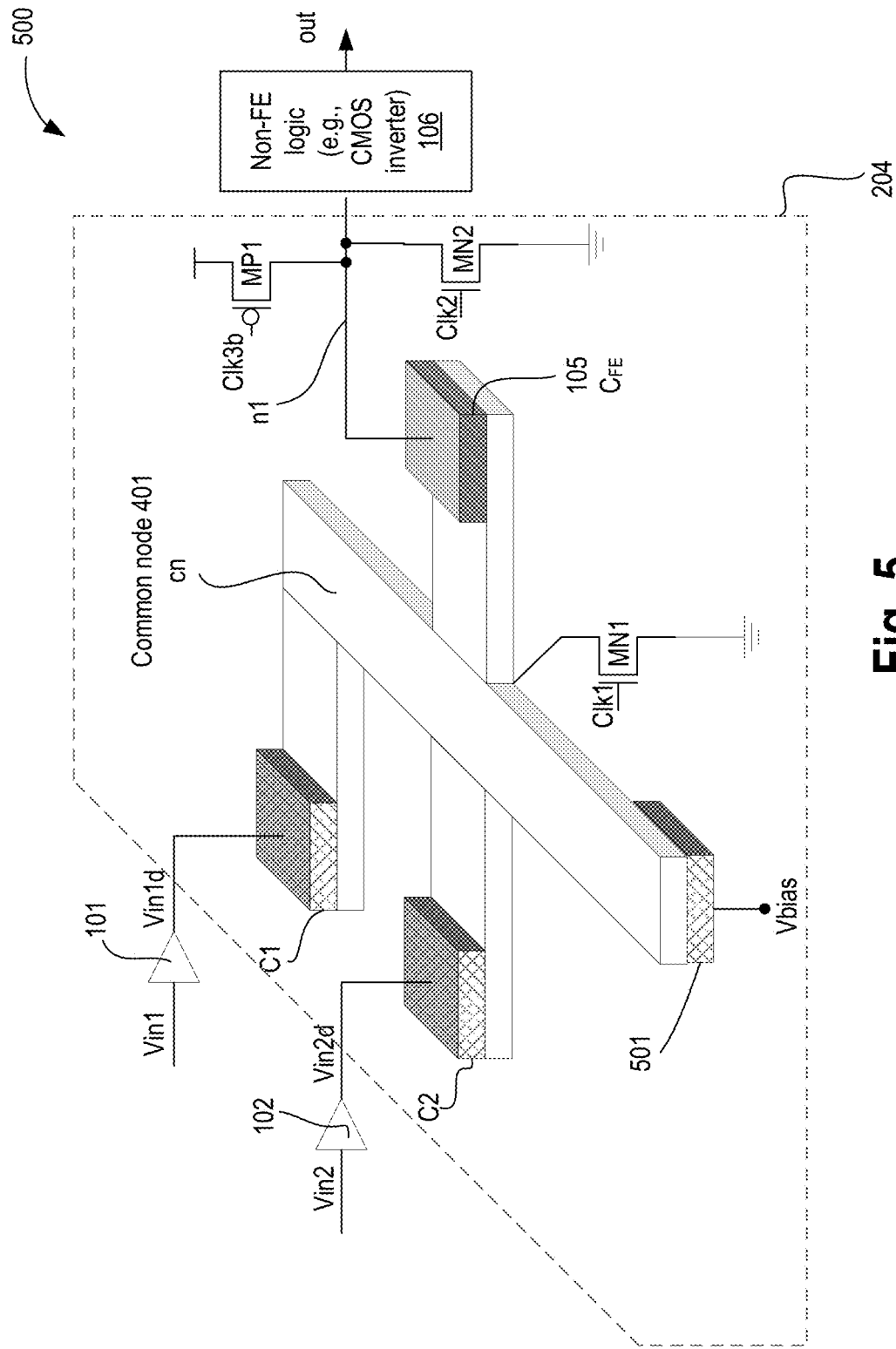
FIG. 5 illustrates combinational logic including the logic gate of FIG. 1B with a 3D view of the 3-input threshold gate that couples to an inverter or buffer, in accordance with some embodiments.

FIG. 5 illustrates combination logic 500 having logic gate of FIG. 1B with a 3D view of the 3-input threshold gate that couples to an inverter or buffer, in accordance with some embodiments. Here, 3-input threshold gate 204 is similar to majority gate of FIG. 4 but for removing capacitor C3 and its associated input and adding an extra capacitor 501 Cbias which is biased by Vbias. Vbias can be positive or negative. The various embodiments described with reference to FIG. 1B and FIG. 4 are applicable here. Any of the reset mechanisms described herein (e.g., with reference to FIGS. 1A-I) are applicable to logic 500.

Figure 6A:
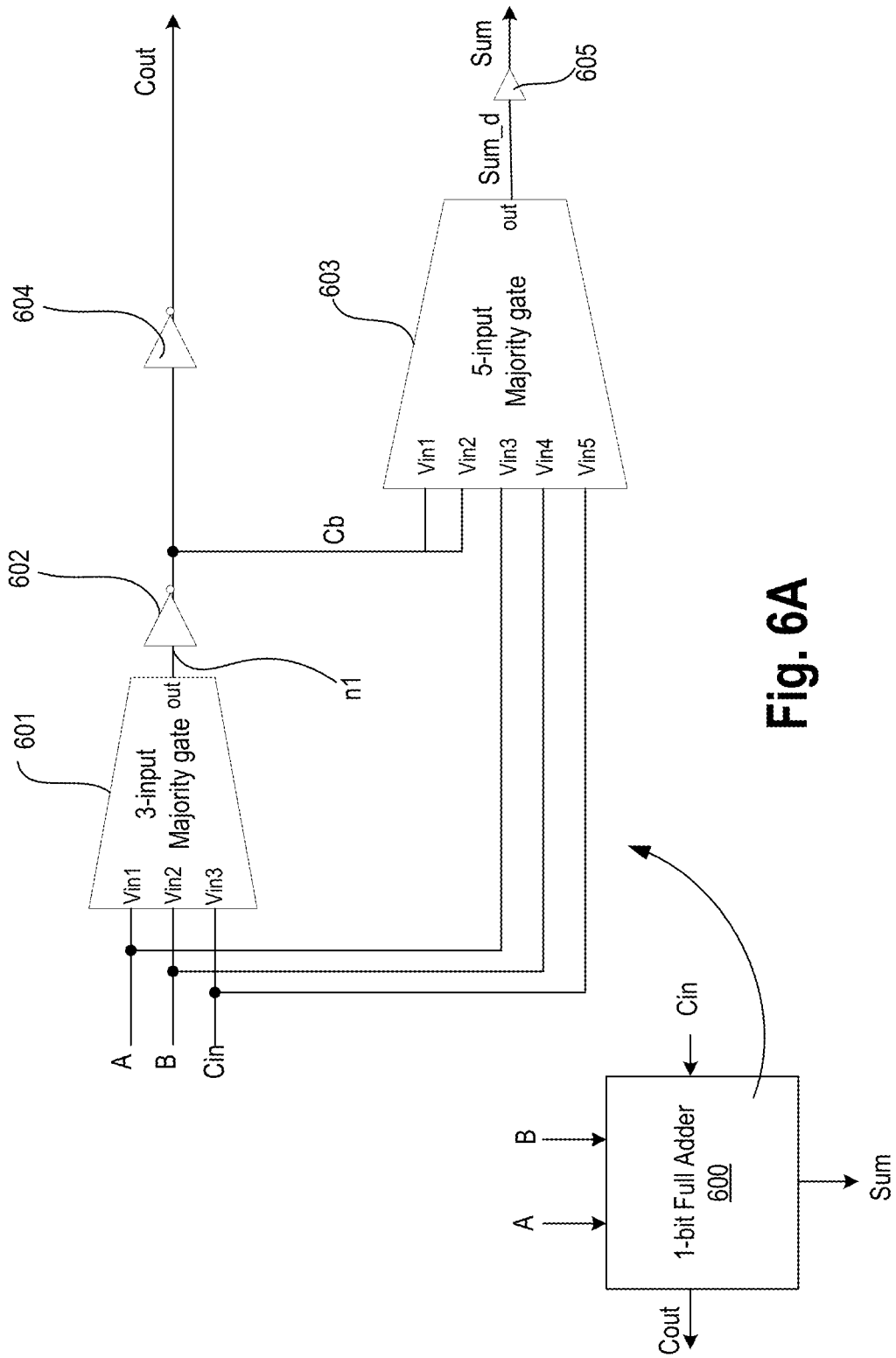
FIG. 6A illustrates a 1-bit full adder comprising a 3-input majority gate and a 5-input majority gate, in accordance with some embodiments.

FIG. 6A illustrates 1-bit full adder 600 comprising a 3-input majority gate and a 5-input majority gate, in accordance with some embodiments. A full adder adds binary numbers and accounts for values carried in as well values that are output. A one-bit full-adder adds three one-bit numbers, A, B, and $C_{in}$, where A and B are the operands, and $C_{in}$ is a bit carried in from the previous less-significant stage. However, the embodiments are not limited to the inputs being binary. In some embodiments, the inputs are analog signals. The full adder is usually a component in a cascade of adders, which add 8, 16, 32, etc. bit binary numbers. The circuit produces a 2-bit output, with are carry out $C_{out}$, and sum. The sum is typically represented by the signals $C_{out}$ and S, where the sum equals $2C_{out}+S$. Implementing a 1-bit adder with complementary metal oxide semiconductor (CMOS) logic requires many logic gates such as AND logic gate, OR logic gate, inverters, and sometime state elements such as flip-flops.

In some embodiments, 1-bit adder is implemented with 3-input majority gate 601, inverter 602, 5-input majority gate 603, inverter 604, and buffer 605. An output n1 from 3-input majority gate 601 is inverted by inverter 602. The inverted output Cb is input two times (as inputs Vin1 and Vin2) to 5-input majority gate 603. To keep the polarity of Cout correct, an additional inverter 604 drives the output of Cb as Cout. Other inputs (A, B, and Cin) to the 5-input majority gate are same as those of the 3-input majority gate. The output Sum_d of the 5-input majority gate 603 is a sum while the output of the 3-input majority gate 601 is the carry. In various embodiments, the output Sum_d is buffered by buffer 605 to generate the final Sum for driving to a next stage. Table 5 illustrates the truth table of the 1-bit full adder.

TABLE 7

| Inputs | | | Outputs | |
|---|---|---|---|---|
| | | | Carry out | |
| A | B | Cin | (Cout) | Sum |
| 0 | 0 | 0 | 0 | 0 |
| 0 | 0 | 1 | 0 | 1 |
| 0 | 1 | 0 | 0 | 1 |
| 0 | 1 | 1 | 1 | 0 |
| 1 | 0 | 0 | 0 | 1 |
| 1 | 0 | 1 | 1 | 0 |
| 1 | 1 | 0 | 1 | 0 |
| 1 | 1 | 1 | 1 | 1 |

The 1-bit full adder 600 of FIG. 6A is scaled down to eight capacitors that can be fabricated or positioned in the backend of the die. The active devices or transistors of inverters 602, 604, and buffer 605 can be fabricated in the frontend or backend depending on the transistor technology. While each majority gate is shown to have two additional transistors MN1 and MN2 to discharge common node cn and node n1, these transistors can be shared between the two majority gates 601 and 603. In some embodiments, a single transistor MN (or a p-type transistor, not shown) can be used to pre-discharge (or pre-charge it a p-type transistor is used) common node cn and node n1 for both majority gates 601 and 603. As such, nine transistors can implement a 1-bit full adder, which is much smaller in area and power footprint than traditional CMOS based 1-bit full adders.

Another way to describe the 1-bit full-adder is in view of linear and non-linear outputs generated by various circuities of 1-bit full-adder 600. In some embodiments, adder 600 comprises 3-input majority gate 601 including a first circuitry (e.g., interconnects and capacitors C1, C2, and C3) to receive at least three signals (A, B, and Cin) and apply linear summation to the at least three signals, and generate a first summed output on node cn. In various embodiments, A, B, and Cin are driven by CMOS drivers with full rail-to-rail signaling. The 3-input majority gate 601 comprises a second circuitry (e.g., interconnect cn, capacitor 105) to receive the first summed output (e.g., voltage and/or current on node cn) and apply non-linear function via a first FE material (e.g., by capacitor 105), wherein the second circuitry to generate a first non-linear output (e.g., on node n1) compared to the first summed output (e.g., on node cn). Adder 600 further comprises an inverting logic gate 602 to convert the first non-linear output to a first output Cb, wherein the first output is an inversion of the first non-linear output. The inverting logic gate 602 can be an inverter, a NAND gate, or NOR gate, wherein the NAND and NOR gates are configured as inverters and are capable of disabling the signal path.

Adder 600 further comprises a 5-input majority gate 603 coupled to the inverting logic gate 602. The 5-input majority gate 603 comprises a third circuitry (e.g., interconnects and capacitors C1, C2, C3, C4, C5) to receive at least five signals including the at least three signals (e.g., A, B, Cin) and two inverted first outputs (2× Cb), and apply linear summation to the at least five signals, and generate a second summed output on a common node. The 5-input majority gate 603 comprises a fourth circuitry (e.g., the common node and capacitor 105) to receive the second summed output and apply non-linear function via a second FE material, wherein the fourth circuitry to generate a second non-linear output compared to the second summed output. The output voltage developed on the second FE material is the summed output which can be buffered by buffer 605.

Figure 6B:
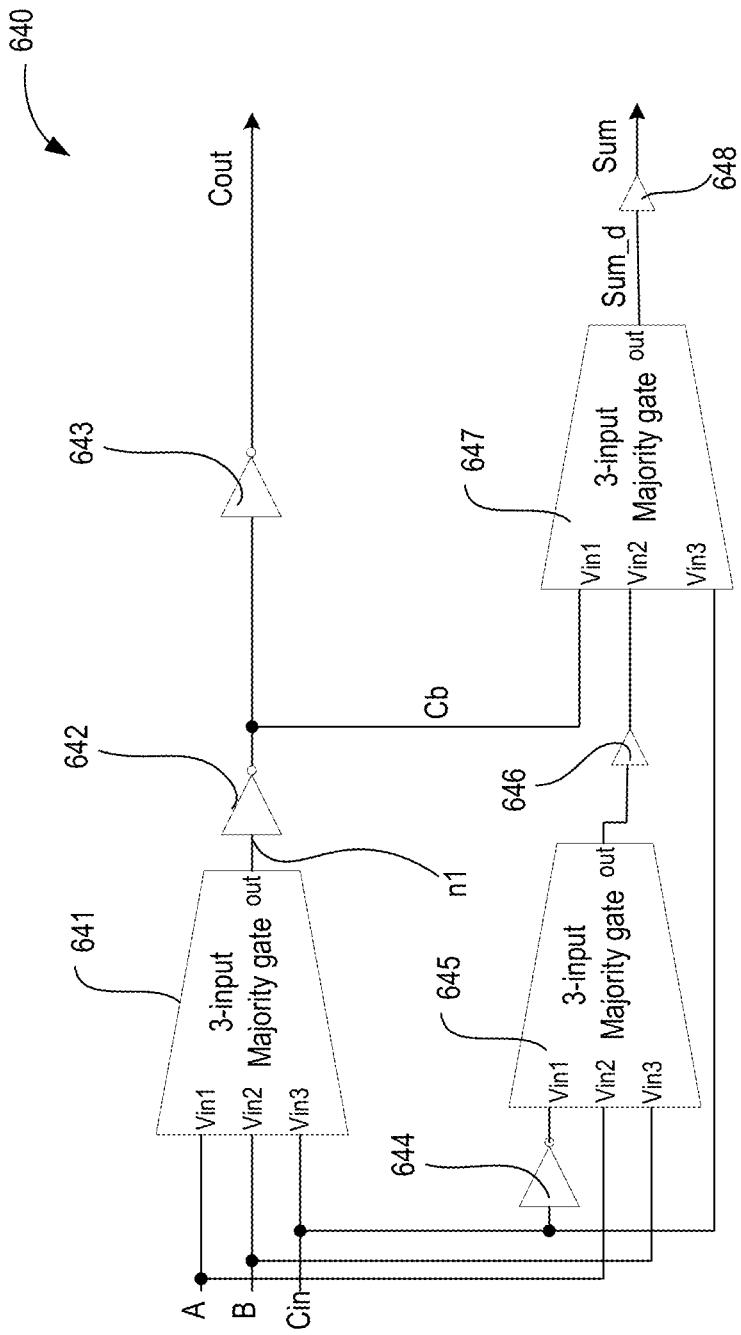
FIG. 6B illustrates 1-bit full adder, in accordance with some embodiments.

FIG. 6B illustrates 1-bit full adder 640, in accordance with some embodiments. Adder 640 is another version of adder 600. Adder 640 is another version of adder 600. Adder 640 comprises first 3-input majority gate 641, first inverting logic 642, second inverting logic 643, third inverting logic 644, second 3-input majority gate 645, first non-inversion logic 646, third 3-input majority gate 647, and second non-inversion logic 648 coupled as shown. The inverting logic can be any suitable inverting logic such as an inverter, tri-state inverter, NAND gate, NOR gate, or multiplexer configured as an inverter. The non-inverting logic can be any suitable non-inverting logic such as a buffer, amplifier, etc. The first 3-input majority gate 641 generates the carry-out signal, which is inverted and provided as input to the third 3-input majority gate 647. The output of the 3-input majority gate is the sum. The third 3-input majority gate 647 receives the carry-in input and a buffered output (buffered by buffer 646) of the second 3-input majority gate 645. The second 3-input majority gate 645 receives inputs A and B, and an inverted version of carry-in. The output third-input majority gate 647 is buffered by buffer 648 to generate the sum.

Figure 7:
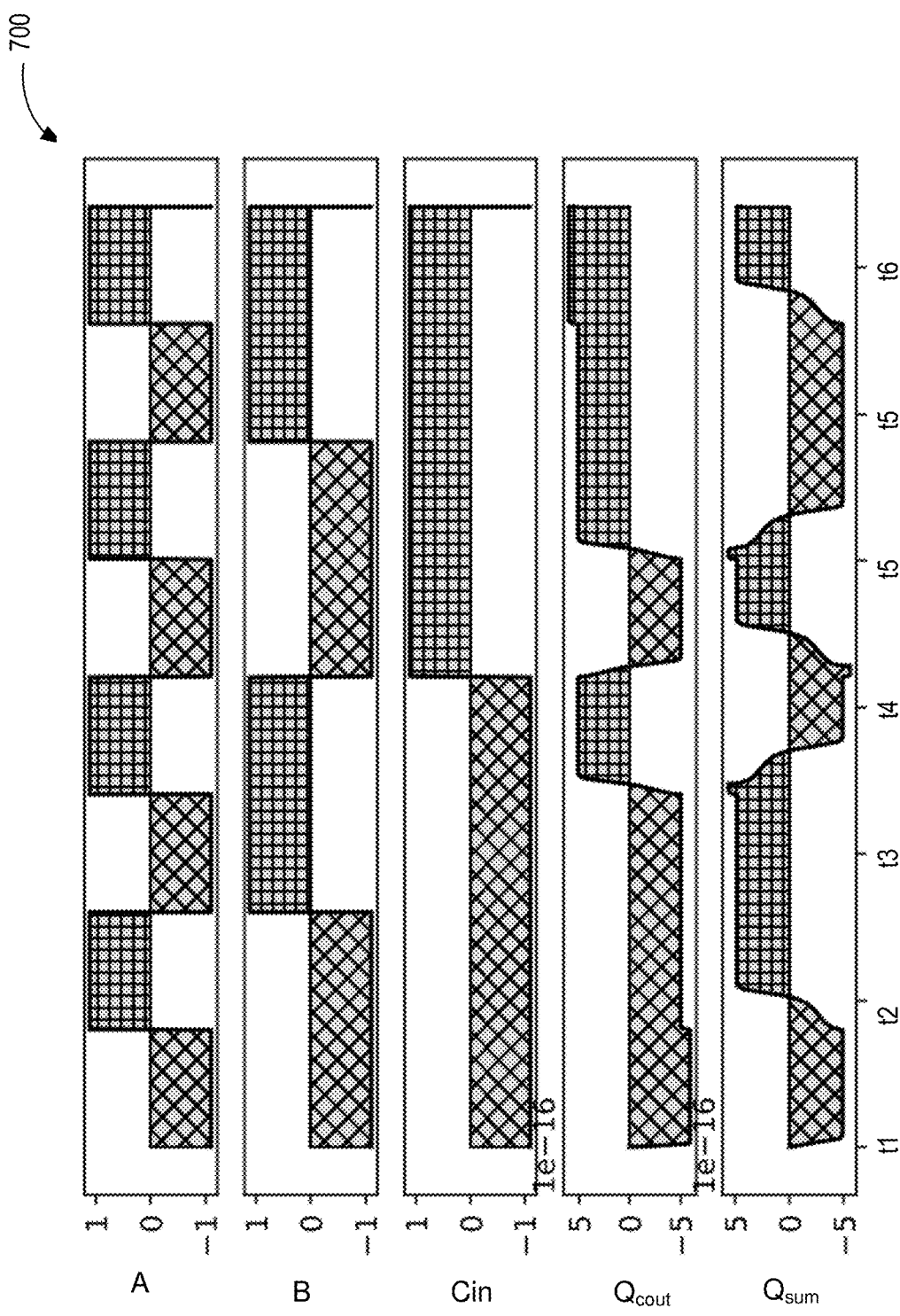
FIG. 7 illustrates a plot showing operation of a 1-bit full adder, in accordance with some embodiments.

FIG. 7 illustrates plot 700 showing operation of 1-bit full adder of FIG. 6A, in accordance with some embodiments. The waveforms show the various input combinations of Table 5, and the outputs Cin and Sum.

Figure 8:
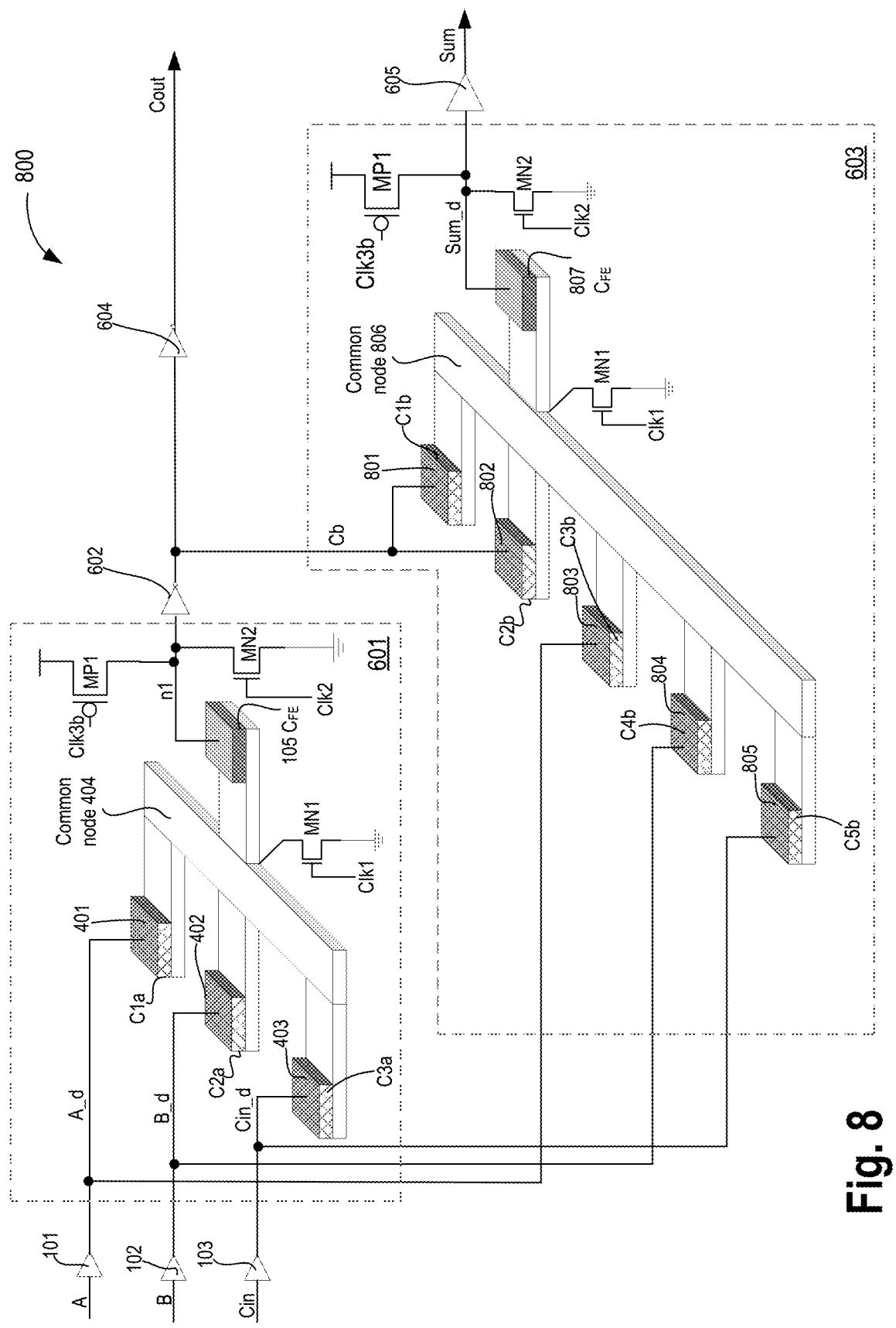
FIG. 8 illustrates a 3-D view of a 1-bit full adder, in accordance with some embodiments.

FIG. 8 illustrates 3-D view 800 of a 1-bit full adder, in accordance with some embodiments. Here inputs A, B, and Cin are driven by buffers 101, 102, and 103, respectively. These buffers may or may not be part of the adder since these inputs are driven by another logic block (not shown). The 3-input majority gate receives inputs A_d, B_d, and Cin_d, which are buffered versions of input signals A, B, and Cin. In this example, capacitors C1a (401), C2a (402), and C3a (403) are MIM capacitors that the inputs A_d, B_d, and Cin_d, respectively, on their first terminals. However, other types of capacitors can be used. For example, hybrid of metal and transistor can be used to implement the capacitor.

The second terminals of capacitors C1a (401), C2a (402), and C3a (403) are coupled to common node cn interconnect 404. Interconnect 404 can be on any suitable metal layer. In some embodiments, interconnect 404 comprises a material which includes one or more of: Cu, Al, Ag, Au, Co, or W. In some embodiments, capacitors C1a (401), C2a (402), and C3 (403) are formed in the backend of the die. In some embodiments, capacitors C1a (401a), C2a (402), and C3a (403) are formed in the frontend of the die. Interconnect 404 is coupled to a first terminal of non-linear polar capacitor 105. In this example, capacitor 105 comprises ferroelectric material and hence labeled as $C_{FE}$. However, other non-linear polar material described herein can be used to fabricate capacitor 105. The second terminal of capacitor 105 is coupled to node n1.

In some embodiments, capacitor 105 is a pillar capacitor. A pillar capacitor is taller than its width and allows for compact layout in the z-direction. In one embodiment, capacitors C1a (401), C2a (402), and C3a (403) are fabricated below or under pillar capacitor forming a vertical majority gate.

The voltage on node n1 is the carry out signal, which is inverted by inverter 602 and driven as Cb to capacitors C1b and C2b. Other capacitors C3b, C4b, and C5b of the 5-input majority gate receive inputs A_d, B_d, and Cin_d, respectively.

In this example, capacitors C1b (801), C2b (802), C3b (803), C4b (804), and C5b (805) are MIM capacitors that the inputs A_d, B_d, and Cin_d, respectively, on their first terminals. However, other types of capacitors can be used. For example, hybrid of metal and transistor can be used to implement the capacitor. The second terminals of capacitors C1b (801), C2b (802), C3b (803), C4b (804), and C5b (805) are coupled to common node interconnect 806. Interconnect 806 can be on any suitable metal layer. In some embodiments, interconnect 806 comprises a material which includes one or more of: Cu, Al, Ag, Au, Co, or W. In some embodiments, capacitors C1b (801), C2b (802), C3b (803), C4b (804), and C5b (805) are formed in the backend of the die. In some embodiments, capacitors C1b (801), C2b (802), C3b (803), C4b (804), and C5b (805) are formed in the frontend of the die. Interconnect 806 is coupled to a first terminal of non-linear polar capacitor 807. In this example, capacitor 807 comprises ferroelectric material and hence labeled as $C_{FE}$. However, other non-linear polar material described herein can be used to fabricate capacitor 807. The second terminal of capacitor 807 is coupled to node Sum_d. Buffer 605 drives Sum_d as Sum.

Figure 9:
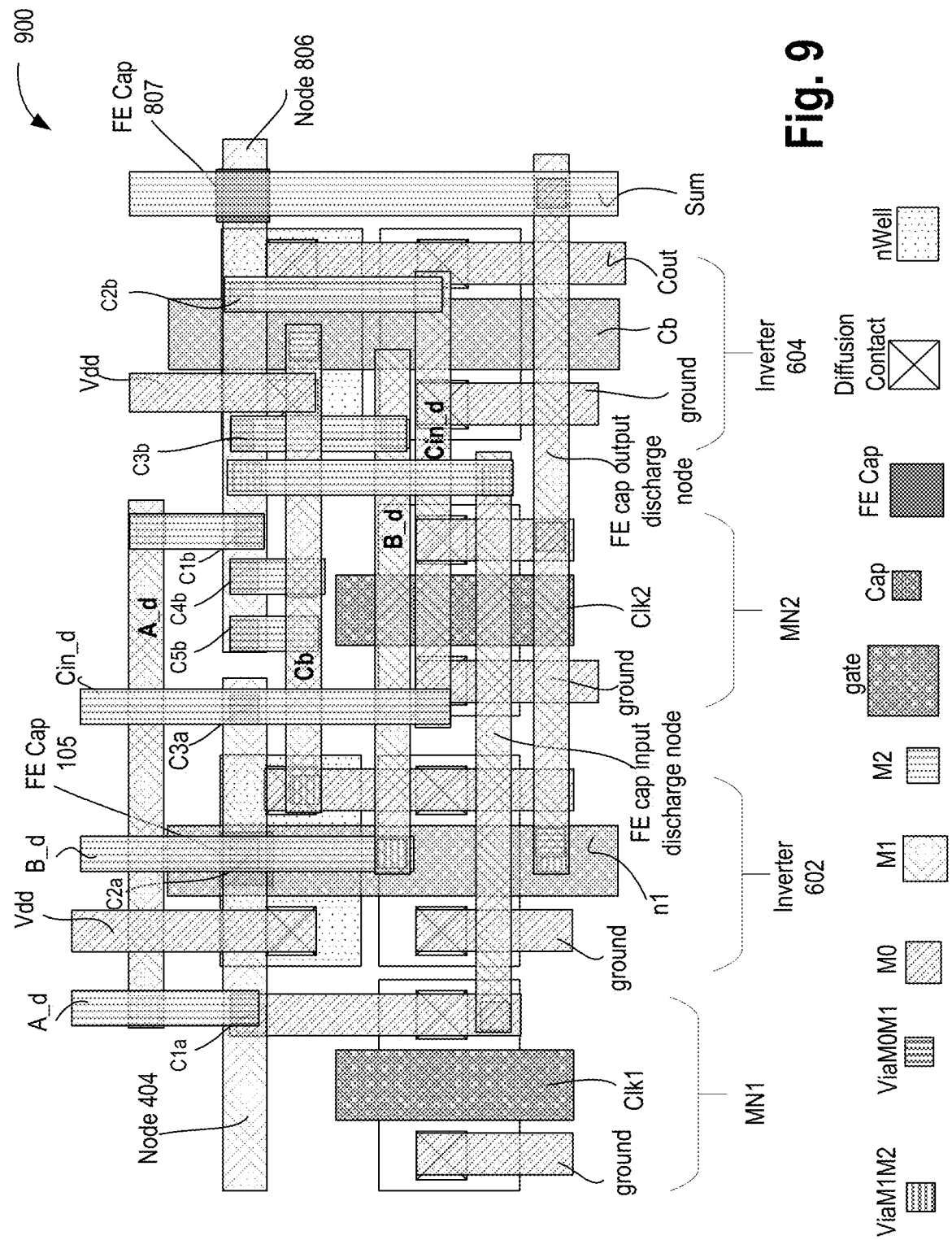
FIG. 9 illustrates a top-down layout of a 1-bit full adder, in accordance with some embodiments.

FIG. 9 illustrates top-down layout 900 of a 1-bit full adder, in accordance with some embodiments. Layout 900 illustrates a compact layout of 1-bit full adder 600 with a pitch of four minimum sized transistors. The pitch can be further reduced to two minimum sized transistors if transistors MN1 is used to pre-discharge nodes cn 404 and 806 n1 for both the 3-input majority gate 601 and the 5-input majority gate 603. Non-ferroelectric capacitors C1b (801), C2b (802), C3b (803), C4b (804), and C5b (805) and non-linear polar capacitors (FE cap) are positioned in the place of via for metal layer 1 (M1) to metal layer 2 (M2). Transistors MN1, MN2, and inverters 602 and 604 are in the frontend of the die. Inputs A, B, and Cin are on metal layer M2. Common nodes cn 404 and 806 are on metal layer M1. While non-ferroelectric capacitors C1, C2, C3, C4, and C5, and non-linear polar capacitors (FE cap) are positioned in location of ViaM1M2, then can be further located in the backend of the die. For example, non-ferroelectric capacitors C1, C2, C3, C4, and C5 and the non-linear polar capacitors (FE cap) can be positioned in ViaM4M5 or higher. As such, lower metal layers are freed up for routing of other signals.

Transistors MN1 and MN2, and other of inverters 602 and 604, can be planar or non-planar transistors. In some embodiments, transistors MN1 and MN2, and other of inverters 602 and 604, can be formed in the frontend or backend. In some embodiments, one or more of non-ferroelectric capacitors C1, C2, C3, C4, and C5 and non-linear polar capacitor (FE cap) are formed in the frontend or backend. While transistors MN1 and MN2 are illustrated as n-type transistors, they can be replaced with p-type transistors. In that case, nodes cn 404/806 and n1/sum_d are pre-charged to a predetermined or programmable voltage. The transistors here can be Square Wire, Rectangular Ribbon Transistors, Gate All Around Cylindrical Transistors, Tunneling FETs (TFET), ferroelectric FETs (FeFETs), bipolar transistors (BJT), BiCMOS, or other devices implementing transistors functionality, for instance, carbon nanotubes or spintronic devices. In some embodiments, the transistors are typical metal oxide semiconductor (MOS) transistors or their derivative including Tri-Gate and FinFET transistors. While MOSFET have symmetrical source and drain terminals, TFET device has asymmetric source and drain terminals.

Figure 10A:
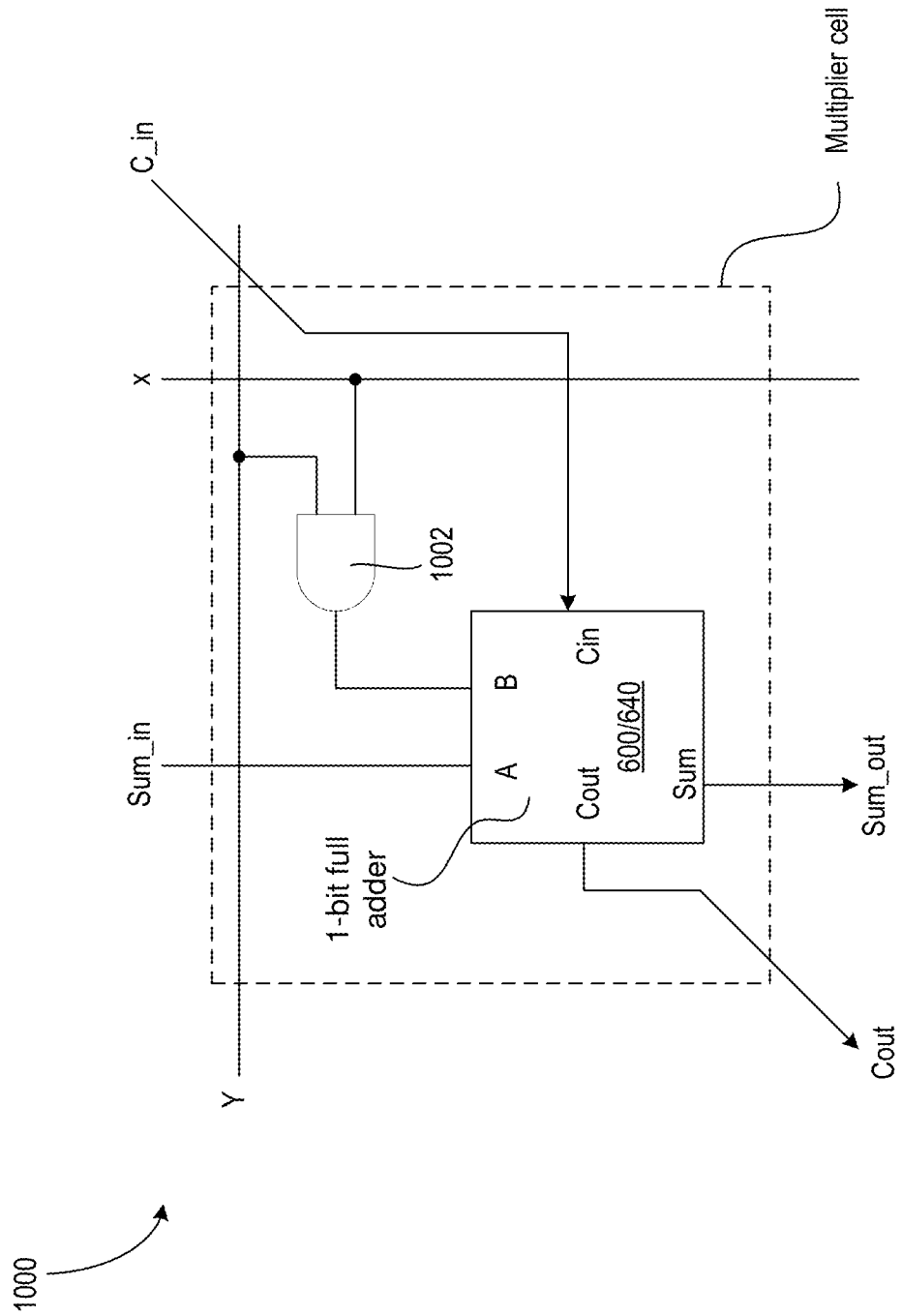
FIG. 10A illustrates a multiplier cell comprising the 1-bit full adder and a AND gate, in accordance with some embodiments.

FIG. 10A illustrates multiplier cell 1000 comprising the 1-bit full adder and AND gate, in accordance with some embodiments. Cell 1000 comprises a 1-bit full adder (e.g., one of 600 or 640) and a AND gate 1002. 1-bit full adder 600/640 receives inputs A and B along with carry-in (Cin). Input A is a sum-in input and C_in is a carry-in input from another multiplier cell. In an array of multipliers, for the first multiplier cell, Sum_in and C_in have fixed values (e.g., logical 0). The two inputs X and Y are multiplied in view of Sum_in (sum input) and C_in (carry_in) inputs. AND gate 1002 receives the two inputs X and Y and provides an output which is received as input B by 1-bit full adder 600/640.

In some embodiments, AND gate 1002 is a CMOS (or any other transistor technology) based AND gate (e.g., a NAND gate followed by an inverter). In some embodiments, AND gate 1002 is a threshold gate 204. AND gate 1002 produces a partial multiplication result of multiplying X and Y, while adder 600/640 adds that partial multiplication result with a multiplication result Sum_in from a previous multiplier cell (not shown) to generate a full multiplication result as Sum_out. The Carry-out (Cout) of adder 600/640 becomes the Cin for the subsequent multiplier cell. Sum_out can be used as a result and/or as Sum_in for a subsequent multiplier cell. As such, an N×N multiplier is made using the basic multiplier cell 1000 repeated N×N times and connected as discussed herein.

Figure 10B:
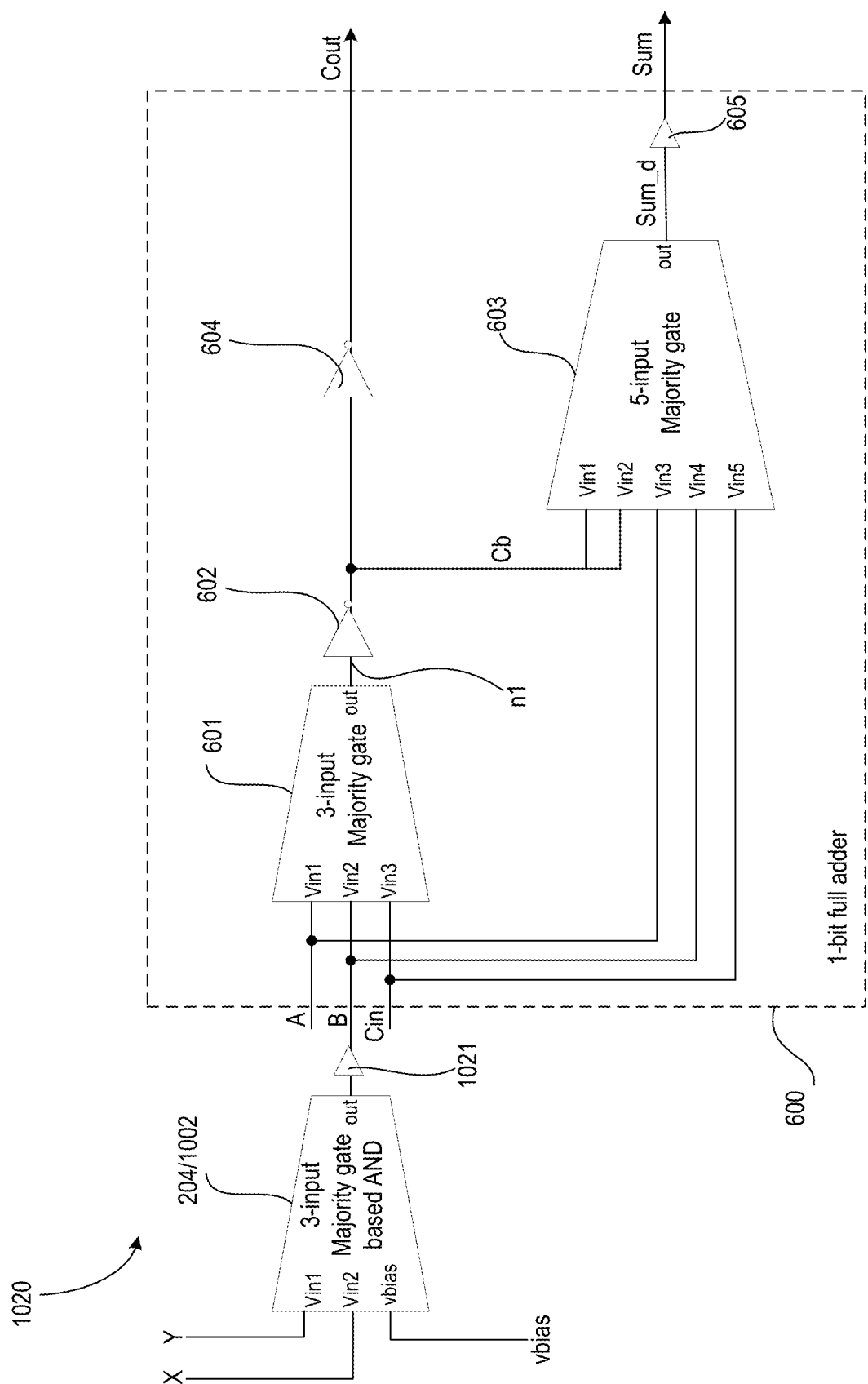
FIG. 10B illustrates a multiplier cell comprising the 1-bit full adder of FIG. 6A and a AND gate based on FIG. 2A, in accordance with some embodiments.

FIG. 10B illustrates multiplier cell 1020 comprising the 1-bit full adder 600 of FIG. 6A and a AND gate based on FIG. 2A, in accordance with some embodiments. AND gate 204/1002 receives inputs X and Y, and a bias voltage vbias. The output of the ANG=D gate 204/1002 is buffered by buffer 1021 and provided as input B to Vin2 of 3-input majority gate 601 and Vin4 of 5-input majority gate 603. To implement an AND function, vbias is set to a negative voltage. In some embodiments, the pre-charge or pre-discharge transistors MN1 and/or MN2 in majority gates 204/1002, 601, and 603, are shared. In some embodiments, a single pre-charge or pre-discharge transistor is shared by majority gates 204/1002, 601, and 603 to pre-charge or pre-discharged the nodes across capacitors 105. Compared to traditional CMOS multipliers, merely a few transistors are used herein resulting in a lower power and faster multiplier. Further, by fabricating the capacitors (non-ferroelectric capacitors and/or the non-linear polar capacitors) in the backend of the die reduces the footprint (or layout pitch) of the multiplier cell.

Figure 10C:
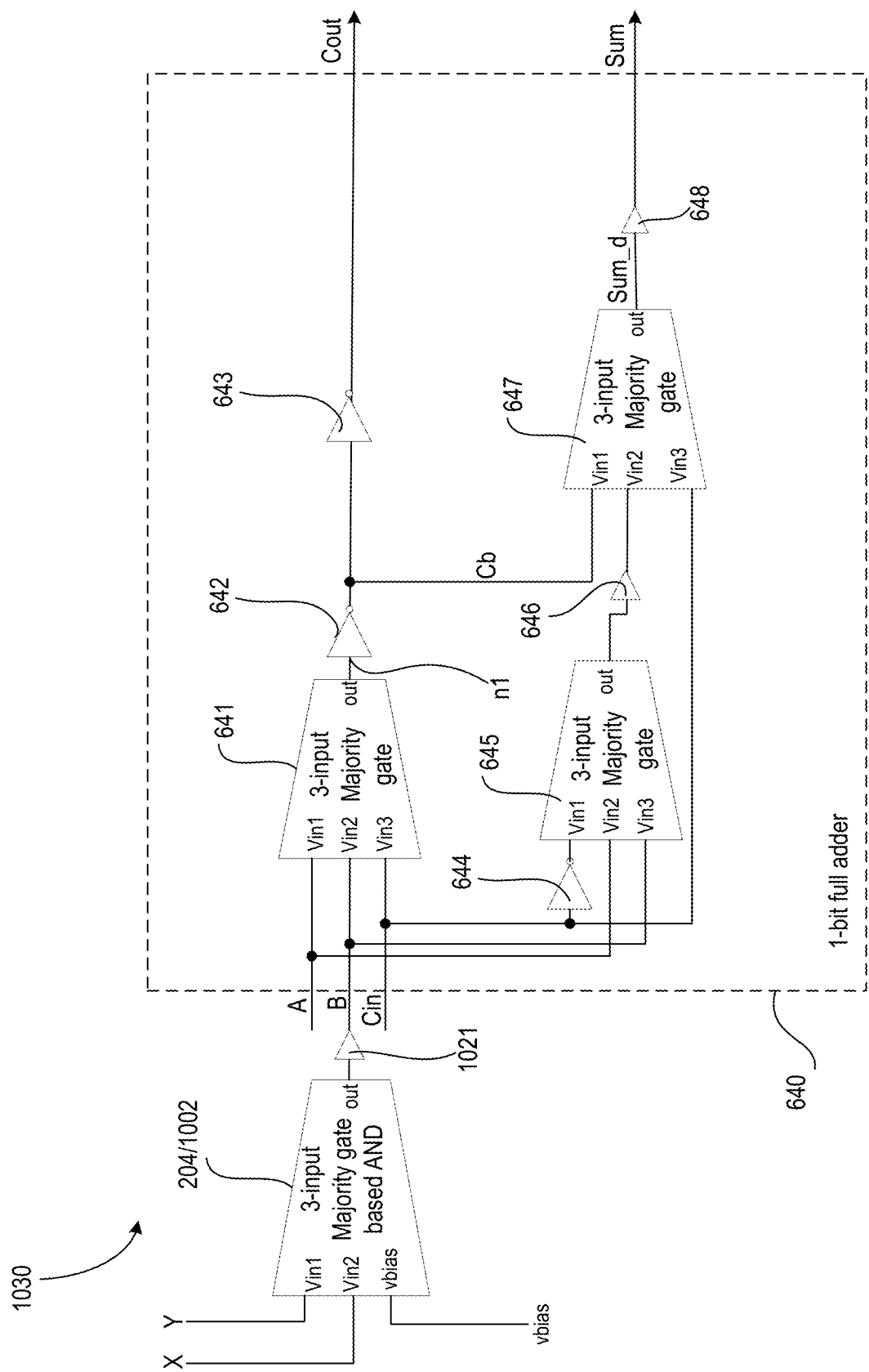
FIG. 10C illustrates a multiplier cell comprising the 1-bit full adder of FIG. 6B and a AND gate based on FIG. 2A, in accordance with some embodiments.

FIG. 10C illustrates multiplier cell 1030 comprising the 1-bit full adder 640 of FIG. 6B and a AND gate based on FIG. 2A, in accordance with some embodiments. Multiplier cell 1030 is same as multiplier 1020 but for different implementation of 1-bit full adder that uses three 3-input Majority gates as described with reference to FIG. 6B.

Figure 11:
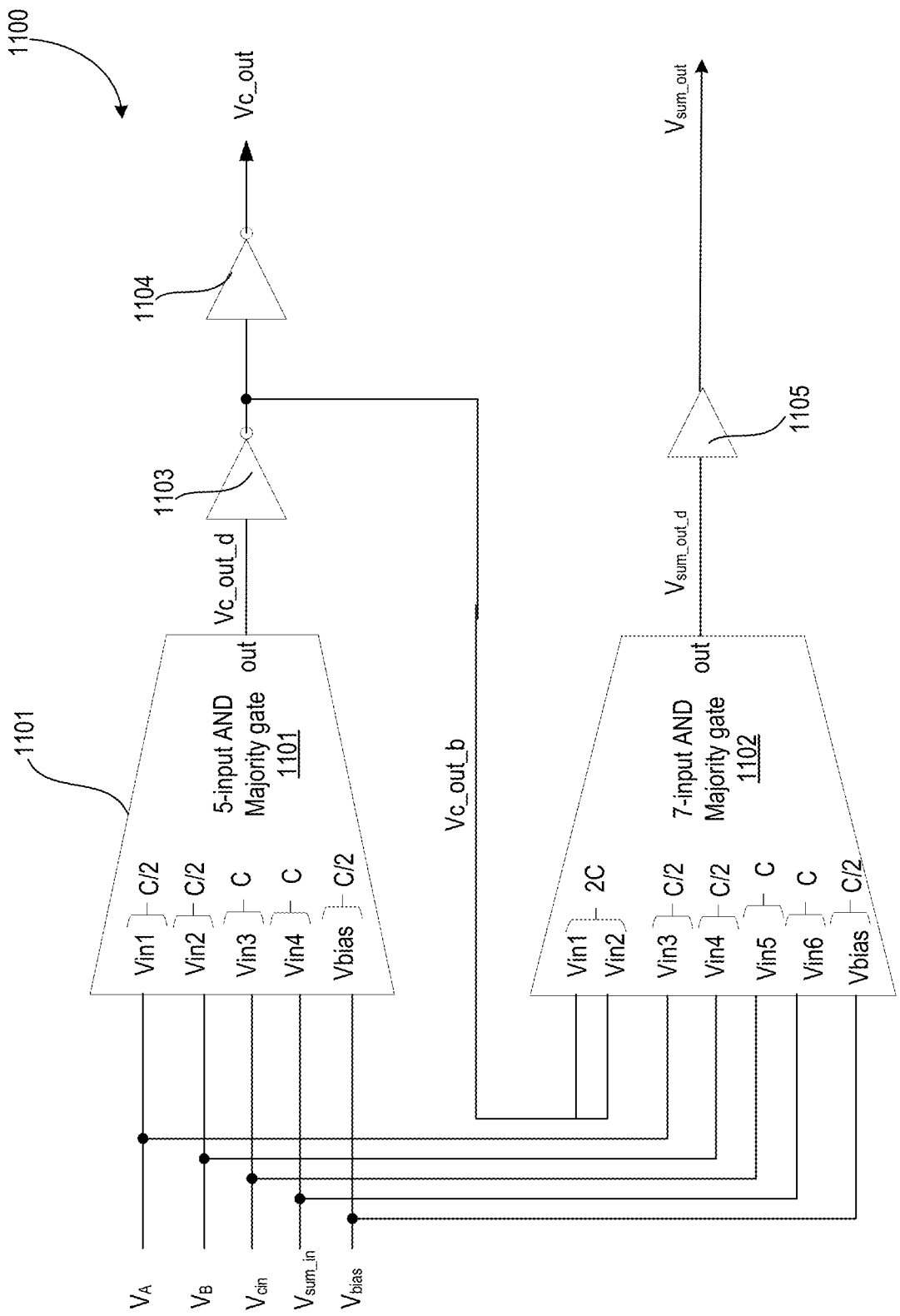
FIG. 11 illustrates a multiplier cell comprising majority-gate AND gates, in accordance with some embodiments.

FIG. 11 illustrates multiplier cell 1100 comprising majority-gate AND gates, in accordance with some embodiments. In some embodiments, multiplier cell 1100 comprises a first majority AND logic gate 1101, a second majority AND logic gate 1102, first inversion logic 1103, second inversion logic 1104, and non-inversion logic 1105.

First majority AND logic gate 1101 receives a first input (Vin1), a second input (Vin2), a third input (Vin3); a fourth input (Vin4), and a first bias input (Vbias). The first input Vin1 is coupled to input $V_A$, second input Vin2 is coupled to input $V_B$, the third input Vin3 is coupled to carry-in input Vcin, the fourth input Vin4 is coupled to Sum input ($V_{sum\_in}$), while the first bias input is coupled to Vbias. The output of first majority AND logic gate 1101 is Vc_out_d which is received as input by first inversion circuitry 1103. In various embodiments, the output Vc_out_b of first inversion circuitry 1103 is received as input by second inversion circuitry 1104. The output of second inversion circuitry 1104 is Vc_out (carry-out output) for the next multiplier cell.

Second majority AND logic gate 1102 receives a first input (Vin1), a second input (Vin2), a third input (Vin3); a fourth input (Vin4), fifth input (Vin5), sixth input (Vin6), and a second bias input (Vbias). The first input Vin1 and second input Vin2 are coupled to Vc_out_b, output of first inversion circuitry 1103. The third input Vin3 is coupled to input $V_A$, fourth input Vin4 is coupled to input $V_B$, the fifth input Vin5 is coupled to carry-in input $V_{cin}$, the sixth input Vin6 is coupled to Sum input ($V_{sum\_in}$), while the second bias input is coupled to Vbias. As such, the first input Vin1 of first majority AND logic gate 1101 is coupled to the third input Vin3 of second majority AND logic gate 1102. The second input Vin2 of first majority AND logic gate 1102 is coupled to the fourth input of the second majority AND logic gate. The third input Vin3 of first majority AND logic gate 1101 is coupled to the fifth input Vin5 of second majority AND logic gate 1102. The fourth input Vin4 of first majority AND logic gate 1101 is coupled to the sixth input Vin6 of the second majority AND logic gate 1002. The first bias input and the second bias input are coupled to the same bias Vbias. In some embodiments, the first bias input and the second bias input are coupled to different bias voltages (e.g., Vbias1 and Vbias2, respectively).

The first inversion logic 1103 can be any suitable inversion logic such as inverter, NAND gate configured as an inverter with a controllable input, a NOR gate configured as an inverter with a controllable input, a multiplexer that provides the output of majority gate 1101 in normal condition and any other predetermined or programmable input as output on Vc_out_b. The second logic 1104 can be a suitable inversion logic such as inverter, NAND gate configured as an inverter with a controllable input, a NOR gate configured as an inverter with a controllable input, a multiplexer that provides the output of first inversion circuitry 1103 in normal condition and any other predetermined or programmable input as output on Vc_out. In some embodiments, non-inversion logic 1105 comprises a buffer or any other non-inversion logic such as non-inverting amplifier, AND gate with a controllable input that can mask the output Vsum_out, OR gate with a controllable input that can mask the output Vsum_out, etc.

Figure 12:
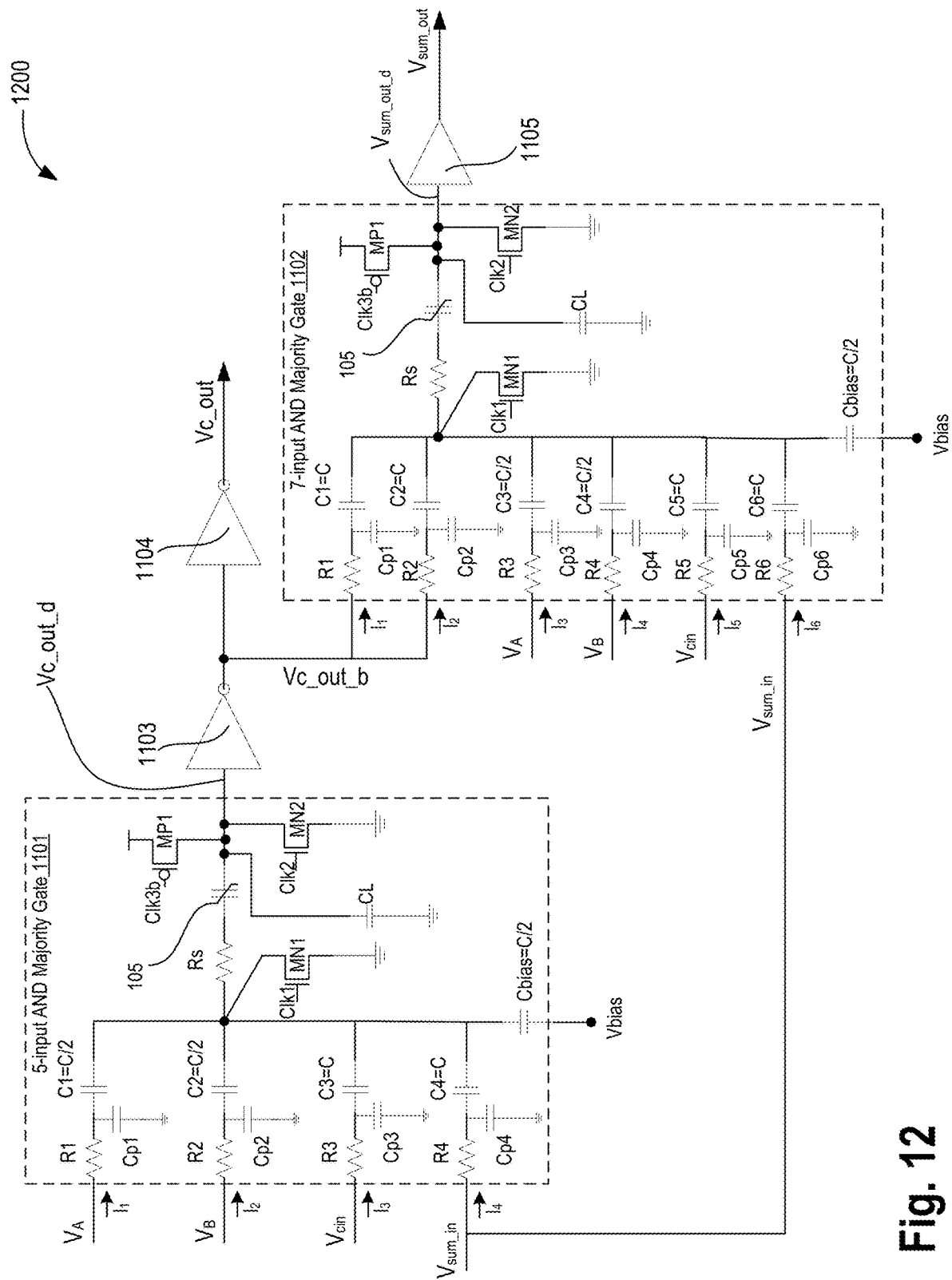
FIG. 12 illustrates a schematic of the multiplier cell of FIG. 11, in accordance with some embodiments.

FIG. 12 illustrates schematic 1200 of the multiplier cell of FIG. 11, in accordance with some embodiments. In some embodiments, first majority AND gate 1101 comprises a common node cn, a first capacitor C1, a second capacitor C2, a third capacitor C3, and a fourth capacitor C4. The first capacitor C1 has a first terminal to receive the first input Vin1 of first majority AND gate 1101, and a second terminal coupled to the node cn. The second capacitor C2 has a first terminal to receive the second input Vin2 of first majority AND gate 1101, and a second terminal coupled to the node cn. The third capacitor C3 has a first terminal to receive the third input Vin3 of the first majority AND gate 1101, and a second terminal coupled to the node cn. The fourth capacitor C4 has a first terminal to receive the fourth input Vin4 of first majority AND gate 1101, and a second terminal coupled to the node cn. The fifth capacitor Cbias has a first terminal coupled to the node cn, and a second terminal coupled to the first bias input Vbias. First majority AND gate 1101 comprises a sixth capacitor 105 comprising non-linear polar material. The sixth capacitor 105 includes a first terminal coupled to the node cn and a second terminal coupled to the input Vc_out_d of first inversion circuitry 1103. Here, resistors R1, R2, R3, R4, R5, and R6 are interconnect parasitic resistances, and capacitors Cp1, Cp2, Cp3, Cp4, Cp5, and Cp6 are interconnect parasitic capacitance coupled to capacitors C1, C2, C3, C4, C5, and C6 respectively.

In some embodiments, the third capacitor C3 and the fourth capacitor C4 have a first capacitance (e.g. C), while the first capacitor C1, the second capacitor C2, and fifth capacitor C5 have a second capacitance (e.g., C/2), wherein the first capacitance is higher than the second capacitance. In some embodiments, first capacitance is substantially twice as large as the second capacitance. In some embodiments, the first, second, third, fourth, and fifth capacitors comprises one of: metal-insulator-metal (MIM) capacitor, transistor gate capacitor, hybrid of metal and transistor capacitor; capacitor comprising para-electric material; non-linear dielectric capacitor, or linear dielectric capacitor. In some embodiments, the non-linear polar material includes one of: ferroelectric material, para-electric material, or non-linear dielectric.

In some embodiments, the ferroelectric material includes Bismuth ferrite (BFO), BFO with a doping material where in the doping material is one of Lanthanum, or elements from lanthanide series of periodic table. In some embodiments, the ferroelectric material includes Lead zirconium titanate (PZT), or PZT with a doping material, wherein the doping material is one of La or Nb. In some embodiments, the ferroelectric material includes a relaxor ferroelectric includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST). In some embodiments, the ferroelectric material includes perovskite, which includes one of: BaTiO3, PbTiO3, KNbO3, or NaTaO3. In some embodiments, the ferroelectric material includes hexagonal ferroelectric, which includes one of: YMnO3 or LuFeO3. In some embodiments, the ferroelectric material includes hexagonal ferroelectrics of a type h-RMnO3, where R is a rare earth element such as cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y). In some embodiments, the ferroelectric material includes Hafnium (Hf), Zirconium (Zr), Aluminum (Al), Silicon (Si), their oxides or their alloyed oxides. In some embodiments, the ferroelectric material includes Hafnium oxides of the form, Hf1-x Ex Oy where E can be Al, Ca, Ce, Dy, Er, Gd, Ge, La, Sc, Si, Sr, Sn, or Y. In some embodiments, the ferroelectric material includes Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction. In some embodiments, the ferroelectric material includes Niobate type compounds LiNbO3, LiTaO3, Lithium iron Tantalum Oxy Fluoride, Barium Strontium Niobate, Sodium Barium Niobate, or Potassium strontium niobate. In some embodiments, the ferroelectric material includes improper ferroelectric includes one of: [PTO/STO]n or [LAO/STO]n, where 'n' is between 1 to 100.

In some embodiments, the capacitor comprising non-linear polar material is positioned in a backend of a die, while transistors of first inversion circuitry 1103, second inversion circuitry 1104, and/or non-inversion circuitry 1105 are positioned in a frontend of a die. In some embodiments, non-inversion circuitry 1105 is coupled to an output n1 of second majority AND logic gate 1102.

In some embodiments, second majority AND gate 1102 comprises a common node cn, a first capacitor C1, a second capacitor C2, a third capacitor C3, a fourth capacitor C4, a fifth capacitor C5, a sixth capacitor C6, seventh capacitor Cbias, and eighth capacitor 105. The first capacitor of second majority AND gate 1102 has a first terminal to receive the output v_out_b of first inversion circuitry 1103 and a second terminal coupled to the node cn of second majority AND gate 1102. The second capacitor C2 of second majority AND gate 1102 has a first terminal to receive the output of the first inversion circuitry 1103 and a second terminal coupled to the node cn of second majority AND gate 1102. Third capacitor C3 of second majority AND gate 1102 has a first terminal to receive the first input $V_A$ (Vin1) of first majority AND gate 1101, and a second terminal coupled to the node cn of second majority AND gate 1102. The fourth capacitor C4 second majority AND gate 1102 has a first terminal to receive the second input $V_B$ (Vin2) of first majority AND gate 1101, and a second terminal coupled to the node cn of second majority AND gate 1102. The fifth capacitor C5 of second majority AND gate 1102 has a first terminal coupled to third input $V_{cin}$ (Vin3) of first majority AND gate 1101, and a second terminal coupled to the node of second majority AND gate 1102. The sixth capacitor C6 of second majority AND gate 1102 has a first terminal coupled to the fourth input $V_{sum\_in}$ (Vin4), and a second terminal coupled to the node cn of second majority AND gate 1102. The seventh capacitor Cbias of second majority AND gate 1102 has a first terminal coupled to the second bias input Vbias and a second terminal coupled to the node; cn second majority AND gate 1102. The seventh capacitor is non-linear polar capacitor 105 of second majority AND gate 1102 and includes non-linear polar material. This non-linear polar capacitor 105 includes a first terminal coupled to the node cn and a second terminal coupled to an input $V_{sum\_out\_d}$ of non-inversion circuitry 1105.

In some embodiments, with reference to second majority gate 1102, the first capacitor C1, second capacitor C2, fifth capacitor C5 and the sixth capacitor C6 have a first capacitance (e.g., C), wherein the third capacitor C3, fourth capacitor C4, and seventh capacitor Cbias having a second capacitance (e.g., C/2), wherein the first capacitance is higher than the second capacitance. In some embodiments, the first capacitance is substantially twice as large as the second capacitance.

In some embodiments, with reference to second majority gate 1102, the first C1, second C2, third C4, fourth C4, fifth C5, and sixth C6 capacitors comprises one of: metal-insulator-metal (MIM) capacitor, transistor gate capacitor, hybrid of metal and transistor capacitor; capacitor comprising para-electric material; non-linear dielectric capacitor, or linear dielectric capacitor. The material for capacitor 105 of second majority gate 1102 can be any of the material discussed with reference to capacitor 105 of first majority gate 1101.

In some embodiments, non-inversion circuitry 1105 comprises one of a buffer, a non-inverting amplifier, or any other suitable driver (e.g., AND, OR) that can be configured to drive a non-inverting output. The output of non-inversion circuitry 1105 is $V_{sum\_out}$. In various embodiments, both terminals of capacitor 105 of first and second majority AND gates 1101 and 1102, respectively, are coupled to transistors MN1 and MN2 controllable by clock signals Clk1 and Clk2 respectively, to pre-discharge nodes cn and n1. In some embodiments, transistors MN1 and MN2 are replaced with p-type transistors coupled to a supply rail Vcc to pre-charge nodes cn and n1. In some embodiments, clock signals Clk1 and Clk2 are the same. In some embodiments, Clk1 and CLk2 signals are phase offset from one another. In some embodiments, a single transistors MN or MP can be used to pre-discharge or pre-charge node cn and/or n1 of gates 1101 and/or 1102.

Figure 13:
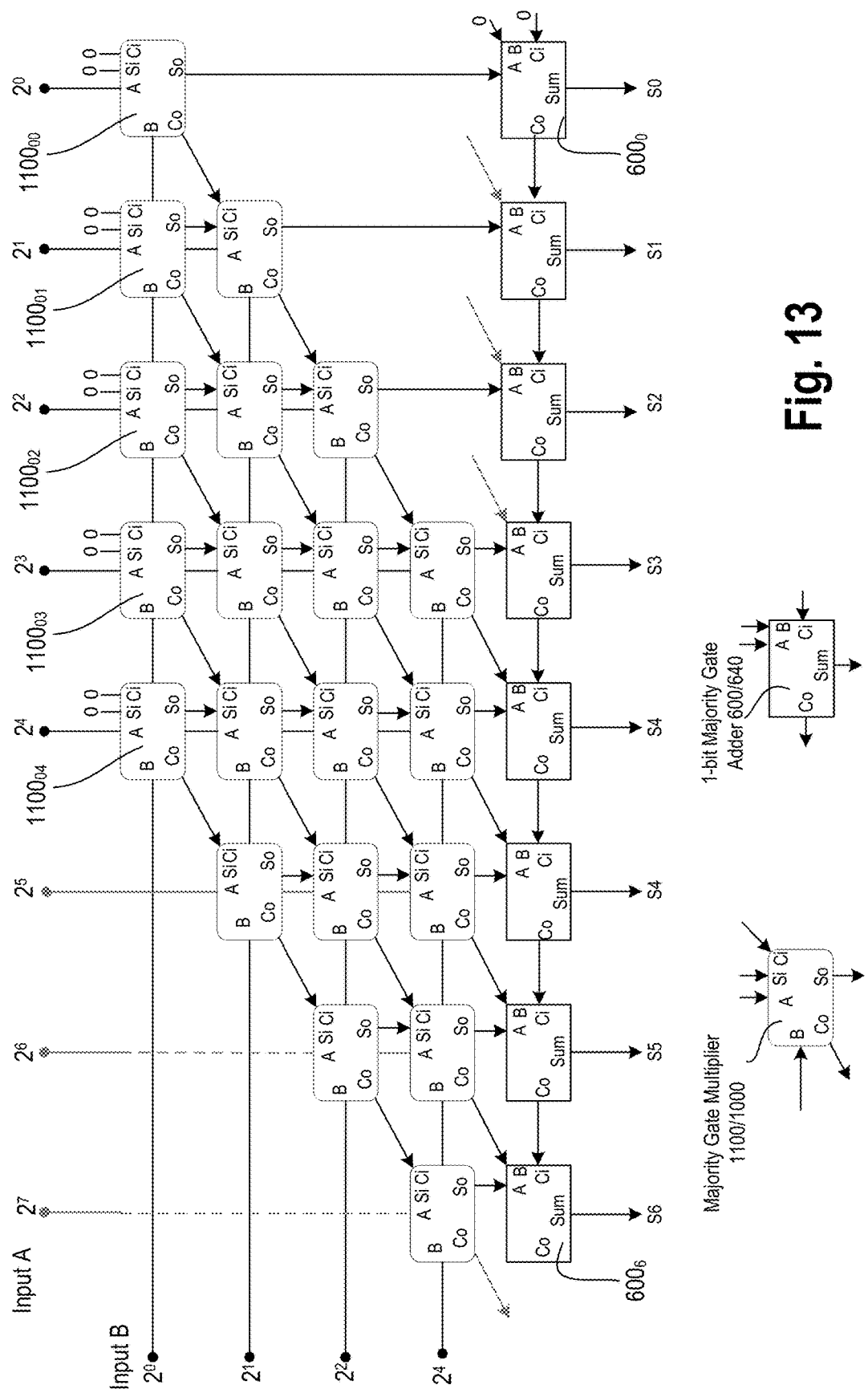
FIG. 13 illustrates an N×N multiplier comprising majority-gate AND gates, in accordance with some embodiments.

FIG. 13 illustrates N×N multiplier 1300 comprising majority-gate AND gates, in accordance with some embodiments. To form N×N multiplier 1300, AND-Majority gates 1100 are organized in an array (e.g., rows and columns), where N is a number. Inputs A are shown as columns while input B are shown as rows. The first row of majority gate multipliers with integrated AND functions (e.g., $1100_{00}$ to $1100_{04}$) have sum_input (Si) and carry-in input (Ci) that are set to predetermined or programmable values (e.g., 0). In some embodiments, full 1-bit adders (e.g., 600, 640) that do not receive input B from another multiplier cell, have that input set to a predetermined or programmable value (e.g., 0).

The values can be programmed by software (e.g., firmware, operating system) or hardware (e.g., fuses, registers).

Full 1-bit adder (e.g., 600/640) is provided for each column that sums a locally computed partial product (X·Y), an input passed into the majority gate multiplier cell from above (Sum In), and a carry Ci passed from a majority gate multiplier cell diagonally above. It generates a carry-out (Cout or Co) and a new sum (Sum Out or So). N×N multiplier 1300 shows the interconnection of 16 of these majority gate multiplier cells to implement the full multiplier function. However, any number of majority gate multiplier cells can be used. The input Ai values are distributed along cell diagonals and the input Bi values are passed along rows. This implementation uses the same gate count as the previous one: 16 AND gates and 12 adders. In various embodiments, the top row may not use adders. The outputs S0 though S6 of 1-bit adders (e.g., $600_0$ to $600_6$) are the results of the bit-wise multiplication. While the embodiments of FIG. 13 are illustrated with reference to multiplier cells having majority gates with integrated AND function, they are all applicable to multiplier cells of FIGS. 10A-C.

Figure 14:
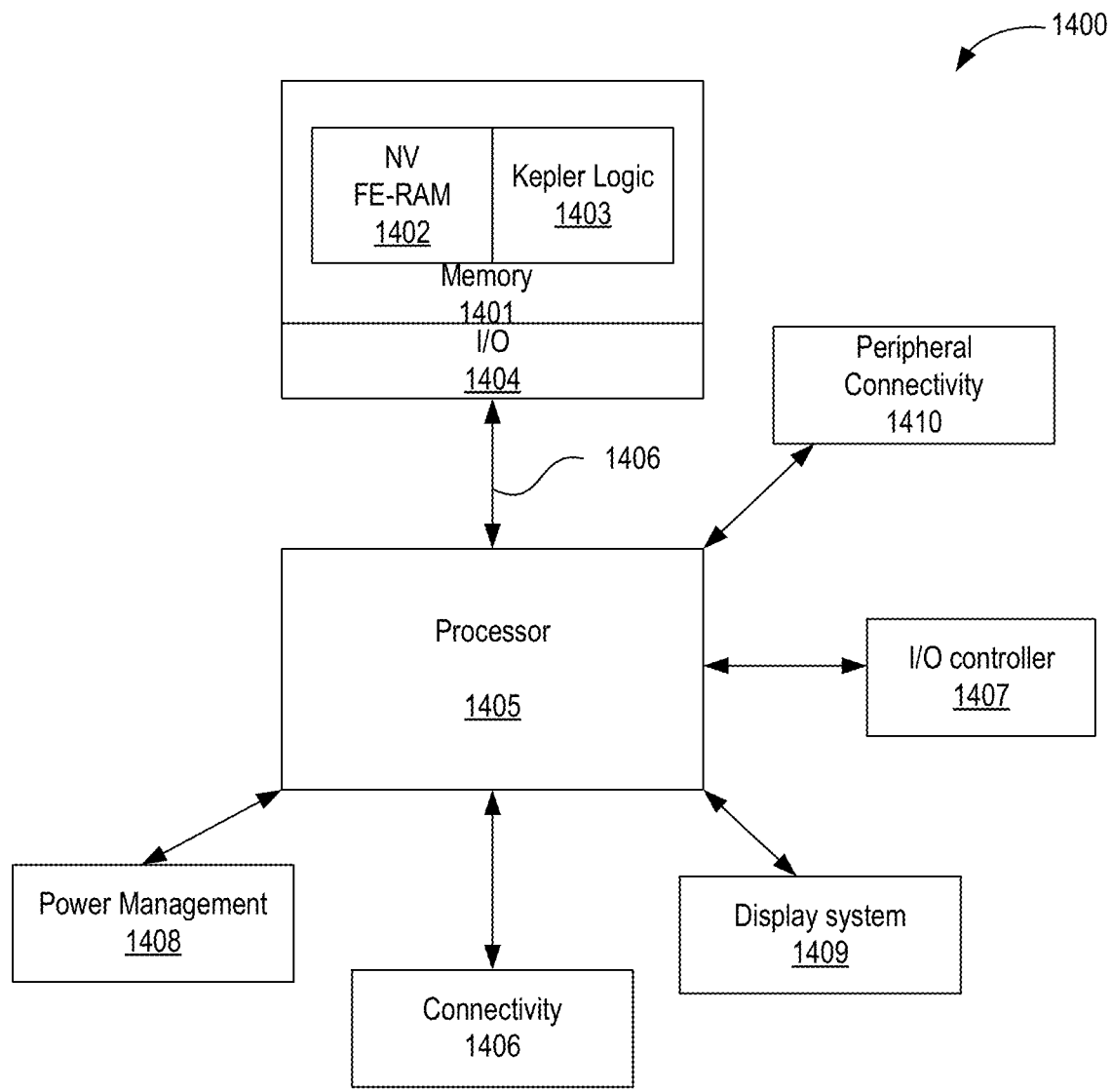
FIG. 14 illustrates a system-on-chip (SOC) that includes a multiplier cell or N×N multiplier, in accordance with some embodiments.

FIG. 14 illustrates a system-on-chip (SOC) 1400 that includes a multiplier cell or N×N multiplier, in accordance with some embodiments. SOC 1400 comprises memory 1401 having static random-access memory (SRAM) or FE based random access memory FE-RAM, or any other suitable memory. The memory can be non-volatile (NV) or volatile memory. Memory 1401 may also comprise logic 1403 to control memory 1402. For example, write and read drivers are part of logic 1403. These drivers and other logic are implemented using the majority or threshold gates of various embodiments. The logic can comprise majority or threshold gates and traditional logic (e.g., CMOS based NAND, NOR etc.). Any block of SOC 1400 can include the 1-bit full adder described with reference to the various embodiments.

SOC further comprises a memory I/O (input-output) interface 1404. The interface may be double-data rate (DDR) compliant interface or any other suitable interface to communicate with a processor. Processor 1405 of SOC 1400 can be a single core or multiple core processor. Processor 1405 can be a general-purpose processor (CPU), a digital signal processor (DSP), or an Application Specific Integrated Circuit (ASIC) processor. In some embodiments, processor 1405 is an artificial intelligence (AI) processor (e.g., a dedicated AI processor, a graphics processor configured as an AI processor).

AI is a broad area of hardware and software computations where data is analyzed, classified, and then a decision is made regarding the data. For example, a model describing classification of data for a certain property or properties is trained over time with large amounts of data. The process of training a model requires large amounts of data and processing power to analyze the data. When a model is trained, weights or weight factors are modified based on outputs of the model. Once weights for a model are computed to a high confidence level (e.g., 95% or more) by repeatedly analyzing data and modifying weights to get the expected results, the model is deemed "trained." This trained model with fixed weights is then used to make decisions about new data. Training a model and then applying the trained model for new data is hardware intensive activity. In some embodiments, AI processor 1405 has reduced latency of computing the training model and using the training model, which reduces the power consumption of such AI processor systems.

Processor 1405 may be coupled to a number of other chip-lets that can be on the same die as SOC 1400 or on separate dies. These chip-lets include connectivity circuitry 1406, I/O controller 1407, power management 1408, and display system 1409, and peripheral connectivity 1410.

Connectivity 1406 represents hardware devices and software components for communicating with other devices. Connectivity 1406 may support various connectivity circuitries and standards. For example, connectivity 1406 may support GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. In some embodiments, connectivity 1406 may support non-cellular standards such as WiFi.

I/O controller 1407 represents hardware devices and software components related to interaction with a user. I/O controller 1407 is operable to manage hardware that is part of an audio subsystem and/or display subsystem. For example, input through a microphone or other audio device can provide input or commands for one or more applications or functions of SOC 1400. In some embodiments, I/O controller 1407 illustrates a connection point for additional devices that connect to SOC 1400 through which a user might interact with the system. For example, devices that can be attached to the SOC 1400 might include microphone devices, speaker or stereo systems, video systems or other display devices, keyboard or keypad devices, or other I/O devices for use with specific applications such as card readers or other devices.

Power management 1408 represents hardware or software that perform power management operations, e.g., based at least in part on receiving measurements from power measurement circuitries, temperature measurement circuitries, charge level of battery, and/or any other appropriate information that may be used for power management. By using majority and threshold gates of various embodiments, non-volatility is achieved at the output of these logic. Power management 1408 may accordingly put such logic into low power state without the worry of losing data. Power management may select a power state according to Advanced Configuration and Power Interface (ACPI) specification for one or all components of SOC 1400.

Display system 1409 represents hardware (e.g., display devices) and software (e.g., drivers) components that provide a visual and/or tactile display for a user to interact with the processor 1405. In some embodiments, display system 1409 includes a touch screen (or touch pad) device that provides both output and input to a user. Display system 1409 may include a display interface, which includes the particular screen or hardware device used to provide a display to a user. In some embodiments, the display interface includes logic separate from processor 1405 to perform at least some processing related to the display.

Peripheral connectivity 1410 may represent hardware devices and/or software devices for connecting to peripheral devices such as printers, chargers, cameras, etc. Peripheral connectivity 1410 say support communication protocols, e.g., PCIe (Peripheral Component Interconnect Express), USB (Universal Serial Bus), Thunderbolt, High Definition Multimedia Interface (HDMI), Firewire, etc.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Following examples are provided that illustrate the various embodiments. The examples can be combined with other examples. As such, various embodiments can be combined with other embodiments without changing the scope of the invention.

Example 1: An apparatus comprising: a first majority AND logic gate having a first input, a second input, a third input, a fourth input, and a first bias input; a first inversion circuitry coupled to an output of the first majority AND logic gate; a second inversion circuitry coupled to an output of the first inversion circuitry; and a second majority AND logic gate having a first input, a second input, a third input; a fourth input, fifth input, sixth input and a second bias input, wherein: the first and second inputs of the second majority AND logic gate coupled to the output of the first inversion circuitry; the first input of the first majority AND logic gate is coupled to the third input of the second majority AND logic gate; the second input of the first majority AND logic gate is coupled to the fourth input of the second majority AND logic gate; the third input of the first majority AND logic gate is coupled to the fifth input of the second majority AND logic gate; the fourth input of the first majority AND logic gate is coupled to the sixth input of the second majority AND logic gate; and the first bias input and the second bias input are coupled.

Example 2: The apparatus of example 1, the first majority AND gate comprises: a node; a first capacitor having a first terminal to receive the first input of the first majority AND gate, and a second terminal coupled to the node; a second capacitor having a first terminal to receive the second input of the first majority AND gate, and a second terminal coupled to the node; a third capacitor having a first terminal to receive the third input of the first majority AND gate, and a second terminal coupled to the node; a fourth capacitor having a first terminal to receive the fourth input of the first majority AND gate, and a second terminal coupled to the node; a fifth capacitor having a first terminal coupled to the node, and a second terminal coupled to the first bias input; and a sixth capacitor comprising non-linear polar material, wherein the sixth capacitor includes a first terminal coupled to the node and a second terminal coupled to the input of the first inversion circuitry.

Example 3: The apparatus of example 2, comprising: a first transistor coupled to a first terminal of the sixth capacitor, wherein first transistor is controllable by a first clock; a second transistor coupled to a second terminal of the sixth capacitor, wherein the second transistor is controllable by a second clock; and a third transistor coupled to the second terminal of the sixth capacitor, wherein the third transistor is controllable by third clock.

Example 4: The apparatus of example 3, wherein first clock has a pulse width greater than a pulse width of the second clock and a pulse width of the third clock.

Example 5: The apparatus of example 3, wherein the third clock de-asserts prior to an assertion of the second clock.

Example 6: The apparatus of example 3, wherein the first transistor is a first n-type transistor, wherein the second transistor is a second n-type transistor, and wherein the third transistor is a p-type transistor.

Example 7: The apparatus of example 3, wherein the first transistor, the second transistor, and the third transistor are disabled in an evaluation phase, and enabled in a reset phase, wherein the reset phase is prior to the evaluation phase.

Example 8: The apparatus of example 2, wherein the third capacitor and the fourth capacitor have a first capacitance, wherein the first capacitor, the second capacitor, and fifth capacitor have a second capacitance, wherein the first capacitance is higher than the second capacitance.

Example 9: The apparatus of example 8, wherein the first capacitance is substantially twice as large as the second capacitance.

Example 10: The apparatus of example 2, wherein the first, second, third, fourth, and fifth capacitors comprises one of: metal-insulator-metal (MIM) capacitor, transistor gate capacitor, hybrid of metal and transistor capacitor; capacitor comprising para-electric material; non-linear dielectric capacitor, or linear dielectric capacitor.

Example 11: The apparatus of example 2, wherein the non-linear polar material includes one of: ferroelectric material, para-electric material, or non-linear dielectric.

Example 12: The apparatus of example 11, wherein the ferroelectric material includes one of: Bismuth ferrite (BFO), BFO with a doping material where in the doping material is one of Lanthanum, or elements from lanthanide series of periodic table; Lead zirconium titanate (PZT), or PZT with a doping material, wherein the doping material is one of La or Nb; a relaxor ferroelectric includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST); perovskite includes one of: BaTiO3, PbTiO3, KNbO3, or NaTaO3; hexagonal ferroelectric includes one of: YMnO3 or LuFeO3; hexagonal ferroelectrics of a type h-RMnO3, where R is a rare earth element viz. cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); Hafnium (Hf), Zirconium (Zr), Aluminum (Al), Silicon (Si), their oxides or their alloyed oxides; Hafnium oxides of the form, Hf1-x Ex Oy where E can be Al, Ca, Ce, Dy, er, Gd, Ge, La, Sc, Si, Sr, Sn, or Y; Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; Niobate type compounds LiNbO3, LiTaO3, Lithium iron Tantalum Oxy Fluoride, Barium Strontium Niobate, Sodium Barium Niobate, or Potassium strontium niobate; or improper ferroelectric includes one of: [PTO/STO]n or [LAO/STO]n, where 'n' is between 1 to 100.

Example 13: The apparatus of example 2, wherein the sixth capacitor comprising non-linear polar material is positioned in a backend of a die, while transistors of the first inversion circuitry and the second inversion circuitry are positioned in a frontend of a die.

Example 14: The apparatus of example 1 comprises a non-inversion circuitry coupled to an output of the second majority AND logic gate.

Example 15: The apparatus of example 14, the second majority AND gate comprises: a node; a first capacitor having a first terminal to receive the output of the first inversion circuitry and a second terminal coupled to the node; a second capacitor having a first terminal to receive the output of the first inversion circuitry and a second terminal coupled to the node; a third capacitor having a first terminal to receive the first input of the first majority AND gate, and a second terminal coupled to the node; a fourth capacitor having a first terminal to receive the second input of the first majority AND gate, and a second terminal coupled to the node; a fifth capacitor having a first terminal coupled to the third input of the first majority AND gate, and a second terminal coupled to the node; a sixth capacitor having a first terminal coupled to the fourth input of the first majority AND gate, and a second terminal coupled to the node; a seventh capacitor having a first terminal coupled to a second bias voltage, and a second terminal coupled to the node; and an eighth capacitor comprising non-linear polar material, wherein the eighth capacitor includes a first terminal coupled to the node and a second terminal coupled to an input of the non-inversion circuitry.

Example 16: The apparatus of example 15, wherein the first capacitor, second capacitor, fifth capacitor and the sixth capacitor have a first capacitance, wherein the third capacitor, fourth capacitor, and seventh capacitor having a second capacitance, wherein the first capacitance is higher than the second capacitance.

Example 17: The apparatus of example 15, wherein the first, second, third, fourth, fifth, and sixth capacitors comprises one of: metal-insulator-metal (MIM) capacitor, transistor gate capacitor, hybrid of metal and transistor capacitor; capacitor comprising para-electric material; non-linear dielectric capacitor, or linear dielectric capacitor.

Example 18: The apparatus of example 15, wherein the non-linear polar material includes one of: ferroelectric material, para-electric material, or non-linear dielectric.

Example 19: The apparatus of example 18, wherein the ferroelectric material includes one of: Bismuth ferrite (BFO), BFO with a doping material where in the doping material is one of Lanthanum, or elements from lanthanide series of periodic table; Lead zirconium titanate (PZT), or PZT with a doping material, wherein the doping material is one of La or Nb; a relaxor ferroelectric includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST); perovskite includes one of: BaTiO3, PbTiO3, KNbO3, or NaTaO3; hexagonal ferroelectric includes one of: YMnO3 or LuFeO3; hexagonal ferroelectrics of a type h-RMnO3, where R is a rare earth element viz. cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); Hafnium (Hf), Zirconium (Zr), Aluminum (Al), Silicon (Si), their oxides or their alloyed oxides; Hafnium oxides of the form, Hfl-x Ex Oy where E can be Al, Ca, Ce, Dy, er, Gd, Ge, La, Sc, Si, Sr, Sn, or Y; Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; Niobate type compounds LiNbO3, LiTaO3, Lithium iron Tantalum Oxy Fluoride, Barium Strontium Niobate, Sodium Barium Niobate, or Potassium strontium niobate; or improper ferroelectric includes one of: [PTO/STO]n or [LAO/STO]n, where 'n' is between 1 to 100.

Example 20: The apparatus of example 14, wherein the non-inversion circuitry comprises a buffer.

Example 21: The apparatus of example 1, wherein the third input of the first majority AND logic gate is coupled to a carry-in input.

Example 22: The apparatus of example 1, wherein the fourth input of the first majority AND logic gate is coupled to a sum-in input.

Example 23: An apparatus comprising: a first majority logic gate with integration majority and AND logic functions, wherein the first majority logic gate includes a capacitor comprising non-linear polar material, wherein the first majority logic gate is a five-input majority logic gate; a second majority logic gate with integration majority and AND logic functions, wherein the second majority logic gate includes a capacitor comprising non-linear polar material, wherein the second majority logic gate is coupled to the first majority logic gate; wherein the first majority logic gate is a seven-input majority logic gate; a first inversion circuitry coupled to an output of the first majority AND logic gate; a second inversion circuitry coupled to an output of the first inversion circuitry; and a non-inversion circuitry coupled to an output of the second majority logic gate.

Example 24: The apparatus of example 23, wherein the non-linear polar material includes one of: ferroelectric material, para-electric material, or non-linear dielectric.

Example 25: The apparatus of example 23, wherein the ferroelectric material includes one of: Bismuth ferrite (BFO), BFO with a doping material where in the doping material is one of Lanthanum, or elements from lanthanide series of periodic table; Lead zirconium titanate (PZT), or PZT with a doping material, wherein the doping material is one of La or Nb; a relaxor ferroelectric includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST); perovskite includes one of: BaTiO3, PbTiO3, KNbO3, or NaTaO3; hexagonal ferroelectric includes one of: YMnO3 or LuFeO3; hexagonal ferroelectrics of a type h-RMnO3, where R is a rare earth element viz. cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); Hafnium (Hf), Zirconium (Zr), Aluminum (Al), Silicon (Si), their oxides or their alloyed oxides; Hafnium oxides of the form, Hfl-x Ex Oy where E can be Al, Ca, Ce, Dy, er, Gd, Ge, La, Sc, Si, Sr, Sn, or Y; Al(1-x)Sc(x)N, Ga(1-x)Sc(x)N, Al(1-x)Y(x)N or Al(1-x y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; Niobate type compounds LiNbO3, LiTaO3, Lithium iron Tantalum Oxy Fluoride, Barium Strontium Niobate, Sodium Barium Niobate, or Potassium strontium niobate; or improper ferroelectric includes one of: [PTO/STO]n or [LAO/STO]n, where 'n' is between 1 to 100.

Example 26: A system comprising: a processor; a communication interface communicatively coupled to the processor; and a memory coupled to the processor, wherein the processor comprises a multiplier which includes: a first majority AND logic gate having a first input, a second input, a third input; a fourth input, and a first bias input; a first inversion circuitry coupled to an output of the first majority AND logic gate; a second inversion circuitry coupled to an output of the first inversion circuitry; and a second majority AND logic gate having a first input, a second input, a third input; a fourth input, fifth input, sixth input and a second bias input, wherein: the first and second inputs of the second majority AND logic gate coupled to the output of the first inversion circuitry; the first input of the first majority AND logic gate is coupled to the third input of the second majority AND logic gate; the second input of the first majority AND logic gate is coupled to the fourth input of the second majority AND logic gate; the third input of the first majority AND logic gate is coupled to the fifth input of the second majority AND logic gate; the fourth input of the first majority AND logic gate is coupled to the sixth input of the second majority AND logic gate; and the first bias input and the second bias input are coupled.

Example 27: The system of example 26, wherein the processor is one of an accelerator or an artificial intelligence (AI) processor.

Example 28: The system of example 26, wherein the first and second bias inputs have programmable bias voltage.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
    a 5-input threshold gate having a non-linear polar material, wherein the 5-input threshold gate comprises a first set of capacitors of different sizes;
    an inversion circuitry coupled to an output of the 5-input threshold gate; and
    a 7-input threshold gate having the non-linear polar material, wherein the 7-input threshold gate comprises a second set of capacitors of different sizes, wherein an output of the inversion circuitry is coupled to two inputs of the 7-input threshold gate, wherein the 5-input threshold gate comprises:
    a first input coupled to a first capacitor of a first size;
    a second input coupled to a second capacitor of the first size;
    a third input coupled to a third capacitor of a second size;
    a fourth input coupled to a fourth capacitor of the second size; and
    a fifth input coupled to a fifth capacitor of the first size, wherein the first capacitor, the second capacitor, the third capacitor, the fourth capacitor, and the fifth capacitor are part of the first set of capacitors.

2. The apparatus of claim 1, wherein the first input is a multiplier input, wherein the second input is a multiplicand input, wherein the third input is a carry input, wherein the fourth input is a sum input, and wherein the fifth input is a bias.

3. The apparatus of claim 1, wherein the first size is smaller than the second size.

4. The apparatus of claim 1, wherein the first size is half of the second size.

5. The apparatus of claim 1, wherein the 7-input threshold gate comprises:
    a sixth input coupled to a sixth capacitor of a sixth size;
    a seventh input coupled to a seventh capacitor of the sixth size;
    an eighth input coupled to an eighth capacitor of a seventh size;
    a ninth input coupled to a ninth capacitor of the seventh size;
    a tenth input coupled to a tenth capacitor of the sixth size;
    an eleventh input coupled to a eleventh capacitor of the sixth size; and
    a twelfth input coupled to a twelfth capacitor of the seventh size, wherein the sixth capacitor, the seventh capacitor, the eighth capacitor, the ninth capacitor, the tenth capacitor, the eleventh capacitor, and the twelfth capacitor are part of the second set of capacitors.

6. The apparatus of claim 5, wherein the sixth input is coupled to the output of the inversion circuitry, wherein the seventh input is coupled to the output of the inversion circuitry, wherein the eighth input is a multiplier input, wherein the ninth input is a multiplicand input, wherein the tenth input is a carry input, wherein the eleventh input is a sum input, and wherein the twelfth input is a bias.

7. The apparatus of claim 5, wherein the first size is smaller than the second size.

8. The apparatus of claim 5, wherein the first size is half of the second size.

9. The apparatus of claim 1, wherein the inversion circuitry is a first inversion circuitry, and wherein the apparatus comprises a second inversion circuitry having an input coupled to the output of the first inversion circuitry.

10. The apparatus of claim 1, wherein the non-linear polar material includes one of:
    a ferroelectric material, a paraelectric material, or a non-linear dielectric.

11. The apparatus of claim 10, wherein the ferroelectric material includes one of:
    Bismuth ferrite (BFO) with a first doping material, wherein the first doping material is one of Lanthanum or elements from lanthanide series of periodic table;
    Lead zirconium titanate (PZT), or PZT with a second doping material, wherein the second doping material is one of La or Nb;
    a relaxor ferroelectric which includes one of: lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST);
    a perovskite which includes one of: BaTiO3, PbTiO3, KNbO3, or NaTaO3;
    a first hexagonal ferroelectric which includes one of: YMnO3 or LuFeO3;
    a second hexagonal ferroelectric of a type h-RMnO3, where R is a rare earth element including one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y);
    Hafnium (Hf), Zirconium (Zr), Aluminum (Al), Silicon (Si), their oxides or their alloyed oxides;
    Hafnium oxides of a form, Hf1-x Ex Oy where E can be Al, Ca, Ce, Dy, Er, Gd, Ge, La, Sc, Si, Sr, Sn, or Y, where x and y are first fractions;
    Al(1-x)Sc(x)N, Ga(1-x)Sc(x)N, Al(1-x)Y(x)N or Al(1-x-y)Mg(x)Nb(y)N, where x and y are second fractions;
    HfO2 doped with one of: Al, Ca, Ce, Dy, Er, Gd, Ge, La, Sc, Si, Sr, Sn, or Y;
    Niobate type compounds LiNbO3, LiTaO3, Lithium iron Tantalum Oxy Fluoride, Barium Strontium Niobate, Sodium Barium Niobate, or Potassium strontium niobate; or
    an improper ferroelectric which includes one of: [PTO/STO]n or [LAO/STO]n, where 'n' is between 1 and 100.

12. The apparatus of claim 10, wherein the paraelectric material includes one of: SrTiO3, Ba(x)Sr(y)TiO3, HfZrO2, Hf—Si—O, La-substituted PbTiO3, or PMN-PT based relaxor ferroelectrics.

13. The apparatus of claim 1 comprises a pull-up transistor to charge the non-linear polar material of the 5-input threshold gate.

14. The apparatus of claim 1 comprises a pull-down transistor to discharge the non-linear polar material of the 5-input threshold gate.

15. The apparatus of claim 1 comprises a pull-up transistor to charge the non-linear polar material of the 7-input threshold gate.

16. The apparatus of claim 1 comprises a pull-down transistor to discharge the non-linear polar material of the 7-input threshold gate.

17. An apparatus comprising:
    a 5-input majority gate with an integrated AND function, wherein the 5-input majority gate includes a non-linear polar material, wherein the 5-input majority gate comprises a first set of capacitors of different sizes, and wherein one input of the 5-input majority gate is coupled to a bias;

an inversion circuitry coupled to an output of the 5-input majority gate; and a 7-input majority gate with an integrated AND function, wherein the 7-input majority gate having the non-linear polar material, wherein the 7-input majority gate comprises a second set of capacitors of different sizes, wherein an output of the inversion circuitry is coupled to two inputs of the 7-input majority gate, wherein one input of the 7-input majority gate is coupled to the bias, and wherein the 5-input majority gate includes:

a first input coupled to a first capacitor of a first size;

a second input coupled to a second capacitor of the first size;

a third input coupled to a third capacitor of a second size;

a fourth input coupled to a fourth capacitor of the second size; and a fifth input coupled to a fifth capacitor of the first size, wherein the first capacitor, the second capacitor, the third capacitor, the fourth capacitor, and the fifth capacitor are part of the first set of capacitors.

18. The apparatus of claim 17, wherein the non-linear polar material includes one of:

a ferroelectric material, a paraelectric material, or a non-linear dielectric.

19. A system comprising:

a memory;

a processor coupled to the memory; and a communication interface coupled to the processor, wherein the processor includes a multiplier which comprises:

a 5-input threshold gate having a non-linear polar material, wherein the 5-input threshold gate comprises a first set of capacitors of different sizes;

an inversion circuitry coupled to an output of the 5-input threshold gate; and a 7-input threshold gate having the non-linear polar material, wherein the 7-input threshold gate comprises a second set of capacitors of different sizes, wherein an output of the inversion circuitry is coupled to two inputs of the 7-input threshold gate, wherein the non-linear polar material includes one of: a ferroelectric material, a paraelectric material, or a non-linear dielectric, and wherein the 5-input threshold gate includes:

a first input coupled to a first capacitor of a first size;

a second input coupled to a second capacitor of the first size;

a third input coupled to a third capacitor of a second size;

a fourth input coupled to a fourth capacitor of the second size; and a fifth input coupled to a fifth capacitor of the first size, wherein the first capacitor, the second capacitor, the third capacitor, the fourth capacitor, and the fifth capacitor are part of the first set of capacitors.

* * * * *